United States Patent
Ishio et al.

[11] Patent Number: 6,104,084
[45] Date of Patent: Aug. 15, 2000

[54] SEMICONDUCTOR DEVICE INCLUDING A WIRE PATTERN FOR RELAYING CONNECTION BETWEEN A SEMICONDUCTOR CHIP AND LEADS

[75] Inventors: Toshiya Ishio, Nara; Hiroyuki Nakanishi; Tomoyo Maruyama, both of Kitakatsuragi-gun; Katsunobu Mori, Nara; Katsuyuki Tarui, Kasaoka, all of Japan

[73] Assignee: Sharp Kabushiki Kaisha, Osaka, Japan

[21] Appl. No.: 09/061,035

[22] Filed: Apr. 16, 1998

[30] Foreign Application Priority Data

Apr. 17, 1997 [JP] Japan .................................. 9-100606
Apr. 14, 1998 [JP] Japan ................................. 10-103073

[51] Int. Cl.[7] .......................... H01L 23/48; H01L 23/52; H01L 29/40
[52] U.S. Cl. .......................... 257/666; 257/676; 257/777
[58] Field of Search .................................. 257/676, 666, 257/777, 723, 724, 685, 686

[56] References Cited

U.S. PATENT DOCUMENTS 5,646,829  7/1997  Sota .
5,719,436  2/1998  Kuhn .
5,724,233  3/1998  Honda et al. .
5,780,926  7/1998  Seo .
5,793,108  8/1998  Nakanishi et al. .
5,804,874  9/1998  An et al. .

FOREIGN PATENT DOCUMENTS 06151641  5/1994  Japan .

Primary Examiner—Sheila V. Clark
Attorney, Agent, or Firm—Nixon & Vanderhye P.C.

[57] ABSTRACT

An insulation material and a wire pattern are provided on at least one of the surfaces of a die pad. Wires of the wire pattern are patterned in such a manner that at least one inner lead included in at least one of two lead groups is electrically connected to an electrode pad provided on the element forming surface of the semiconductor chip near the side edge other than the side edge opposing the lead group including the above particular inner lead, while at least one inner lead included in the other lead group is electrically connected to an electrode pad provided on the element forming surface of the semiconductor chip near the side edge other than the side edge opposing the other lead group. Accordingly, a multichip-1-package semiconductor device using any kind of semiconductor chip can be realized. Also, the costs of the semiconductor device are saved and the semiconductor device can be developed in a shorter period by omitting the design modification of the semiconductor chip.

42 Claims, 42 Drawing Sheets

6,104,084

SEMICONDUCTOR DEVICE INCLUDING A WIRE PATTERN FOR RELAYING CONNECTION BETWEEN A SEMICONDUCTOR CHIP AND LEADS

FIELD OF THE INVENTION

The present invention relates to a semiconductor device which can be mounted onto light and compact electronic equipment.

BACKGROUND OF THE INVENTION

Various kinds of semiconductor devices including a single semiconductor chip 51 as shown in FIGS. 38 and 39 have been proposed (prior art 1). This type of semiconductor device is produced in the following manner. That is, the semiconductor chip 51 is mounted onto a die pad 55 formed in a lead frame 54 with a die attachment material 53 of a thermosetting type, such as silver paste (this technique is referred to as die bonding, hereinafter). Then, the die attachment material 53 is set through heat treatment, whereupon the semiconductor 51 is fixed to the die pad 55 (die bonding step).

Then, electrode pads 52 formed on the element forming surface of the semiconductor chip 51 are electrically connected to inner leads 56 formed on the lead frame 54 through bonding wires 59, such as gold wires (wire bonding step). Further, molding resin 60 is applied to mold these components, after which a tie bar (not shown) for preventing the leakage of the molding resin 60 into the spaces among outer leads 57 and support leads 58 for supporting the die pad 55, both formed in the lead frame 54, are disconnected. Finally, the outer leads 57 are bent to form a desired shape (forming), whereby a final product is produced.

A larger memory has been demanded to a semiconductor device while a demand for smaller and lighter electronic equipment has been increasing. Thus, the semiconductor device of the prior art 1 was advanced to a semiconductor device shown in FIGS. 40 and 41, in which two semiconductor chips 51a and 51b are mounted respectively onto both the surfaces (main and back surfaces) of the die pad 55 (prior art 2). This type of semiconductor device is produced in such a manner that the semiconductor chips 51a and 51b oppose each other at their back surfaces (the flip surface of the element forming surface) by a method proposed in, for example, Japanese Patent Application No. 297059/1994 (Tokuganhei No. 6-297059).

To be more specific, the semiconductor chip 51a; is mounted onto one of the surfaces of the die pad 55 with paste of the die attachment material 53, such as silver paste and silver-free paste. Then, the die attachment material 53 is set with heat, whereupon the semiconductor chip 51a is fixed to the die pad 55. Subsequently, the semiconductor chip 51b is mounted onto the other surface of the die pad 55 with the paste of the die attachment material 53, and the die attachment material 53 is set with heat, whereupon the semiconductor chip 51b is fixed to the die pad 55.

Then, electrode pads 52a of the semiconductor chip 51a are bonded to inner leads 56 through the wire bonding with bonding wires 59a, such as gold wires. Likewise, electrode pads 52b of the other semiconductor chip 51b are bonded to the inner leads 56 through the wire bonding with bonding wires 59b. The rest of the steps are carried out in the same manner as the prior art 1.

Incidentally, in case of the conventional semiconductor device of the prior art 2, in which the semiconductor chips 51a and 51b are mounted respectively onto both the surfaces of the die pad 55 and thereby increasing a memory capacity two times, the length and angle of the bonding wires 59a and 59b depend on the layout of the electrode pads 52a and 52b. In other words, the bonding wires 59a and 59b may be extended considerably or the adjacent wires may cross each other depending on the positions of the electrode pads 52a and 52b. When this happens, the bonding wire 59a may cause a short-circuit with the semiconductor chip 51a or adjacent wire, or a phenomenon known as opening (the disconnection or the like) due to the stress applied during the molding using the molding resin.

Thus, in case that the semiconductor chips 51a and 51b are of the same kind (chips having the same chip size, using the same kind of silicon substrates, and operating at the same substrate potential), as shown in FIG. 40, element circuit patterns (including the electrode pads 52a and 52b) respectively formed on the semiconductor chips 51 and 51b must be mirror-reversed to each other.

On the other hand, in case that the semiconductor chips 51a and 51b are of different kinds (chips having different chip sizes, using different kinds of silicon substrates, and operating at different substrate potentials), the arrangement of either or both the electrode pads 52a and 52b on the semiconductor chips 51a and 51b must be modified, because the original electrode pads 52a and 52b are formed indiscriminately.

Thus, according to the conventional 2-chip-1-package semiconductor device, the design of at least one of the semiconductor chips 51a and 51b must be modified to eliminate the problem caused by the layout of the electrode pads 52a and 52b. Consequently, there arises a problem that it takes longer to develop the device.

The above inconvenience can be eliminated by simply changing the position of either of the electrode pads 52a or 52b regardless of whether the semiconductor chips 51a and 51b are of the same or different kinds. However, this method involves too much wiring, thereby arising another problem that the semiconductor chips 51a and 51b are further upsized compared with the method of modifying the entire design.

Japanese Laid-open Patent Application No. 151641/1994 (Tokukaihei No. 6-151641) discloses a semiconductor device which can avoid the aforementioned problem caused by the layout of the electrode pads 52a and 52b. In this semiconductor device, as shown in FIG. 42, an insulation circuit substrate 64 is bonded to an island 63 of lead frames 62 through the die bonding with paste or the like in such a manner to encircle an array semiconductor chip 61. A first pad 65 serving as an electrode pad in the array semiconductor chip 61 is electrically connected to one of the lead frames 62 through a first terminal 67 forming a part of a connecting band 66 on the insulation circuit substrate 64.

According to the above arrangement, flexibility is allowed to the line linking method of the first pad 65 and lead frame 62, thereby making it easier to design the lead frames 62 for a multi-chip or the like onto which a plurality of chips are mounted.

However, in the above semiconductor device, the semiconductor chip is mounted onto the one surface of the die pad alone, and if a memory capacity is increased by mounting a plurality of the semiconductor chips on the one surface of the die pad, the IC packaging area is increased as well. Also, since the wires are provided to encircle the array semiconductor chip 61 in the above semiconductor device, the number of the wires is limited. Thus, the above semiconductor device may not be produced with some particular kinds of chips. Further, with the above semiconductor device, only the array semiconductor chip 61 is concerned, and for example, the stacked structure or the like using a combination of any kind of semiconductor chips, is not concerned. Hence, there arises a problem that a more versatile semiconductor device can not be provided.

SUMMARY OF THE INVENTION

It is therefore an object of the present invention to provide a multichip-1-package semiconductor device using any kind of semiconductor chips while realizing accurate wire bonding without modifying the design of the semiconductor chips.

Here, a multichip-1-package semiconductor device means a semiconductor device, in which at least one semiconductor chip is provided on each of the main and back surfaces of a semiconductor chip mounting substrate. For example, when one semiconductor chip is provided on each of the main and back surfaces, it is called a 2-chip-1-package device.

To fulfill the above object, a semiconductor device of the present invention is a semiconductor device in which semiconductor chips are mounted respectively onto both the surfaces of a semiconductor chip mounting substrate of a lead frame with their back surfaces opposing each other.

The device includes a wire pattern having a certain pattern and an insulation material for providing electrical insulation between the semiconductor chip mounting substrate and wire pattern on at least one of the surfaces of the semiconductor chip mounting substrate;

The device also includes electrode pads on at least one of the semiconductor chips that are electrically connected to a particular lead formed in the lead frame through the wire pattern and a metal line.

Thus, inconveniences, such as a short-circuit between the metal line and semiconductor chip or adjacent wire and the opening of the metal line (disconnection of the metal line or the like), can be prevented in a secure manner. Also, providing the wire pattern makes it no long necessary to modify the design of the semiconductor chip. Consequently, not only the costs of the semiconductor device can be saved, but also the semiconductor device can be developed in a shorter period than before in a secure manner. In addition, according to the above arrangement, besides the array semiconductor chip, any kind of semiconductor chips can be applied to the stacked structure, thereby making it possible to provide a more versatile multichip-1-package semiconductor device.

For a fuller understanding of the nature and advantages of the invention, reference should be made to the ensuing detailed description taken in conjunction with the accompanying drawings.

DESCRIPTION OF THE EMBODIMENTS

Embodiment 1

Referring to FIGS. 1 through 6(d), the following description will describe an example embodiment of the present invention.

Figure 1:
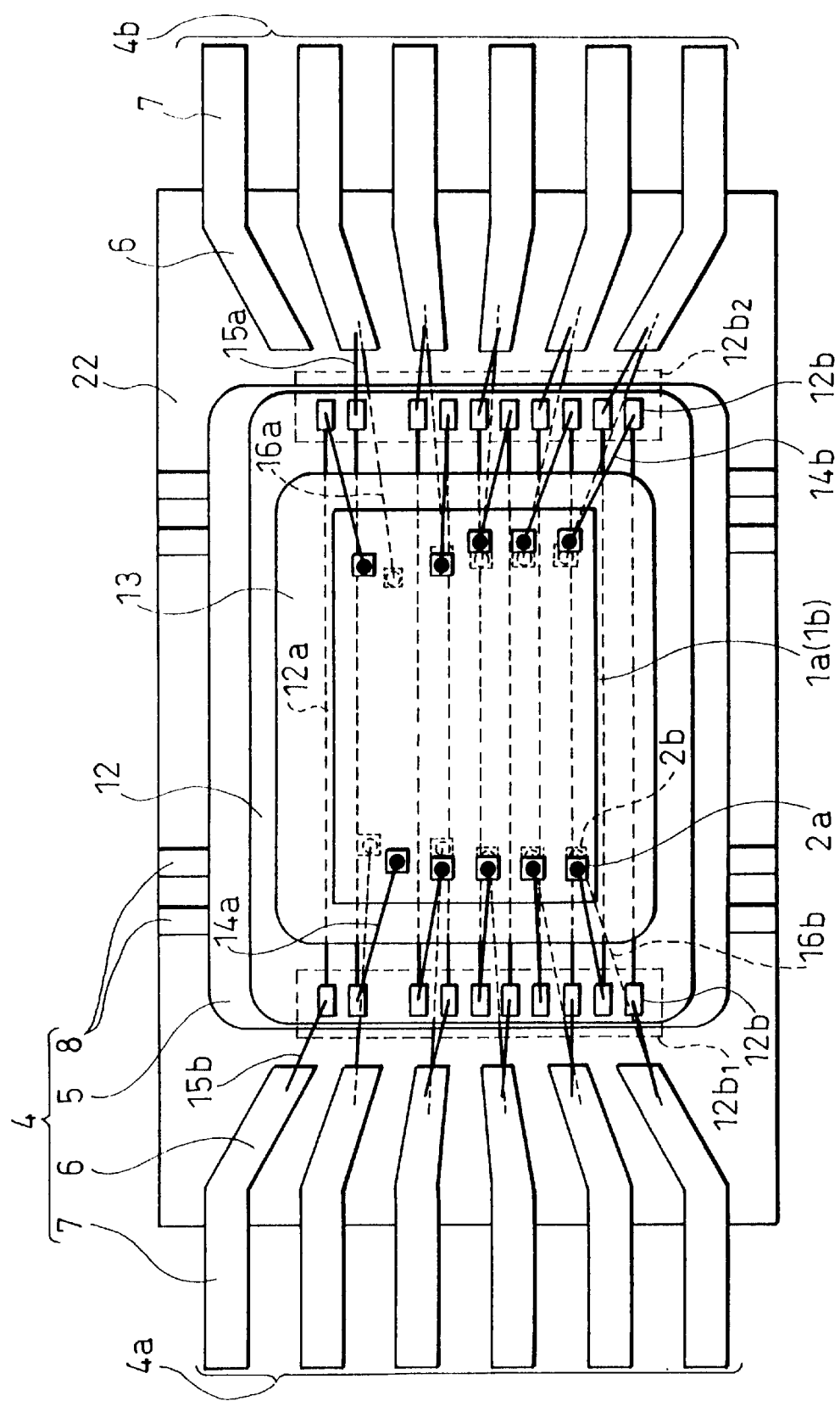
FIG. 1 is a front elevation of a perspective view showing an example arrangement of a semiconductor device in accordance with an example embodiment of the present invention.
Figure 2:
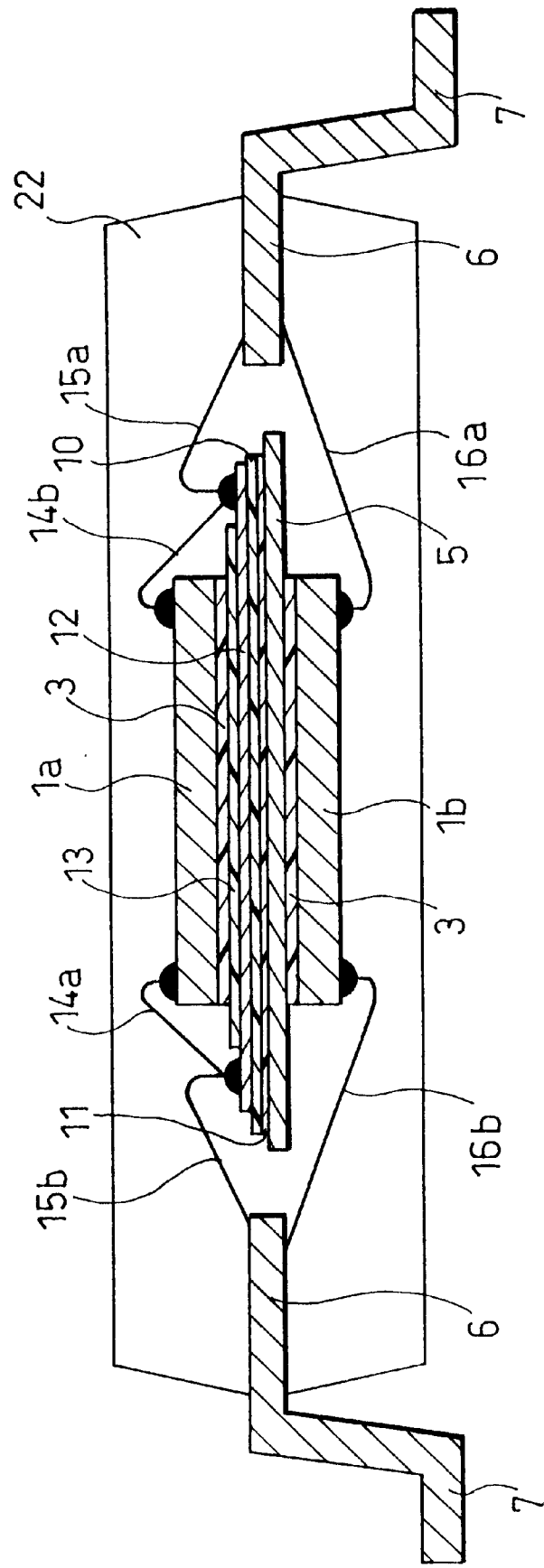
FIG. 2 is a side elevation of a perspective view of the above semiconductor device.
Figure 3:
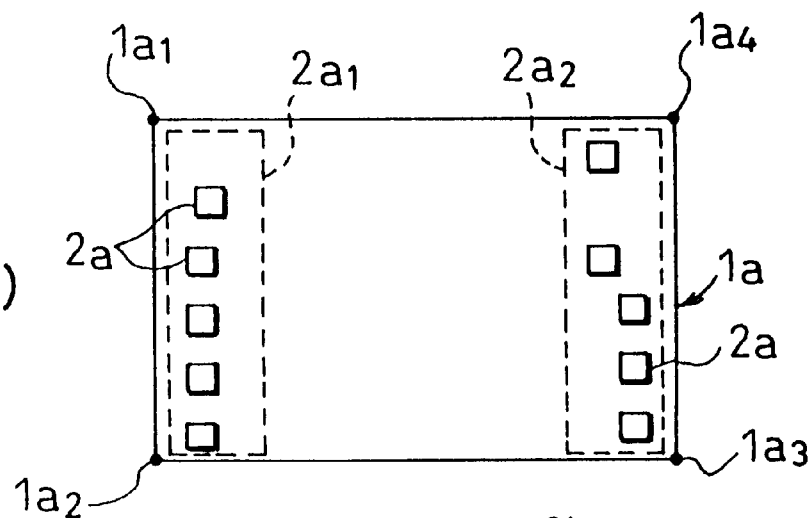
FIGS. 3(a) and 3(b) are plan views showing two semiconductor chips, respectively.
Figure 3:
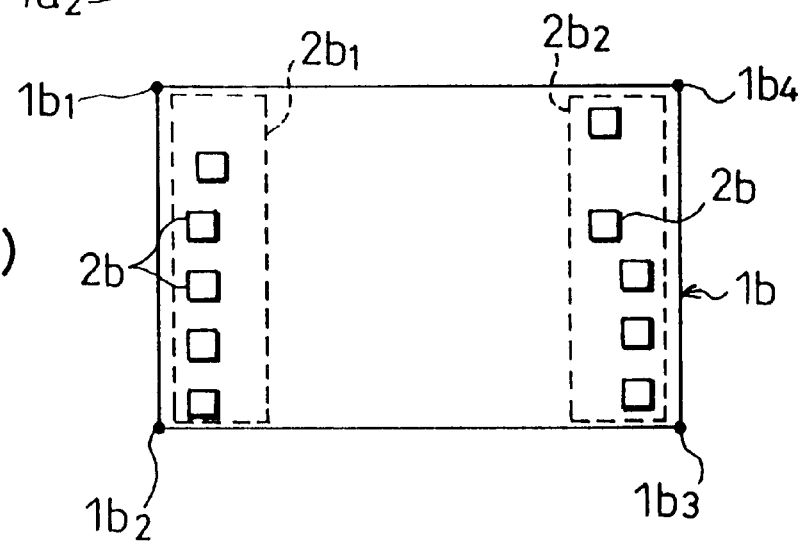

A semiconductor device of the present embodiment is arranged in the manner as shown in FIGS. 1 and 2. To be more specific, two semiconductor chips 1a and 1b are mounted respectively onto both the surfaces (main and back surfaces) of a die pad 5 (semiconductor chip mounting plate) of a plate-wise lead frame 4 with paste of a thermosetting die attachment material 3. In the present embodiment, the semiconductor chips 1a and 1b are the chips having the same chip size, using the same kind of silicon substrates, and operating at the same substrate potential.

When the semiconductor chips 1a and 1b are chips of the same kind, the die attachment material 3 is generally made of thermosetting silver paste mixed with scaly silver powder. However, the die attachment material 3 may be made of silver-free paste mixed with spherical silica powder or the like when the cost is concerned.

When the semiconductor chips 1a and 1b are chips of the different kinds, there are two cases as set forth below. Here, "being of different kinds" means that the semiconductor chips 1a and 1b have different chip sizes (the positions of the electrode pads 2a and 2b are different).

When the semiconductor chips 1a and 1b are chips using the same kind of silicon substrates and operating at the same substrate potential, the die attachment material 3 is made of thermosetting silver paste mixed with scaly silver powder. However, the die attachment material 3 may be made of silver-free paste mixed with spherical silica powder or the like when the cost is concerned.

On the other hand, when the semiconductor chips 1a and 1b are chips using different kinds of silicon substrates or operating at different substrate potentials, the die attachment material 3 is generally made of silver-free paste.

Figure 4:
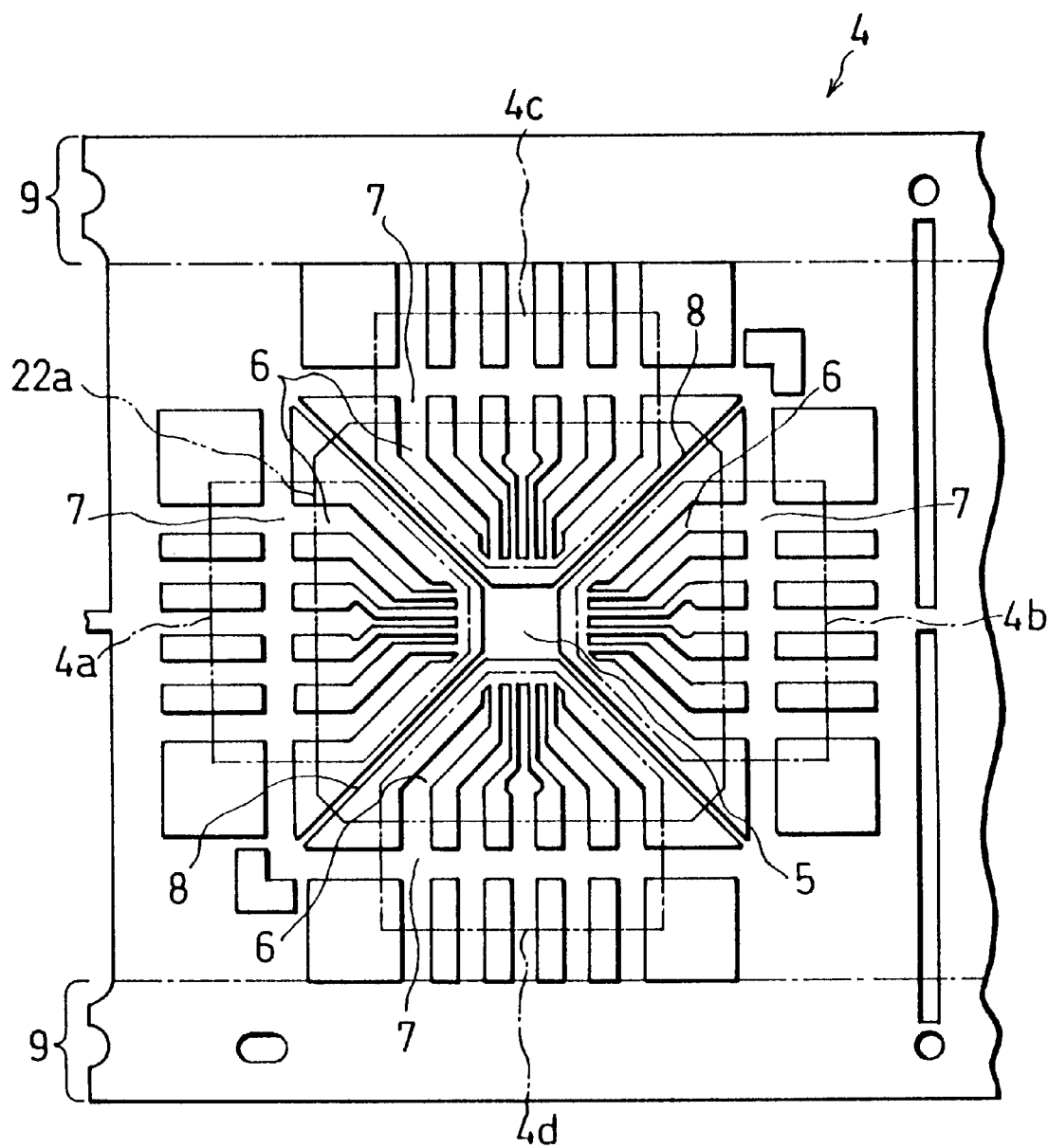
FIG. 4 is a plan view showing a lead frame.
Figure 5:
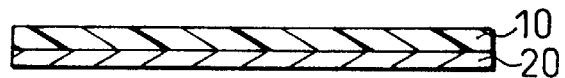
FIGS. 5(a) through 5(e) are side elevations of perspective views showing producing steps of the above semiconductor device.
Figure 5:
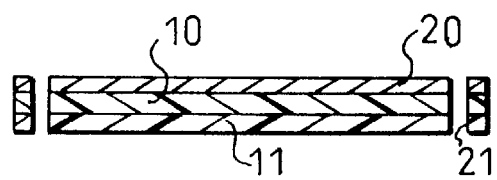
Figure 5:
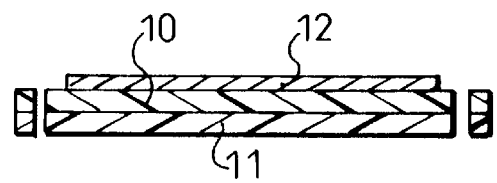
Figure 5:
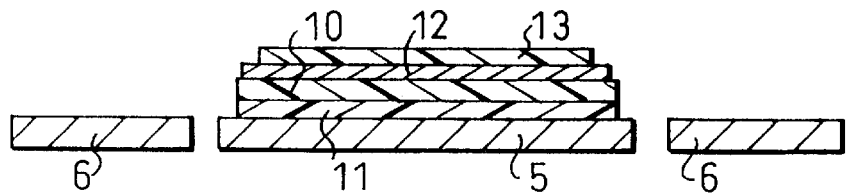
Figure 5:
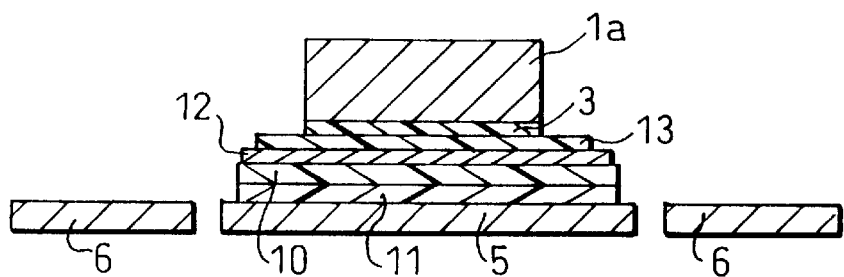

As shown in FIGS. 1 and 4, the die pad 5 and inner leads 6 are formed in the inside of a molding portion 22a while outer leads 7 are formed in the outside of the molding portion 22a. The lead frame 4 is composed of the die pad 5, inner leads 6, outer leads 7, support leads 8, and cradle portions 9. The die pad 5 is a semiconductor chip mounting substrate on which the semiconductor chips 1a and 1b are mounted onto both the surfaces, respectively. The die pad 5, inner leads 6, and semiconductor chips 1a and 1b are molded to one with another with molding resin 22 or the like, which will be explained below. The support leads 8 support the die pad 5 and the cradle portions 9 is used when the lead frame 4 is transported.

In the present embodiment, as shown in FIG. 1, the lead frame 4 is composed of a plurality of inner leads 6 and a plurality of outer leads 7, which are divided into two lead groups 4a and 4b opposing each other. The die pad 5, onto which the semiconductor chips 1a and 1b are mounted, is provided between the two lead groups 4a and 4b.

As shown in FIG. 2, an insulation material 11, another insulation material 10, a wire pattern 12, and still another insulation material 13 are sequentially layered on at least one of the surfaces of the die pad 5 (in the present embodiment, the surface onto which the semiconductor chip 1a is mounted). Thus, the wire pattern 12 is electrically isolated from the die pad 5 by the insulation materials 10 and 11, and also from the semiconductor chip 1a by the insulation material 13.

The insulation material 10 is, for example, polyimide resin, and the insulation material 11 is a thermoplastic insulation material generally used also as the die attachment material 3. The insulation material 13 is, for example, an insulation film of polyimide resin.

The wire pattern 12 includes wires 12a of metal foil, such as copper foil, formed in a certain pattern, and electrodes 12b. A detailed explanation of the certain pattern will be given below. The electrodes 12b are electrically connected to the wires 12a, so that the electrode pads 2a of the semiconductor chip 1a are electrically connected to the wires 12a easily by means of bonding wires 14a and 14b, which will be explained below, while the wires 12a are electrically connected to the inner leads 6 easily by means of bonding wires 15a and 15b. Also, electrode groups $12b_1$ and $12b_2$, each made of a plurality of the electrodes 12b, are formed on the wire pattern 12 at portions opposing the lead groups 4a and 4b, respectively.

Here, as shown in FIGS. 3(a) and 3(b), each vertex of the substantially rectangular semiconductor chips 1a and 1b on their element forming surfaces is referred to as $1a_1$, $1a_2$, $1a_3$, $1a_4$, $1b_1$, $1b_2$, $1b_3$, and $1b_4$ in a counterclockwise direction for the explanation's convenience. In other words, the vertexes in each semiconductor chip at the same position are indicated with the same subscription numerals.

The semiconductor chip 1a includes, on its element forming surface, an electrode pad group $2a_1$ composed of a plurality of the electrode pads 2a near the side edge ($1a_1$–$1a_2$), and another electrode pad group $2a_2$ composed of a plurality of the electrode pads 2a near the side edge ($1a_4$–$1a_3$). Likewise, the semiconductor chip 1b includes, on its element forming surface, an electrode pad group $2b_1$ composed of a plurality of the electrode pads 2b near the side edge ($1b_1$–$1b_2$), and another electrode pad group $2b_2$ composed of a plurality of the electrode pads 2b near the side edge ($1b_4$–$1b_3$).

When the semiconductor device is a memory device, as a rule, the electrode pads which receive and output the same signal are electrically connected to the same inner lead except for a chip enable terminal (an electrode pad provided for allowing the selection of a stand-by state or an active state).

Thus, in the present embodiment, the semiconductor chips 1a and 1b of the same kind are provided on the die pad 5 in such a manner to oppose each other at their back surfaces while being flipped from side to side. In other words, when the semiconductor chips 1a and 1b are placed to oppose each other at their back surfaces (the flip surface of the element forming surface), the side edge ($1a_1$–$1a_2$) of the semiconductor chip 1a is superimposed on the side edge ($1b_4$–$1b_3$) of the semiconductor chip 1b, while the side edge ($1a_4$–$1a_3$) of the semiconductor chip 1a is superimposed on the side edge ($1b_1$–$1b_2$) of the semiconductor chip 1b.

In case that semiconductor chips can share the input/output terminals (electrode pads) to some extent, whether the two semiconductor chips should be flipped from side to side or from top to bottom (which will be explained in another example embodiment below) is determined depending on whether the number of the wires can be reduced or not.

Although it will be described in detail below, the wires 12a of the wire pattern 12 are patterned as follows. That is, of the four side edges of the semiconductor chip 1a, the side edge ($1a_1$–$1a_2$) opposes the lead group 4a, while the side edge ($1a_4$–$1a_3$) opposes the lead group 4b. The electrode pads 2a are divided into two groups: those provided on the element forming surface of the semiconductor chip 1a near its side edge ($1a_1$–$1a_2$) opposing the lead group 4a (the electrode pad group $2a_1$ in FIG. 3(a)), and those provided on the element forming surface of the semiconductor chip 1a near its side edge(s) other than the side edge ($1a_1$–$1a_2$) (the electrode pad group $2a_2$ in FIG. 3(a)). At least one inner lead 6 in the lead group 4a is electrically connected to the electrode pad 2a belonging to the latter group, that is, one of those provided near the side edge(s) other than the side edge opposing the lead group 4a. Likewise, at least one inner lead 6 in the lead group 4b is electrically connected to the electrode pad 2a provided on the element forming surface of the semiconductor chip 1a near its side edge(s) other than the side edge ($1a_4$–$1a_3$) opposing the lead group 4b. The pattern of the wire 12a is arranged in this manner.

More specifically, each electrode pad 2a in the electrode pad group $2a_1$ is electrically connected to one of the inner leads 6 in the lead group 4b. To realize this connection, the electrode pad 2a in the electrode pad group $2a_1$ is electrically connected to the electrode 12b in the electrode group $12b_1$ through the bonding wire 14a, and this particular electrode 12b in the electrode group $12b_1$ is electrically connected to another electrode 12b in the electrode group $12b_2$ through the wire 12a. Further, this particular electrode 12b in the electrode group $12b_2$ is electrically connected to the inner lead 6 in the lead group 4b through the bonding wire 15a.

Likewise, the electrode pad 2a in the electrode pad group $2a_2$ is electrically connected to the electrode 12a in the electrode group $12b_2$ through the bonding wire 14b, and this particular electrode 12b in the electrode group $12b_2$ is electrically connected to another electrode 12b in the electrode group $12b_1$ through the wire 12a. Further, this particular electrode 12b in the electrode group $12b_1$ is electrically connected to the inner lead 6 in the lead group 4a through the bonding wire 15b, so that each electrode pad 2a in the electrode pad group $2a_2$ is electrically connected to one of the inner leads 6 in the lead group 4a.

On the other hand, of all the electrode pads 2b of the semiconductor chip 1b, each electrode pad 2b in the electrode pad group $2b_1$ is electrically connected to one of the inner leads 6 in the lead group 4b through a bonding wire 16a, and this particular inner lead 6 is electrically connected to the electrode pad 2a in the electrode pad group $2a_1$ serving as an electrode pad that receives and outputs the same signal as the one inputted and outputted into/from the above electrode pad 2b in the electrode pad group $2b_1$.

Likewise, of all the electrode pads 2b of the semiconductor chip 1b, each electrode pad 2b in the electrode pad group $2b_2$ is electrically connected to one of the inner leads 6 in the lead group 4a through a bonding wire 16b, and this particular inner lead 6 is electrically connected to the electrode pad 2a in the electrode pad group $2a_2$ serving as an electrode pad that receives and outputs the same signal as the one inputted and outputted into/from the above electrode pad 2b in the electrode pad group $2b_2$.

Next, a producing method of the semiconductor device of the present embodiment will be explained with reference to FIGS. 5(a) through 6(d). The wire pattern 12 can be formed on the die pad 5 by any applicable method, for example, by sequentially layering the insulation layers and wire pattern 12 on the die pad 5. In the present embodiment, of all kinds of carrier tapes used for TCPs (Tape Carrier Packages), a double-layer tape (generally known as such for TCPs or the like) is laminated to the die pad 5 as an example method.

To begin with, as shown in FIG. 5(a), the insulation material 10 made of varnish of polyimide resin is applied evenly over metal foil 20, such as copper foil, after which the heat treatment is applied so as to form a thin film by evaporating a solvent component. Then, as shown in FIG. 5(b), the thermoplastic insulation material 11 generally used as the die attachment material for LOCs (Lead On Chips) or the like is applied evenly over the varnish of the insulation material 10, after which the heat treatment is applied to form a thin film. Then, sprocket holes 21 are made through as sending holes. A slit or the like may be formed to lessen heat stress at this point.

Subsequently, as shown in FIG. 5(c), the metal foil 20 is etched into the wire pattern 12 composed of a certain pattern of the wires 12a, electrode 12b and the like. In the present embodiment, electrolytic nickel-plating is applied over the wire pattern 12, over which electrolytic gold-plating is further applied.

A plurality of the wires 12a are formed (see FIG. 1) so as to be parallel to a certain side edge of the semiconductor chip 1a, which will be mounted later.

Hereinafter, a double-layer tape material (excluding the insulation material 11) composed of the insulation material 10 and wire pattern 12 is referred to as a single-layer wire tape (generally referred to as double-layer tape for TCPs or the like). Also, the single-layer wire tape cut into a desired shape is referred to as a single-layer wire substrate hereinafter.

Then, as shown in FIG. 5(d), the insulation material 13 of polyimide resin is formed over the wire pattern 12 on the flip surface of the surface where the insulation materials 10 and 11 are layered, that is, the flip surface of the die pad 5 bonding surface. Accordingly, the wire pattern 12 is electrically isolated from the semiconductor chip 1a, which will be described below. Then, the single-layer wire tape, composed of the insulation material 10 and wire pattern 12 and having formed thereon the insulation materials 11 and 13, is cut into a desired shape and laminated to the die pad 5 as the single-layer wire substrate.

Subsequently, as shown in FIG. 5(e), in the first place, the semiconductor chip 1a is bonded to one of the surfaces of the die pad 5, that is, in the present embodiment, the surface on which the insulation material 13 is formed, through the die bonding with paste of the die attachment material 3, after which the die attachment material 3 is set with heat at 180° C. for one hour. Note that the semiconductor chip 1b can be bonded to the die pad 5 through the die bonding before the semiconductor chip 1a is bonded.

Since the semiconductor chips 1a and 1b are the chips having the same chip size, using the same kind of silicon substrates, and operating at the same substrate potential in the present embodiment, silver paste mixed with scaly silver powder is used as the die attachment material 3.

Figure 6A:
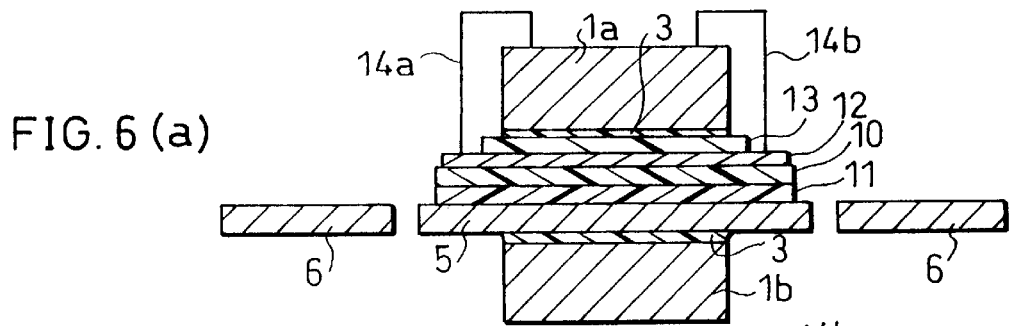
FIGS. 6(a) through 6(d) are side elevations of perspective views showing producing steps of the above semiconductor device following the step in FIG. 5(e)

Then, as shown in FIG. 6(a), in the second place, the lead frame 4 (see FIG. 4) is turned over, and the semiconductor chip 1b is bonded to the die pad 5 on the other surface through the die bonding in the above manner. Here, the semiconductor chip 1a which has been bonded to the die pad 5 through the die bonding is protected from damages by, for example, being supported by an elastic body. Then, the die attachment material 3 is set with heat at 180° C. for one hour.

Subsequently, the electrode pad 2 of the semiconductor chip 1a is electrically connected to the electrode 12b of the wire pattern 12 by means of the bonding wires 14a and 14b (this technique is referred to as wire bonding, hereinafter).

Figure 6B:
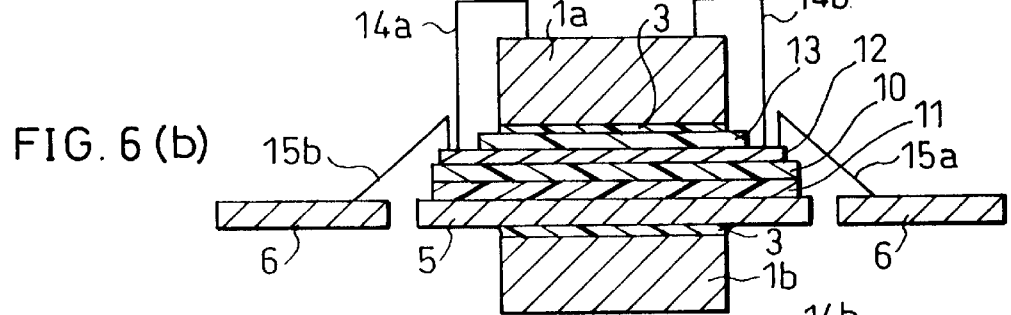

Then, as shown in FIG. 6(b), the electrode 12b is electrically connected to the inner lead 6 of the lead frame 4 through the wire bonding by means of the bonding wires 15a and 15b.

Like in the die bonding, the wire bonding in the semiconductor chip 1b can be carried out before the wire bonding in the semiconductor chip 1a. Also, the wire boding by means of the bonding wires 15a and 15b may be carried out before the wire bonding by means of the bonding wires 14a and 14b.

Figure 6C:
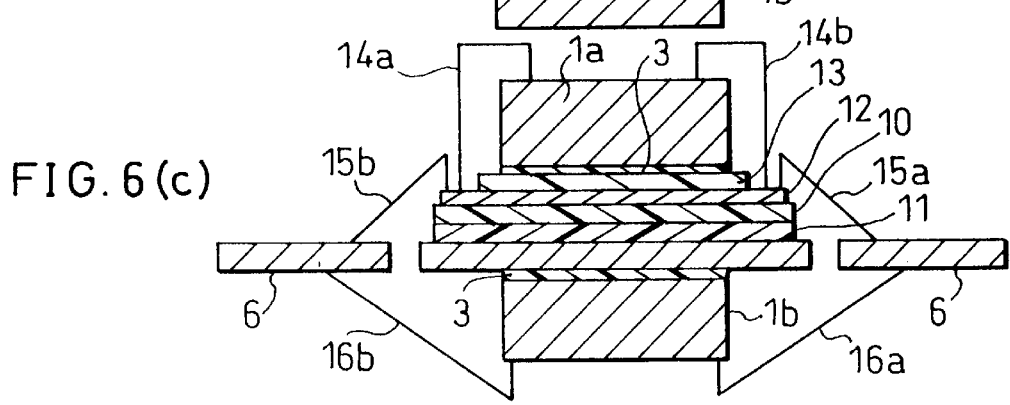

Then, as shown in FIG. 6(c), the lead frame 4 is turned over, and the electrode pad 2b of the semiconductor chip 1b is electrically connected to the inner lead 6 through the wire bonding by means of the bonding wires 16a and 16b in the same manner as above.

The supersonic wave he at contact bonding method (heating temperature of 250° C.) using a combination of a supersonic wave and heating is adopted for the wire bonding, and like in the die bonding, the wire bonding is carried out while the element forming surfaces of the semiconductor chips 1a and 1b are supported by an elastic body.

Figure 6D:
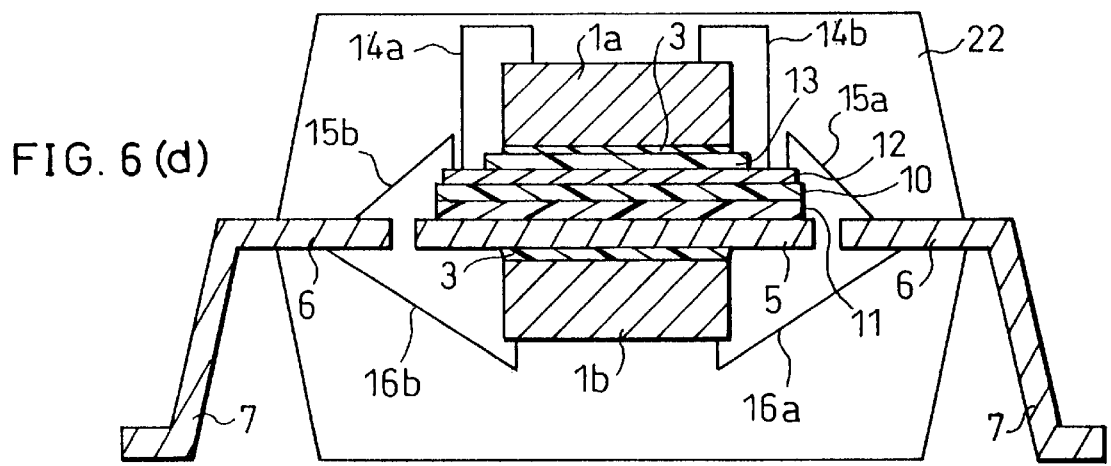

Then, as shown in FIG. 6(d), the aforementioned elements are molded with the molding resin 22. Subsequently, a tie bar (not shown) for preventing the leakage of the molding resin 22 into the spaces among outer leads 7, and support leads 8 (see FIG. 4) for supporting the die pad 5, both formed in the lead frame 4, are disconnected. Finally, the outer lead 7 is bent to form a desired shape.

According to the above arrangement, the semiconductor chips 1a and 1b are mounted respectively onto both the surfaces of the die pad 5, thereby forming the 2-chip-1-package semiconductor device. Thus, since a memory capacity is increased compared with the 1-chip-1-package semiconductor device, the number of the components mounted onto the electronic equipment can be reduced. Consequently, it has become possible to provide a semiconductor device which can contribute significantly to the production of light and compact electronic equipment.

In addition, since the wire pattern 12 functions as a relay point between the electrode pad 2a and inner lead 6, the bonding wires 14a and 14b, through which the wire pattern 12 and inner lead 6 are electrically connected to each other, can be shorter. Thus, the above arrangement can prevent the inconveniences, such as a short-circuit between the bonding wire and semiconductor chip 1a or the adjacent bonding wire, or the opening (disconnection) of the bonding wire, in a secure manner.

Further, since the wire pattern 12 is provided, even when the electrode pads 2a and 2b are aligned in an order different from the electric signal order necessary for the inner leads 6 in the lead frame 4, the electrode pads 2a and 2b which receive and output the same signal can be connected to a particular inner lead 6. Thus, when a semiconductor device having mounted thereon a plurality of semiconductor chips 1a and 1b is produced, the position of the electrode pads 2a and 2b on their respective semiconductor chips 1a and 1b does not have to be modified. Therefore, according to the above arrangement, the costs of the semiconductor device can be saved while the semiconductor device can be developed in a shorter period in a secure manner for the omitted job of modifying the design of the semiconductor chips 1a and 1b.

According to the present invention, a multichip-1-package semiconductor device of the stacked structure having thereon mounted two semiconductor chips of any kind including the array semiconductor chip can be realized. Thus, a more versatile multichip-1-package semiconductor device can be provided.

Embodiment 2

Referring to FIGS. 7 through 12, the following description will describe another example embodiment of the present invention. Hereinafter, like components are labeled with like reference numerals with respect to Embodiment 1, and the description of these components is not repeated for the explanation's convenience.

Figure 7:
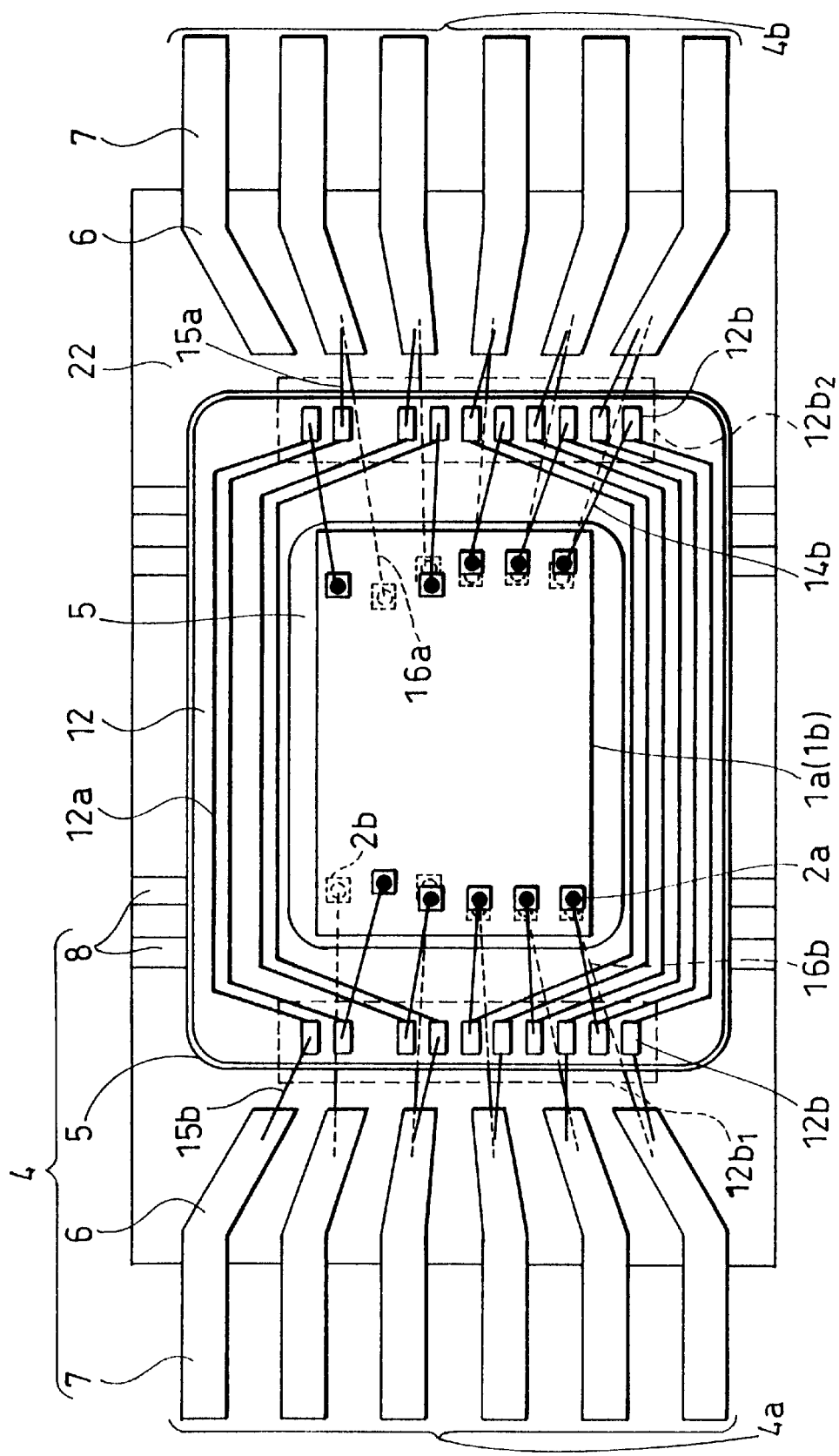
FIG. 7 is a front elevation of a perspective view of a semiconductor device in accordance with another example embodiment of the present invention, and it shows an arrangement, wherein semiconductor chips are mounted onto both the surfaces of a die pad to which a single-layer wire substrate having opened a window in an area where the semiconductor chips is mounted and in the vicinity thereof is laminated.
Figure 8:
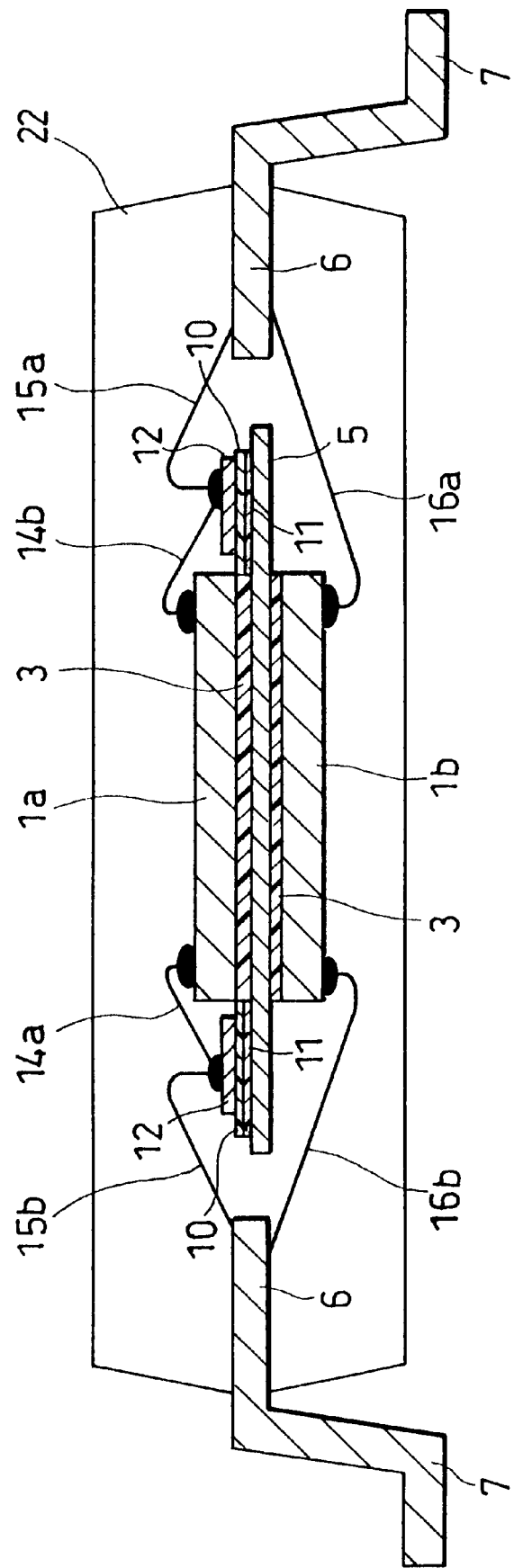
FIG. 8 is a side elevation of a perspective view of the above semiconductor device.
Figure 9:
FIGS. 9(a) through 9(e) are side elevations of perspective views showing producing steps of the above semiconductor device.
Figure 9:
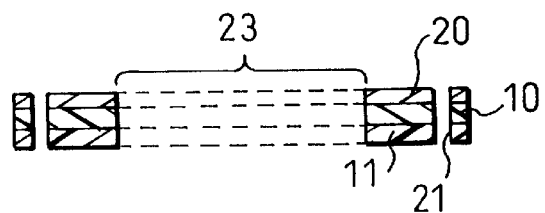
Figure 9:
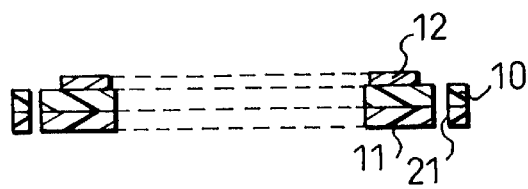
Figure 9:
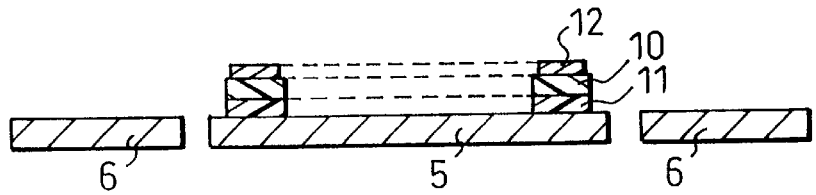
Figure 9:
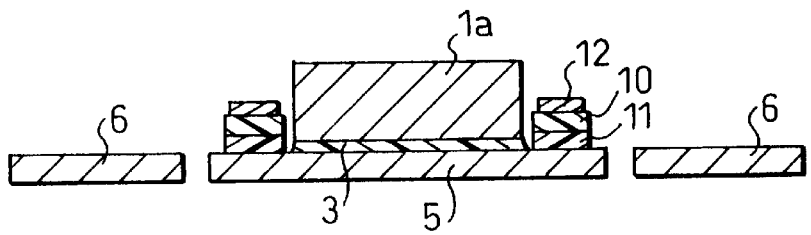
Figure 10A:
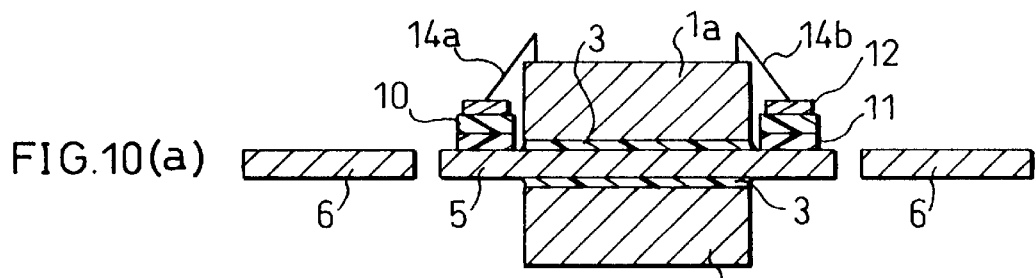
FIGS. 10(a) through 10(d) are side elevations of perspective views showing producing steps of the above semiconductor device following the step in FIG. 9(e)
Figure 10B:
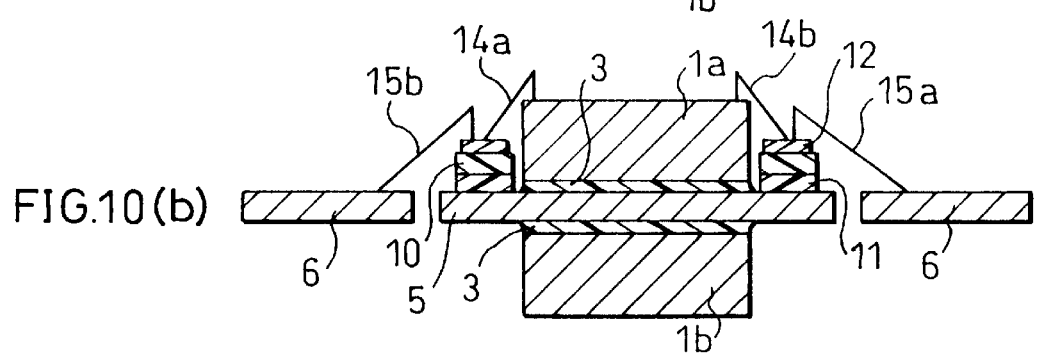
Figure 10C:
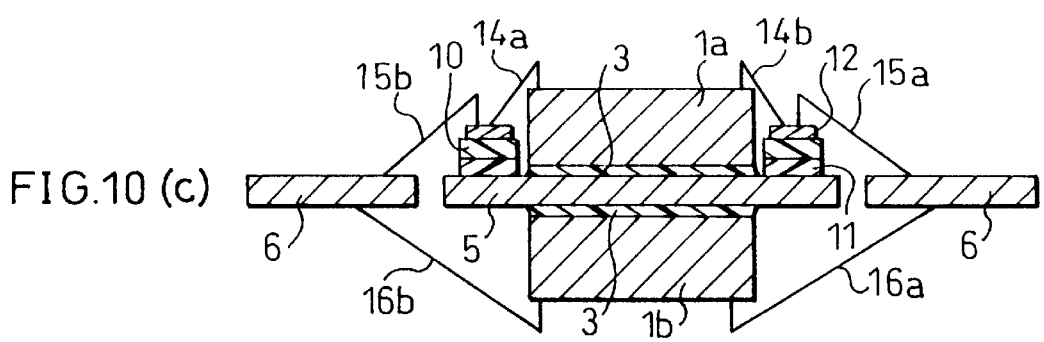
Figure 10D:
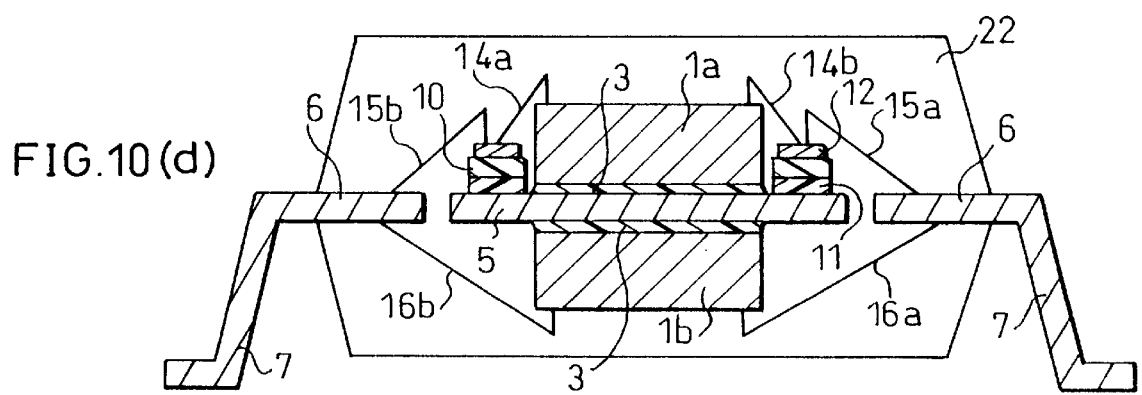

A semiconductor device of the present embodiment is different from the counterpart in Embodiment 1 in that, as shown in FIGS. 7 and 8, at least the wire pattern 12 on the die pad 5 is provided to avoid where the semiconductor chip 1a is mounted, that is, it is provided at the circumference portion of the semiconductor chip 1a. In the present embodiment, the insulation materials 10 and 11 on the die pad 5 are also provided to avoid where the semiconductor chip 1a is mounted. A producing method of such a semiconductor device will be explained with reference to FIGS. 9(a) through 10(d).

To begin with, as shown in FIG. 9(a), varnish of the insulation material 10 is applied evenly over metal foil 20, such as copper foil, after which the heat treatment is applied so as to form a thin film by evaporating a solvent component in the same manner as Embodiment 1.

Then, as shown in FIG. 9(b), the insulation material 11 is applied evenly over the varnish of the insulation material 10, and the heating treatment is applied to form a thin film. Then, the metal foil 20 and insulation materials 10 and 11 are stamped out with a metal mold where the semiconductor chip 1a will be mounted, whereupon a semiconductor chip mounting relief hole 23 and the sprocket holes 21 as sending holes are produced. A slit or the like may be formed to lessen heat stress at this point.

Then, as shown in FIG. 9(c), the metal foil 20 is etched into the wire pattern 12 including a certain pattern of the wires 12a, electrodes 12b and the like. Here, the wires 12a are patterned so as to avoid where the semiconductor chip 1a will be mounted. In other words, the wires 12a are formed at the circumference portion of the semiconductor chip mounting relief hole 23. Then, electrolytic nickel-plating is applied over the wire pattern 12, over which electrolytic gold-plating is further applied.

A plurality of wires 12a are formed (see FIG. 7), and the straight lines linking two electrodes 12b on the same wire are parallel to a certain side edge of the semiconductor chip 1a, which will be mounted later.

Then, as shown in FIG. 9(d), the substrate is laminated onto the die pad 5 with the insulation material 11 through the heat contact bonding.

The rest of the steps are carried out in the same manner as Embodiment 1. As shown in FIG. 9(e), the semiconductor chips 1a and 1b are bonded to the die pad 5 through the die bonding with the die attachment material 3. Then, as shown in FIGS. 10(a) through 10(d), the wire bonding of the electrode pad 2a of the semiconductor chip 1a and the electrode 12b of the wire pattern 12, and the wire bonding of the electrode 12b and the inner lead 6 of the lead frame 4 are carried out. The wire boding is carried out also for the semiconductor chip 1b mounted onto the other (back) surface of the die pad 5 in the same manner. Then, the aforementioned elements are molded with the molding resin.

According to the above arrangement, the metal foil 20 made into the wire pattern 12 and the insulation materials 10 and 11 are stamped out where the semiconductor chip 1a will be mounted, for example. Thus, the wire pattern 12 and the insulation materials 10 and 11 are not provided where the semiconductor chip 1a is mounted, thereby realizing a thinner semiconductor device.

Figure 11:
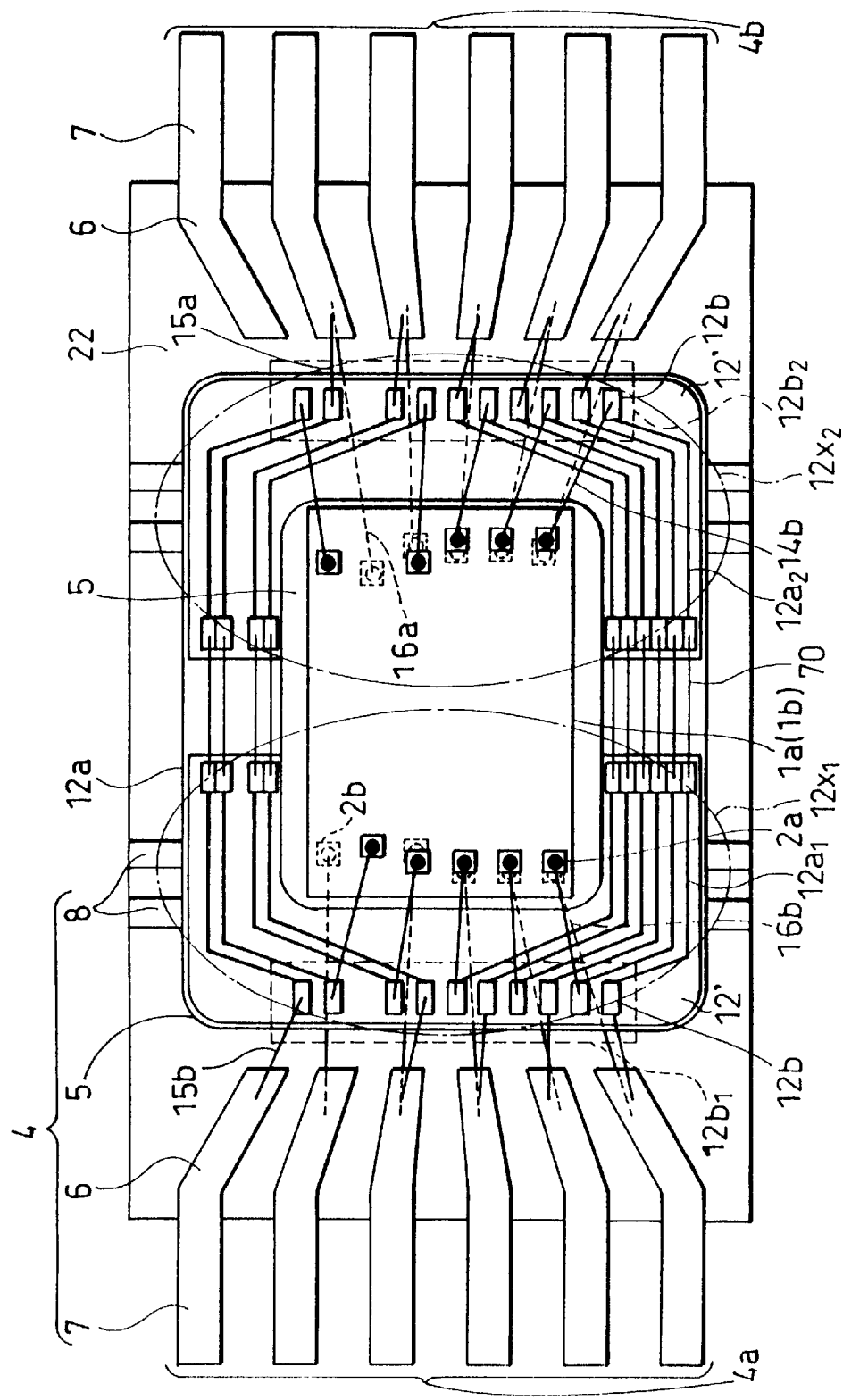
FIG. 11 is a front elevation of a perspective view of a semiconductor device in accordance with still another example embodiment of the present invention, and it shows an arrangement wherein a wire pattern divided into two wire pattern groups are provided on a semiconductor chip mounting substrate, and a metal line for electrically connecting the wire pattern forming one of the wire pattern groups to the wire pattern forming the other wire pattern group is provided.
Figure 12:
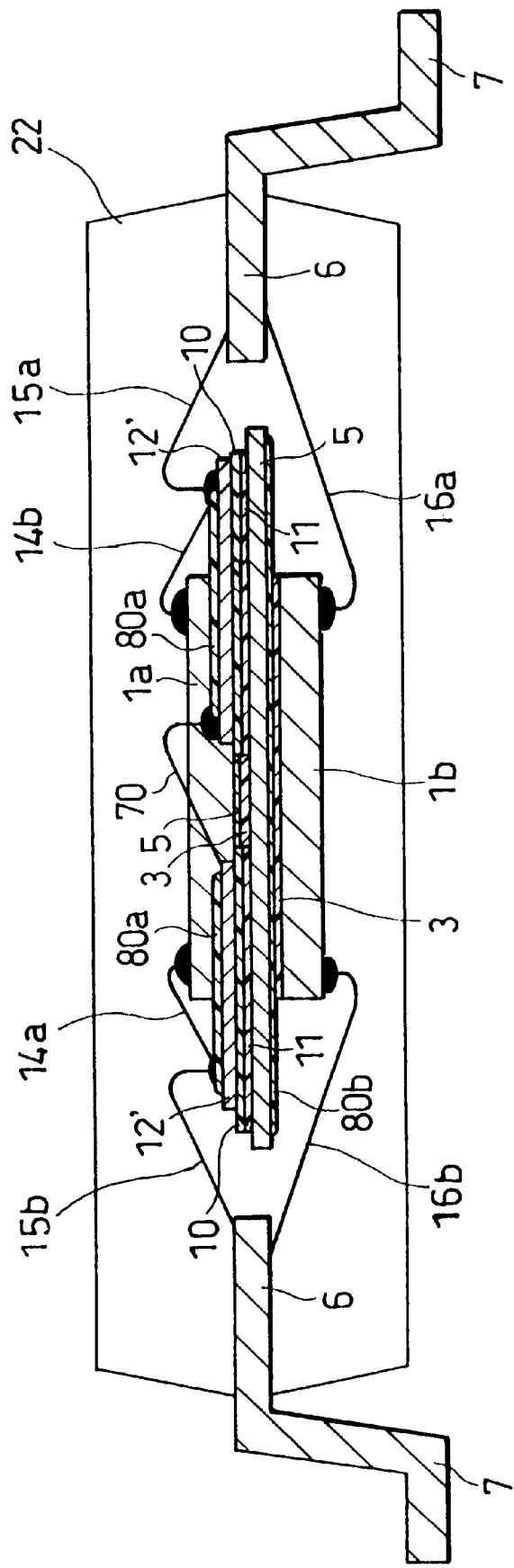
FIG. 12 is a side elevation of a perspective view of the above semiconductor device.

In the present embodiment, one single-layer wire substrate with its semiconductor chip 1a mounting area being stamped out is used. However, as shown in FIGS. 11 and 12, half-divided wire substrates 12', obtained by dividing the single-layer wire substrate into two sections, may be provided. When the single-layer wire substrate is used, the single-layer wire substrate warps after it is bonded to the die pad S due to different thermal expansion coefficients. However, when the half-divided wire substrates 12' are used, such warping is suppressed. To divide the wire substrate in a direction intersecting with the wire pattern in the above manner, wires 12a forming a wire pattern group $12_x{}^1$ and wires $12_{a2}$ forming a wire pattern group $12_{x2}$ are connected to each other through the wire bonding by means of a metal line 70 (third conductor).

Embodiment 3

Referring to FIGS. 13 through 18, the following description will describe still another example embodiment of the present invention. Hereinafter, like components are labeled with like reference numerals with respect to Embodiments 1 and 2, and the description of these components is not repeated for the explanation's convenience.

Figure 13:
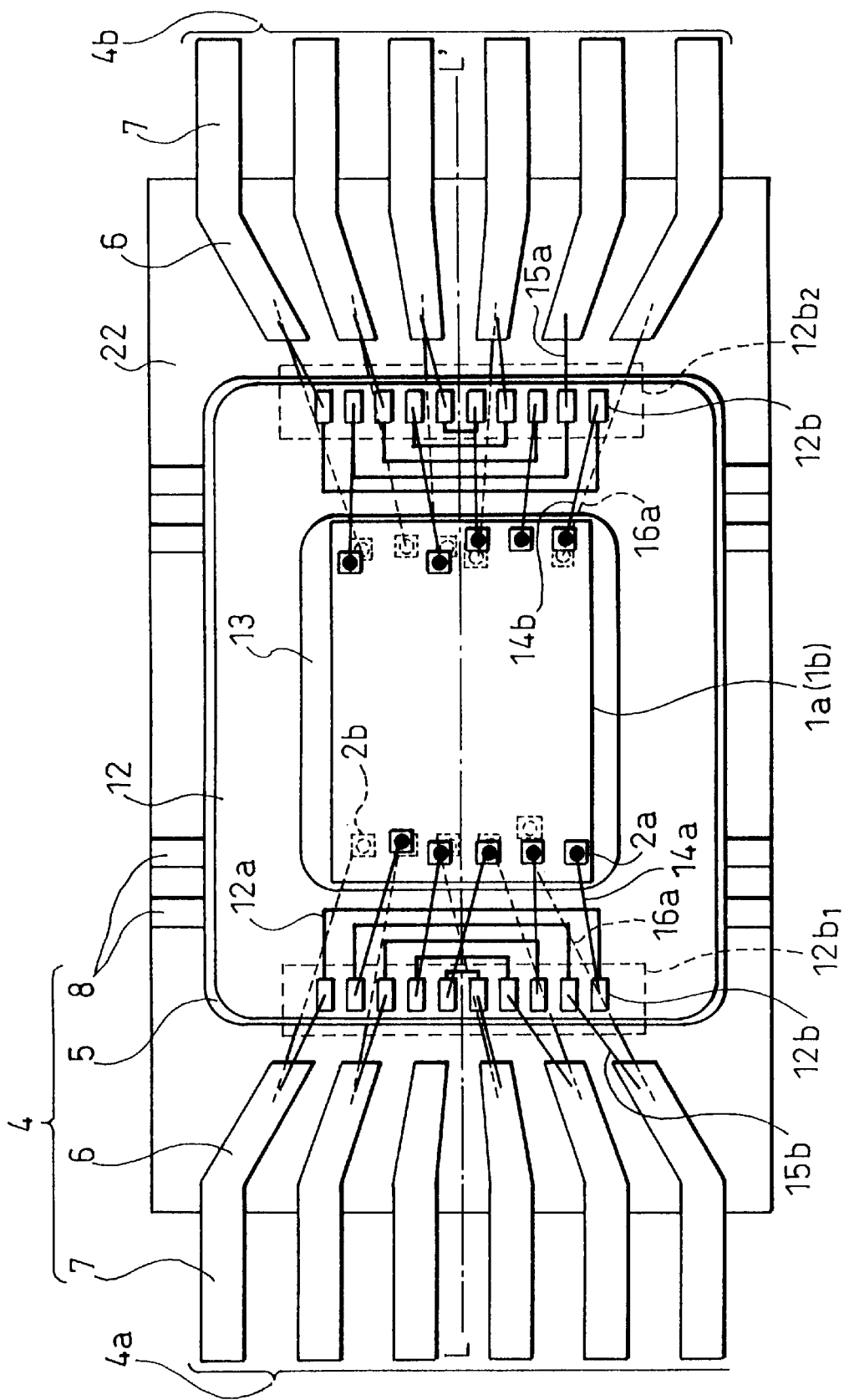
FIG. 13 is a front elevation of a perspective view of a semiconductor device in accordance with still another example embodiment of the present invention, and it shows an arrangement wherein a single-layer wire substrate having opened a window in an area where the semiconductor chip is mounted and in the vicinity thereof is laminated to a die pad through an insulation material provided to the die pad in advance.
Figure 14:
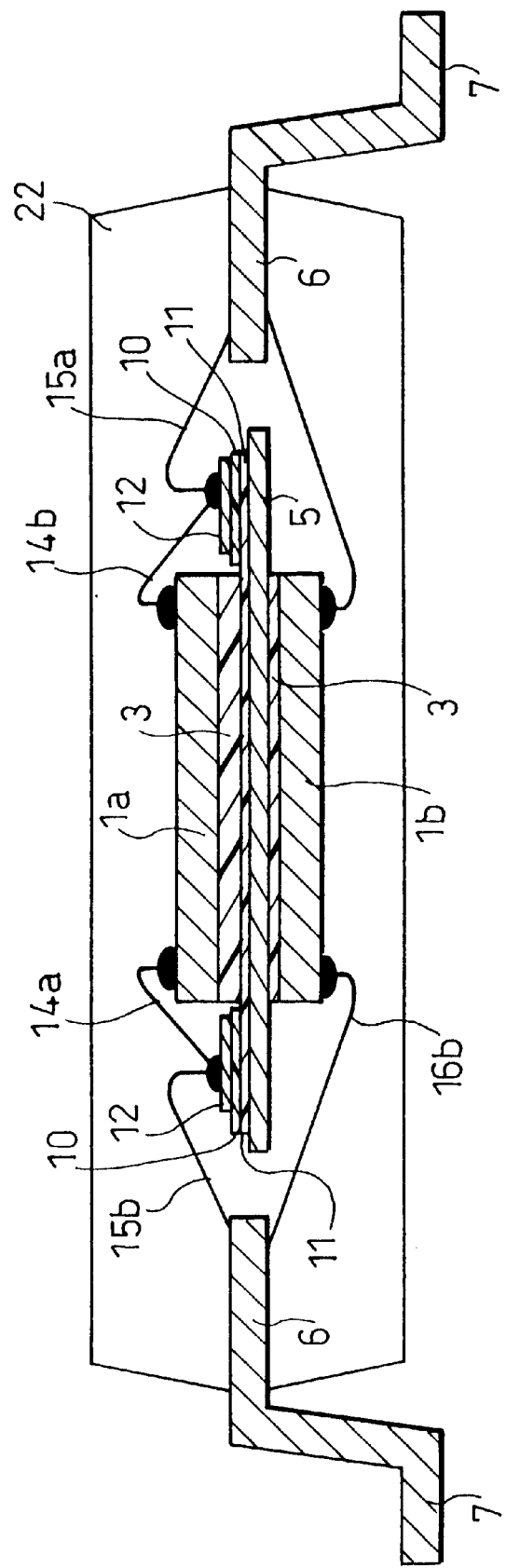
FIG. 14 is a side elevation of a perspective view of the above semiconductor device.
Figure 15:
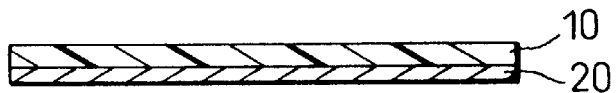
FIGS. 15(a) through 15(e) are side elevations of perspective views showing producing steps of the above semiconductor device.
Figure 15:
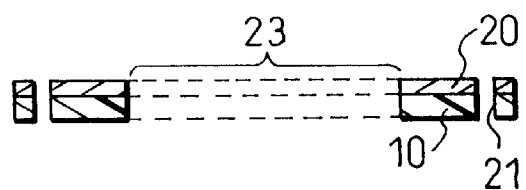
Figure 15:
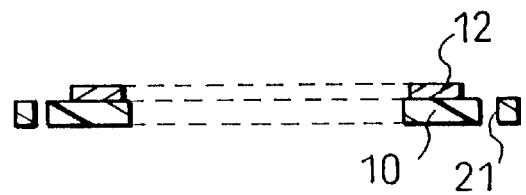
Figure 15:
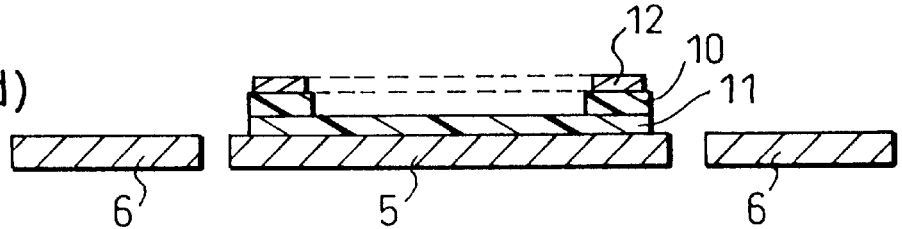
Figure 15:
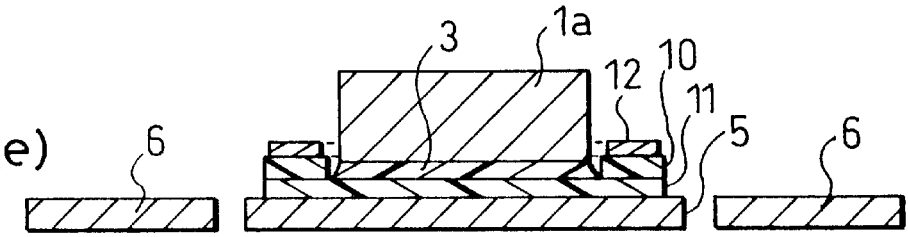
Figure 16A:
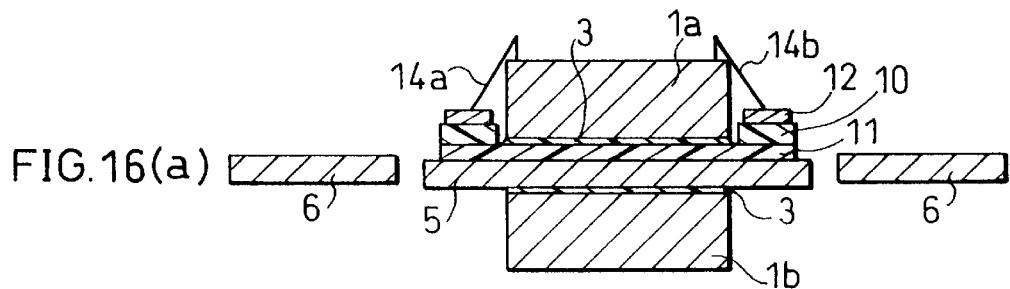
FIGS. 16(a) through 16(d) are side elevations of perspective views showing producing steps of the above semiconductor device following the step in FIG. 15(e)
Figure 16B:
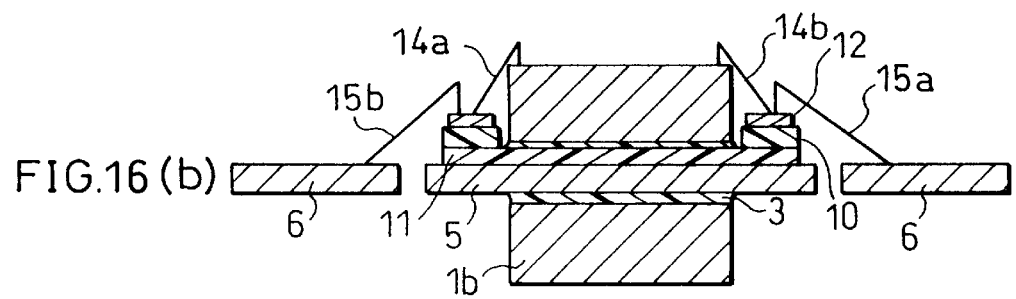
Figure 16C:
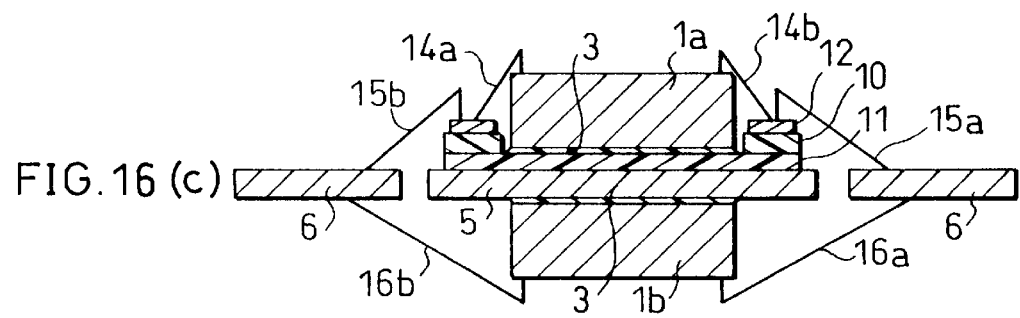
Figure 16D:
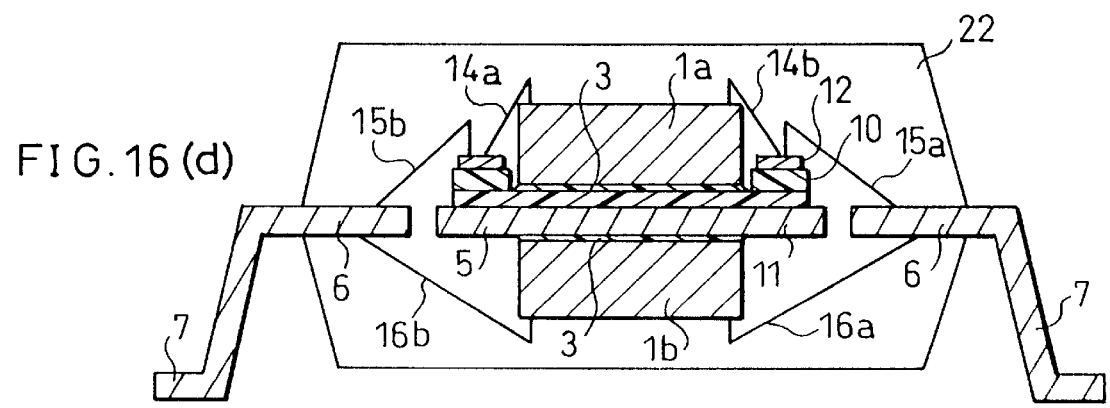

In the present embodiment, as shown in FIGS. 13 and 14, the semiconductor chips 1a and 1b of the same kind are provided on the die pad 5 to oppose each other at their back surfaces while being flipped from top to bottom. To be more specific, when the semiconductor chips 1a and 1b oppose each other at their back surfaces (the flip surface of the element forming surface), with reference to FIG. 3, the side edge ($1a_1$–$1a_4$) of the semiconductor chip 1a is superimposed on the side edge ($1b_2$–$1b_3$) of the semiconductor chip 1b, and the side edge ($1a_2$–$1a_3$) of the semiconductor chip 1a is superimposed on the side edge ($1b_1$–$1b_4$) of the semiconductor chip 1b. In addition, the wires 12a are patterned in the manner described below, so that the electrode pads 2a and 2b which receive and output the same signal are electrically connected to the same inner lead 6, while the electrode pad 2a and electrode 12b, and the electrode 12b and inner lead 6 are respectively bonded to each other through the wire bonding.

In other words, the electrode pads 2a in the electrode pad group $2a_1$ are provided near the side edge of the semiconductor chip 1a on its element forming surface, and aligned in an order different from the electric signal order necessary for the inner leads 6 in the lead group 4a. Likewise, the electrode pads 2a in the electrode pad group $2a_2$ are provided near another side edge of the semiconductor chip 1a on its element forming surface, and aligned in an order different from the electric signal order necessary for the inner leads 6 in the lead group 4b. The wires 12a are patterned in such a manner that the inner leads 6 are connected to the electrode pad group $2a_1$, so that necessary electric signals are supplied to the individual inner leads 6 in the lead group 4a through the wires 12a, while the inner leads 6 are connected to the electrode pad group $2a_2$ so that necessary electric signals are supplied to the individual inner leads 6 in the lead group 4b through the wires 12a.

In other words, the wires 12a are patterned in such a manner to electrically connect the electrodes 12b which are positioned symmetrically with respect to a symmetry axis LL' shown in FIG. 13. The input/output terminals (electrode pads) can be shared to some extent in some kinds of semiconductor chips, and in most of such cases, the electrodes 12b are not positioned symmetrically.

Then, the electrode 2a in the electrode pad group $2a_1$ and electrode 12b are bonded to each other through the bonding wire 14a, so that each electrode pad 2a in the electrode pad group $2a_1$ is electrically connected to one of the inner leads 6 in the lead group 4a, while the electrode 12b positioned symmetrically to the above particular electrode 12b with respect to the symmetry axis LL' is bonded to the same inner lead 6 through the bonding wire 15b.

In addition, the electrode pad 2a in the electrode pad group $2a_2$ and the electrode 12b are bonded to each other through the bonding wire 14b, so that each electrode pad 2a in the electrode pad group $2a_2$ is electrically connected to one of the inner leads 6 in the lead group 4b, while the electrode 12b positioned symmetrically to the above particular electrode 12b with respect to the symmetry axis LL' is bonded to the same inner lead 6 through the bonding wire 15a.

On the other hand, each electrode pad 2b in the electrode pad group $2b_1$ of the semiconductor chip 1b is electrically connected to one of the inner leads 6 in the lead group 4a, and this particular inner lead 6 is electrically connected to the electrode pad 2a in the electrode pad group $2a_1$ which receives and outputs the same signal as the one inputted/outputted in/from the electrode pad 2b through the bonding wire 16b. Whereas each electrode pad 2b in the electrode pad group $2b_2$ is electrically connected to one of the inner leads 6 in the lead group 4b, and this particular inner lead 6 is electrically connected to the electrode pad 2a in the electrode pad group $2a_2$ which receives and outputs the same signal as the one inputted/outputted in/from the electrode pad 2b through the bonding wire 16a.

Then, a producing method of the semiconductor device of the present embodiment will be explained with reference to FIGS. 15(a) through 16(d).

To being with, as shown FIG. 15(a), varnish of the insulation material 10 is applied evenly over metal foil 20, such as copper foil, after which the heat treatment is applied so as to form a thin film by evaporating a solvent component in the same manner as Embodiment 1.

Then, as shown in FIG. 15(b), the metal foil 20 and insulation material 10 are stamped out with a metal mold where the semiconductor chip 1a will be mounted, whereupon a semiconductor chip mounting relief hole 23 and sprocket holes 21 as sending holes are made through. A slit or the like may be formed to lessen heat stress at this point.

Subsequently, as shown in FIG. 15(c), the metal foil 20 is etched into the wire pattern 12 including a certain pattern of the wires 12a, electrodes 12b and the like. Then, electrolytic nickel-plating is applied over the wire pattern 12, over which electrolytic gold-plating is further applied.

Then, as shown in FIG. 15(d), a sheet of the insulation material 11 of substantially the same size as the die pad 5 is laminated to the die pad 5 on the surface where the semiconductor chip 1a will be mounted, after which the single-layer wire substrate composed of the wire pattern 12 and insulation material 10 is laminated to the die pad 5 through the heat contact bonding. The insulation material 11 serves as a bonding material for laminating the single-layer wire substrate to the die pad 5, and can also serve as a provider of electrical isolation between the semiconductor chips 1a and 1b. In the present embodiment, the semiconductor chips 1a and 1b of the same kind are used. However, the insulation material 11 is useful when combining semiconductor chips which operate at different conditions, for example, at different substrate potentials.

The rest of the steps are carried out in the same manner as Embodiments 1 and 2. As shown in FIG. 15(e), the semiconductor chips 1a and 1b are bonded to the die pad 5 through the die bonding with the die attachment material 3. Then, as shown in FIGS. 16(a) through 16(d), the wire bonding of the electrode pad 2a of the semiconductor chip 1a and the electrode 12b of the wire pattern 12, and the wire bonding of the electrode 12b and the inner lead 6 of the lead frame 4 are carried out. The wire bonding is carried out in the semiconductor chip 1b mounted onto the other (back) surface of the die pad 5 in the same manner. Then, the aforementioned components are molded with the molding resin.

According to the above arrangement, even when the electrode pads 2a provided near the side edge of the semiconductor chip 1a on its element forming surface and forming the electrode group $2a_1$ are aligned in an order different from the electric signal order necessary for the inner leads 6 in the lead group 4a, at least the lead group 4a is connected to the electrode pad group $2a_1$ in such a manner that necessary electric signals are provided to the individual inner leads 6 in the lead group 4a through the wire pattern 12. Thus, even when the semiconductor chips 1a and 1b on which the electrode pads 2a and 2b are provided indiscriminately, a 2-chip-1-package semiconductor device can be obtained without modifying the design of the semiconductor chips 1a and 1b.

Figure 17:
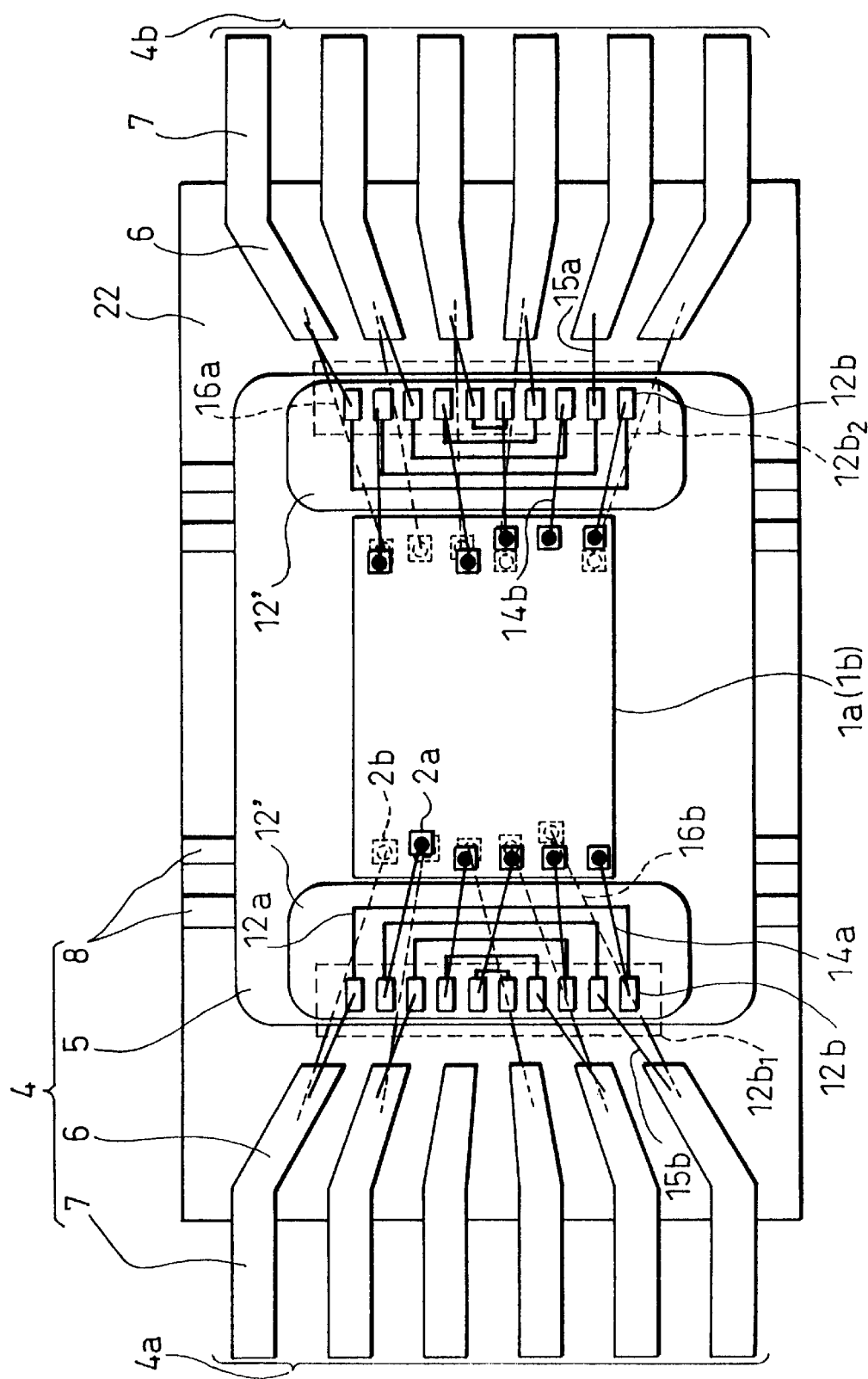
FIG. 17 is a front elevation of a perspective view of a semiconductor device, wherein semiconductor chips are mounted respectively onto both the surfaces of a die pad to which half-divided wire substrates are laminated.
Figure 18:
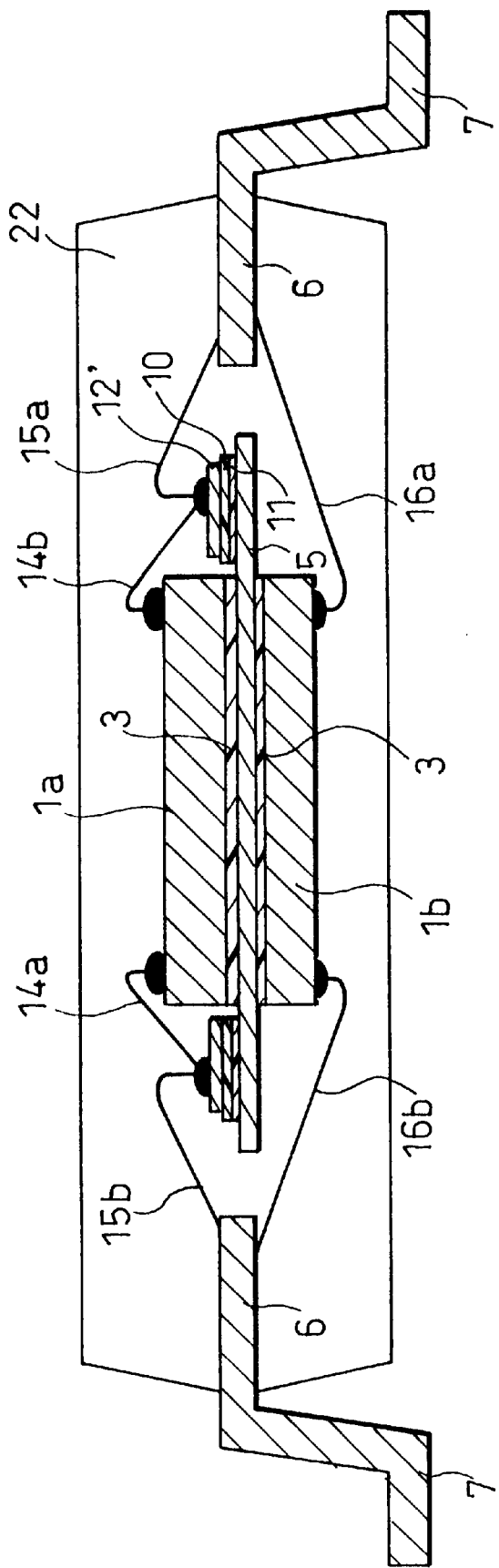
FIG. 18 is a side elevation of a perspective view of the above semiconductor device.

In the present embodiment, a single-layer wire substrate with the semiconductor chip 1a mounting area being stamped out is used. However, as shown in FIGS. 17 and 18, two half-divided wire substrates 12', obtained by dividing the single-layer wire substrate into two sections, may be provided. When the single-layer wire substrate is used, the single-layer wire substrate warps after it is bonded to the die pad 5 due to different thermal expansion coefficients. However, when the half-divided wire substrates 12' are used, such warping does not occur. In case that the semiconductor chips operating at different substrate potentials or the like are mounted, the insulation material 11 must be provided also on the back surface of the semiconductor chip (1a or 1b).

Embodiment 4

Referring to FIGS. 19 through 33, the following description will describe still another example embodiment of the present invention. Hereinafter, like components are labeled with like reference numerals with respect to Embodiments 1 through 3, and the description of these components is not repeated for the explanation's convenience. In the present embodiment, a semiconductor device of a QFP (Quad Flat Package) type using the semiconductor chips 1a and 1b of different kinds will be explained.

Figure 19:
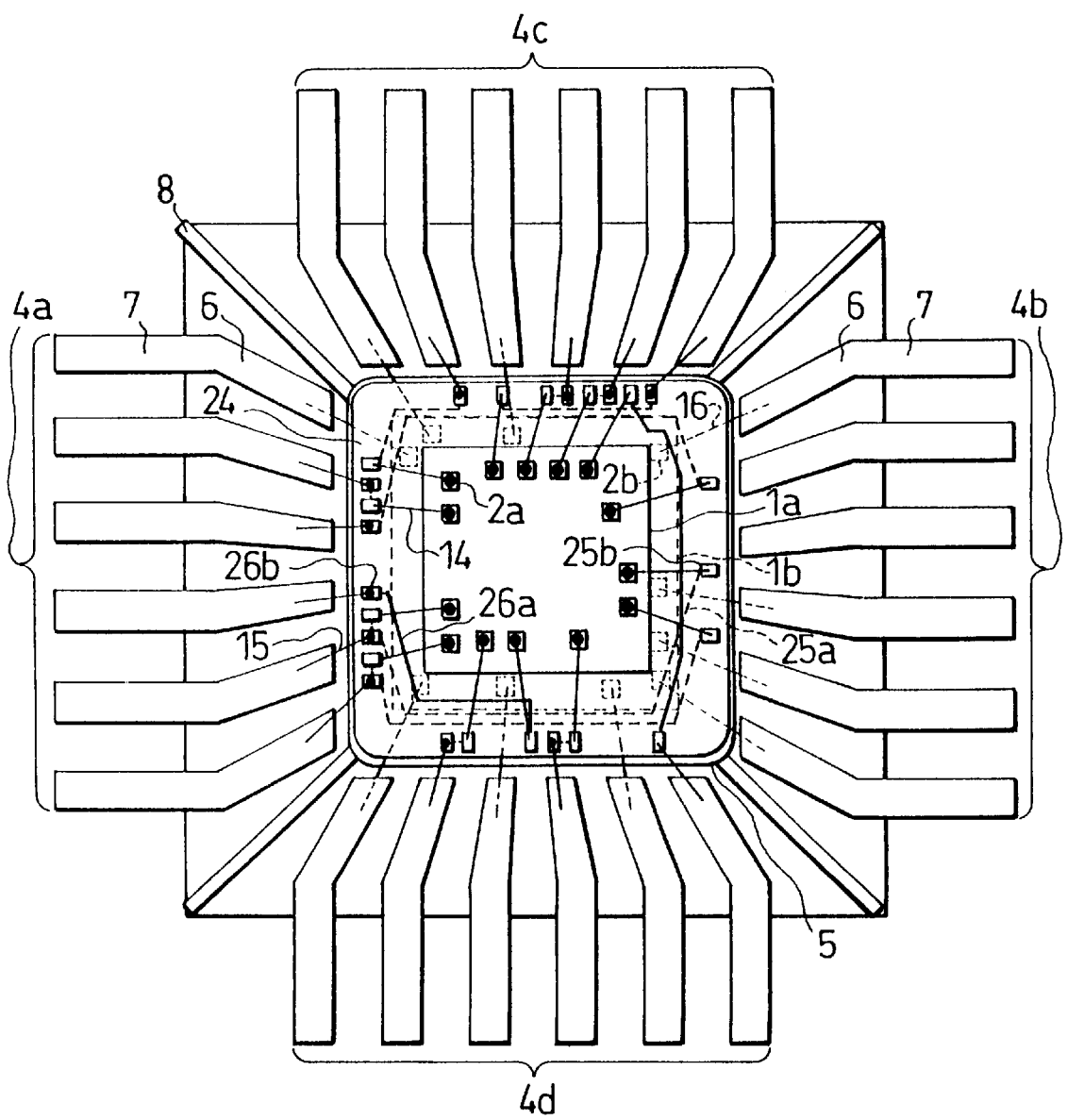
FIG. 19 is a front elevation of a perspective view of a semiconductor device in accordance with still another example of the present invention, wherein semiconductor chips are mounted respectively onto both the surfaces of a die pad to which a double-layer wire substrate is laminated.
Figure 20:
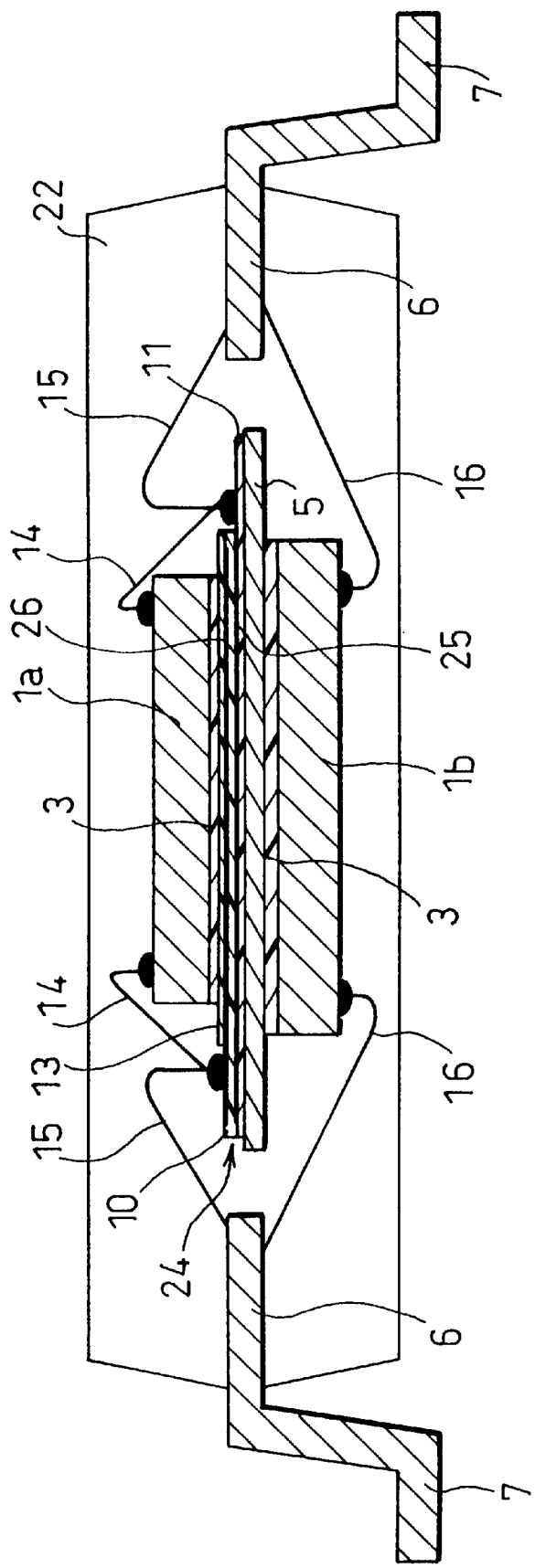
FIG. 20 is a side elevation of a perspective view of the above semiconductor device.

In the present embodiment, as shown in FIGS. 19 and 20, the lead frame 4 (see FIG. 4) is composed of four lead groups 4a, 4b, 4c, and 4d, and a die pad 5, furnished with the insulation materials 10, 11, and 13, and wire patterns 25 and 26, is provided to be encircled by the four lead groups 4a, 4b, 4c, and 4d at the center Of all the four lead groups 4a, 4b, 4c, and 4d, the lead groups 4a and 4b are provided to oppose each other, while the lead groups 4c and 4d are provided to oppose each other.

Figure 21A:
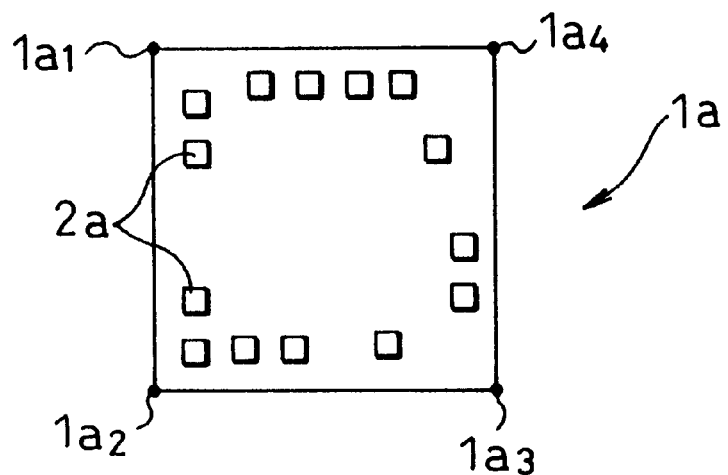
FIGS. 21(a) and 21(b) are plan views showing two semiconductor chips, respectively.
Figure 21B:
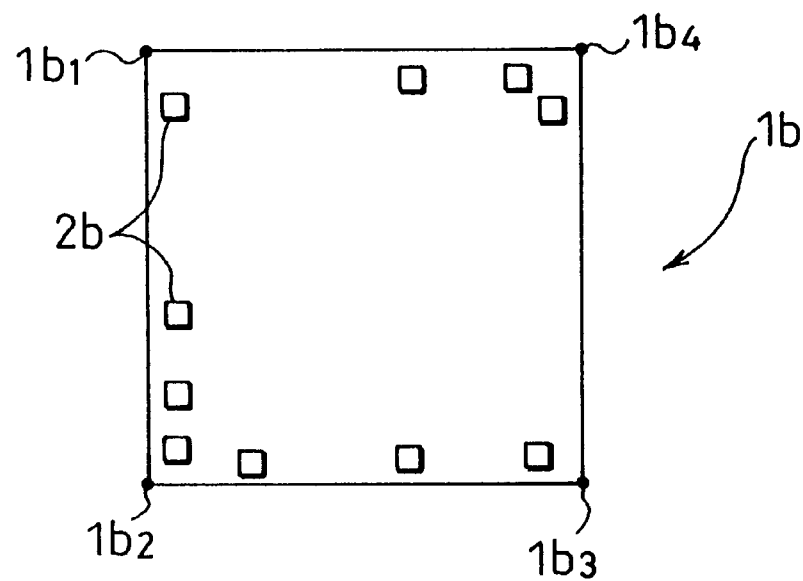

As shown in FIGS. 21(a) and 21(b), the semiconductor chips 1a and 1b of the present embodiment are chips having different chip sizes (the positions of the electrode pads 2a and 2b are different) and operating at different substrate potentials.

The semiconductor chip 1a is mounted onto a wire substrate 24 through the insulation material 13 (see FIG. 20) and die attachment material 3. On the other hand, the semiconductor chip 1b is mounted onto the back surface of the die pad 5, in other words, the flip surface of the semiconductor chip 1a mounting surface, through the die attachment material 3.

The wire pattern 25 is composed of wires 25a (see FIG. 19) of a certain pattern and electrodes 25b. The other wire pattern 26 is composed of wires 26a of a certain pattern and electrodes 26b. The insulation material 10 is sandwiched by the wire patterns 25 and 26 to form the double-layer wire substrate 24. The wire substrate 24 is provided on the die pad 5 through the insulation material 11.

The wires 25a and 26a are patterned in the following manner. That is, the wires 25a and 26a are patterned in such a manner that at least one inner lead 6 in one of the lead groups 4a, 4b, 4c, and 4d is electrically connected to the electrode pad 2a provided on the element forming surface near the side edge of the semiconductor chip other than the side edge opposing the lead group including the above particular inner lead 6. For example, in case that the inner lead 6 belongs to the lead group 4a, the wires 25a and 26a are patterned in such a manner that the inner lead 6 in the lead group 4a is electrically connected to the electrode pad 2a provided on the element forming surface near the side edge(s) of the semiconductor chip 1a other than the side edge ($1a_1$–$1a_2$).

Also, the wires 25a and 26a are patterned in the following manner. That is, a plurality of inner leads 6 are provided in at least one of the lead groups, for example, lead group 4a, and each inner lead 6 receives their own electric signals. On the other hand, as has been explained, a plurality of the electrode pads 2a forming the electrode pad group are provided on the element forming surface of the semiconductor chip 1a near the side edge, and these electrode pads 2a are aligned in an electric signal order different from the electric signal order assigned to the inner leads 6 in the lead group 4a. The wires 25a and 26a are patterned in such a manner that the lead group 4aand the electrode pad group composed of the above electrode pads 2a are connected to each other in the same electric signal order regardless of the above alignment.

In FIG. 19, the wire patterns 25 and 26 (see FIG. 20) are provided through the insulation material 13 to avoid where the semiconductor chip 1a is mounted. However, the wire patterns 25 and 26 may be formed where the semiconductor chips 1a is mounted.

The electrode pad 2a on the semiconductor chip 1a and the electrode 25b (or electrode 26b) are bonded to each other through the bonding wire 14, so that the electrode pad 2a on the semiconductor chip 1a is electrically connected to a particular inner lead 6, while another electrode 25b (or another electrode 26b) which is electrically connected to the above particular electrode 25b (or electrode 26b) through the wire 25a (or wire 26a) and that particular inner lead 6 are boned to each other through the bonding wire 15.

On the other hand, the electrode pad 2b of the semiconductor chip 1b mounted onto the other (back) surface of the die pad 5 is electrically connected to a particular inner lead 6 through the bonding wire 16.

Next, a producing method of the semiconductor device of the present embodiment will be explained with reference to FIGS. 22(a) through 22(e).

A multi-layer wire pattern can be formed on the die pad 5 with any applicable method, and in the present embodiment, the double-layer wire substrate 24, composed of a combination of the polyimide insulation material 10 and metal foil 20, is laminated to the die pad 5.

Figure 22A:
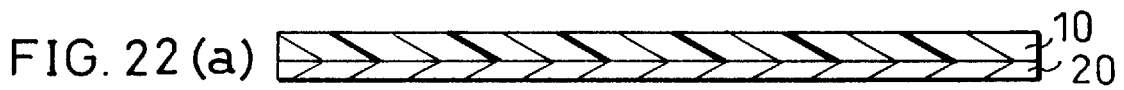
FIGS. 22(a) through 22(e) are side elevations of perspective views showing producing steps of the above semiconductor device.

To begin with, as shown in FIG. 22(a), the insulation material 10 made of varnish of polyimide resin is applied evenly over the metal foil 20, such as copper foil, and the heat treatment is applied to form a thin film by evaporating a solvent component. Note that, however, the solvent component is not evaporated completely in this step.

Figure 22B:
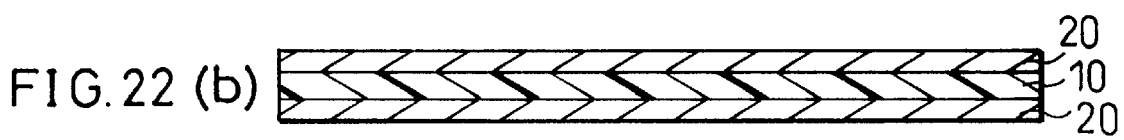
Figure 22C:
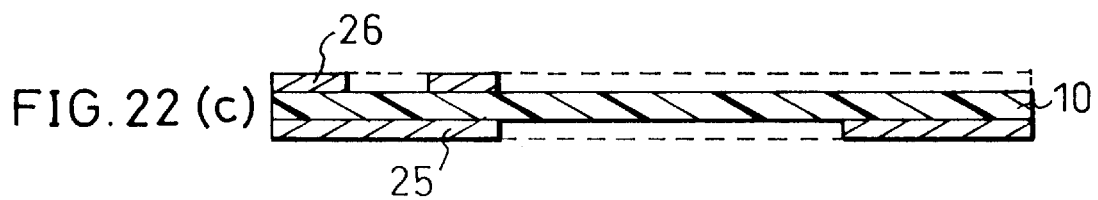

Then, as shown in FIG. 22(b), the metal foil 20, such as copper foil, is applied over the insulation material 10 in which the solvent is not evaporated completely, and then the solvent component is evaporated completely in this step. Subsequently, as shown in FIG. 22(c), the metal foil 20 overlying on both the surfaces of the insulation material 10 is etched into the wire patterns 25 and 26, respectively.

Figure 22D:
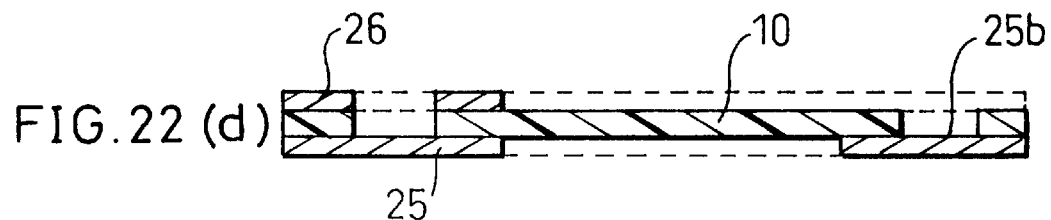

Then, as shown in FIG. 22(d), the insulation material 10 is etched to open a window where the electrode 25b of the wire pattern 25 in the first layer will be formed. This is done so to carry out the wire bonding with the above electrode 25b from the wire pattern 26 side in the second layer during the wire bonding step carried out later.

Then, electrolytic nickel-plating and subsequently electrolytic gold-plating are applied to each of the wire patterns 25 and 26. Hereinafter, a tape material (excluding the insulation material 11), in which the wire patterns 25 and 26 are respectively formed on both the surfaces of the insulation material 10, is referred to as the double-layer wire tape. Also, the double-layer wire tape (excluding the insulation material 11) cut into a desired shape is referred to as the double-layer wire substrate 24 hereinafter.

Figure 22E:
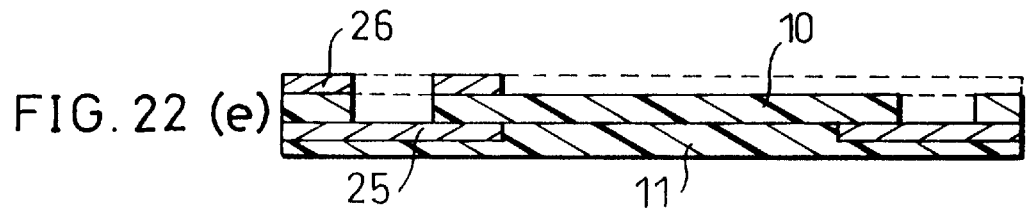

Subsequently, as shown in FIG. 22(e), varnish of the thermoplastic insulation material 11 generally used also as the die attachment material for the LOCs (Lead On Chip) or the like is applied over the wire pattern 25, and the heat treatment is applied. When the insulation material 11 is applied, the insulation material 11 is applied thicker where the semiconductor chip 1a will be mounted, so that the surface of the insulation material 11 will be uniform after the heat treatment.

Then, sprocket holes 21 as sending holes are made through in the same manner as Embodiment 1 (see FIG. 5(b)), and the insulation material 13 of polyimide resin is formed over the wire pattern 26 on the semiconductor chip 1a mounting surface. Then, the double-layer wire substrate 24 made into a desired shape is laminated to the die pad 5 with the insulation material through the heat contact bonding. Then, the semiconductor chips 1a and 1b are bonded respectively to both the surfaces of the die pad 5 to which the double-layer wire substrate 24 has been laminated with the die attachment material 3 through the die bonding. In the present embodiment, the semiconductor chips 1a and 1b of different kinds and operating at different substrate potentials are used. Thus, thermosetting silver-free paste mixed with spherical silica powders is used as the die attachment material 3.

Then, the electrode pad 2a and a desired electrode 25b (or electrode 26b ) are bonded to each other by means of the bonding wire 14, while the inner lead 6 and a desired electrode 25*b* (electrode 26*b*) are bonded to each other by means of the bonding wire 15 through the wire bonding. On the other hand, the electrode pad 2*b* of the semiconductor chip 1*b* mounted onto the other (back) surface of the die pad 5 and a desired inner lead 6 are bonded to each other with the bonding wire 16 through the wire bonding.

According to the above arrangement, even when the semiconductor chips 1*a* and 1*b* are of different kinds and the electrode pads 2*a* and 2*b* are aligned indiscriminately thereon, the electrode pads 2*a* and 2*b* are electrically connected to the corresponding inner leads 6 by the flexible wiring of the wire pattern 25 in the first layer and the wire pattern 26 in the second layer. Thus, when the electrode pads 2*a* and 2*b* are provided in such a manner that makes the connection to the inner lead 6 difficult, an effect similar to the effects attained in Embodiments 1 through 3 can be achieved with adequate wire bonding.

Figure 23:
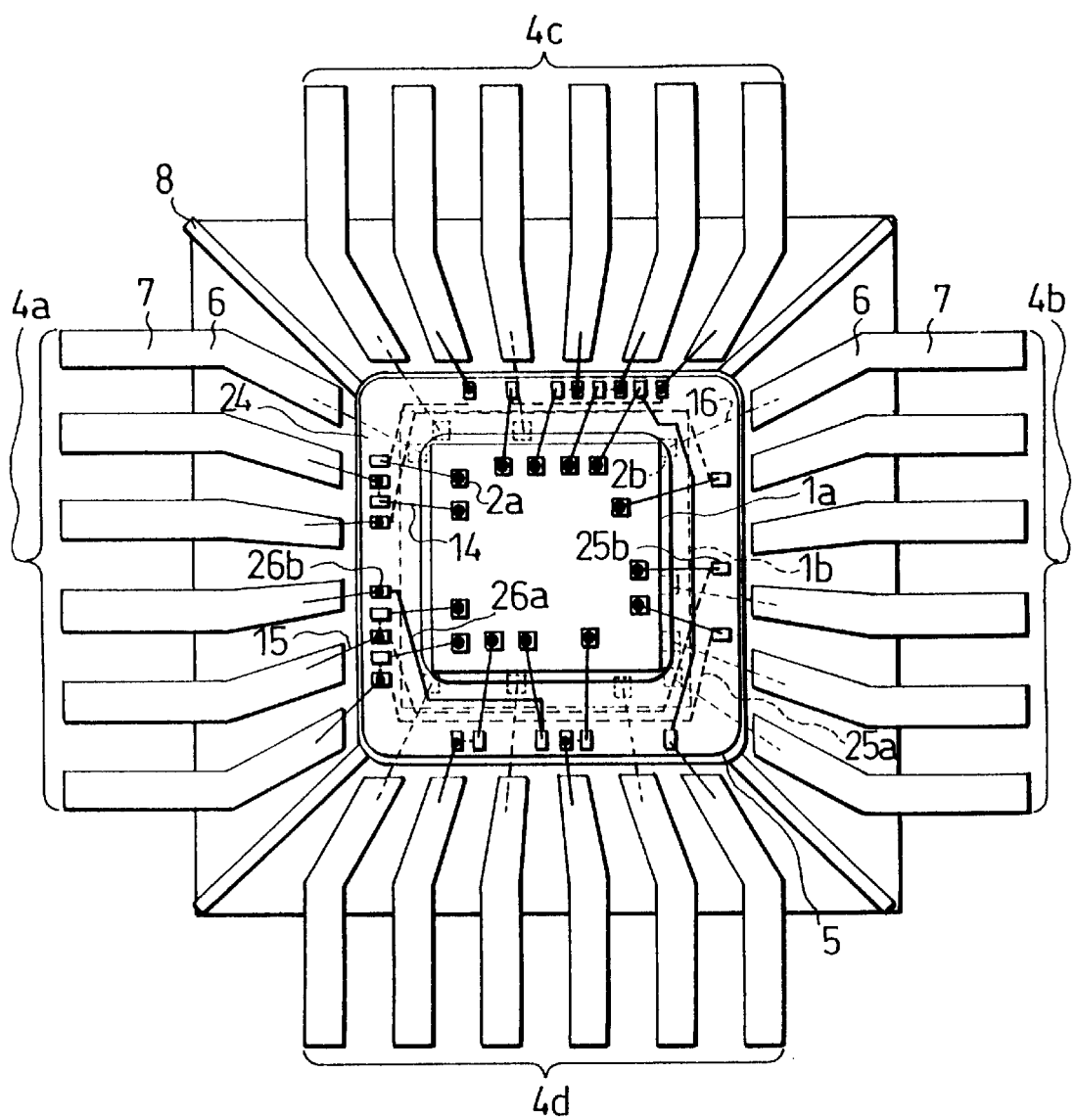
FIG. 23 is a front elevation of a perspective view of a semiconductor device, and it shows an arrangement, wherein semiconductor chips are mounted onto both the surfaces of a die pad to which a double-layer wire substrate having opened a window in an area where the semiconductor chip is mounted and in the vicinity thereof is laminated.
Figure 24:
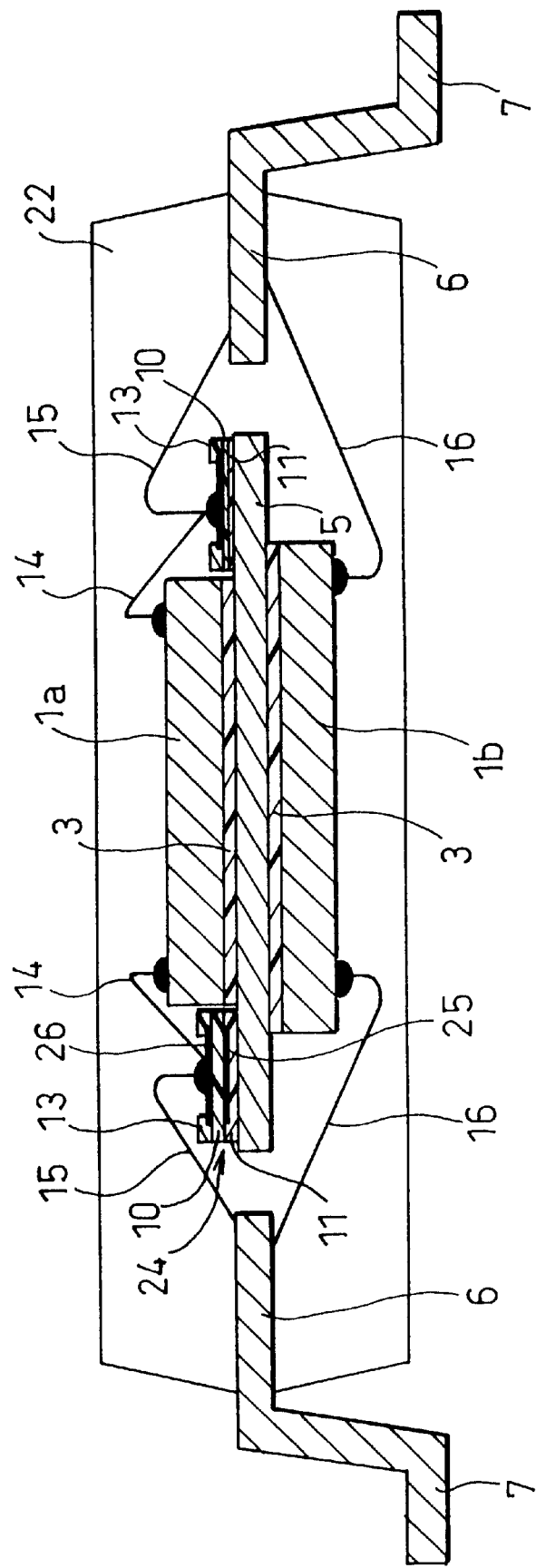
FIG. 24 is a side elevation of a perspective view of the above semiconductor device.

Also, as shown in FIGS. 23 and 24, the wire patterns 25 and 26 and the insulation materials 10, 13, and 11 may be provided at the circumference of the semiconductor chip 1*a* to avoid where the semiconductor chip 1*a* is mounted.

In such a case, in the step of FIG. 22(*e*), after the insulation materials 11 and 13 are formed respectively on the both surfaces of the double-layer wire tape, the double-layer wire tape is stamped out with a metal mold where the semiconductor chip 1*a* will be mounted and the vicinity thereof. Further, the double-layer wire tape is cut into a certain shape to produce the wire substrate 24, which is laminated to the die pad 25 through the heat contact bonding. In this case, since the wire patterns 25 and 26 and the insulation materials 10, 13, and 11 are not provided where the semiconductor chip 1*a* is mounted, the device can be made thinner.

In this case, the semiconductor chips 1*a* and 1*b* can have different chip sizes (the position of the electrode pads 2*a* and 2*b* are different), but have to use the same kind of silicon substrates and operate at the same substrate potential. However, in case that the semiconductor chips 1*a* and 1*b* use different kinds of silicone substrates or operate at different substrate potentials, the insulation must be provided between the semiconductor chips 1*a* and 1*b*.

Figure 25:
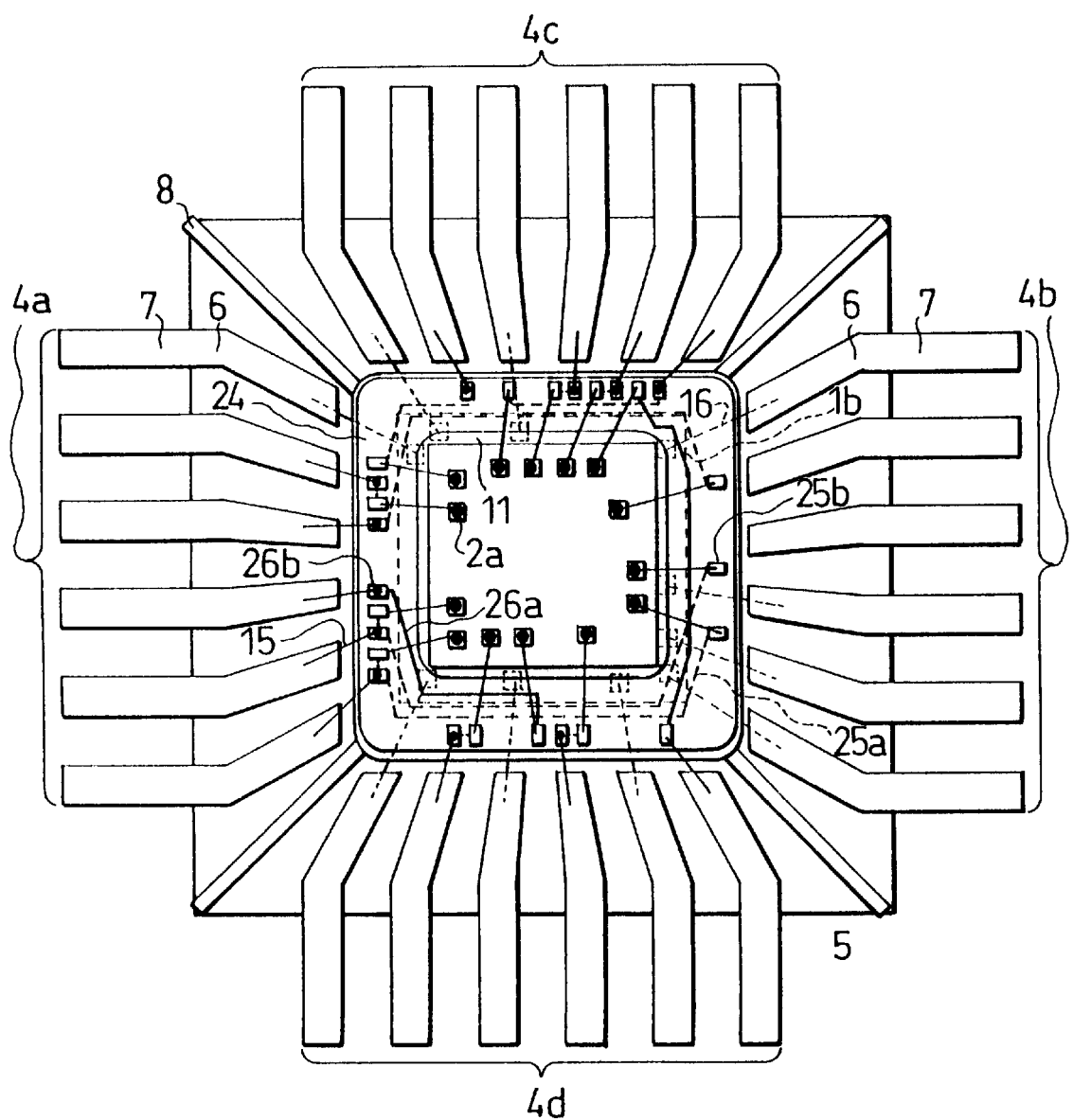
FIG. 25 is a front elevation of a perspective view of a semiconductor device, and it shows an arrangement, wherein a double-layer wire substrate having opened a window in an area where the semiconductor chip is mounted and in the vicinity thereof is laminated to a die pad through an insulation material provided to the die pad in advance.
Figure 26:
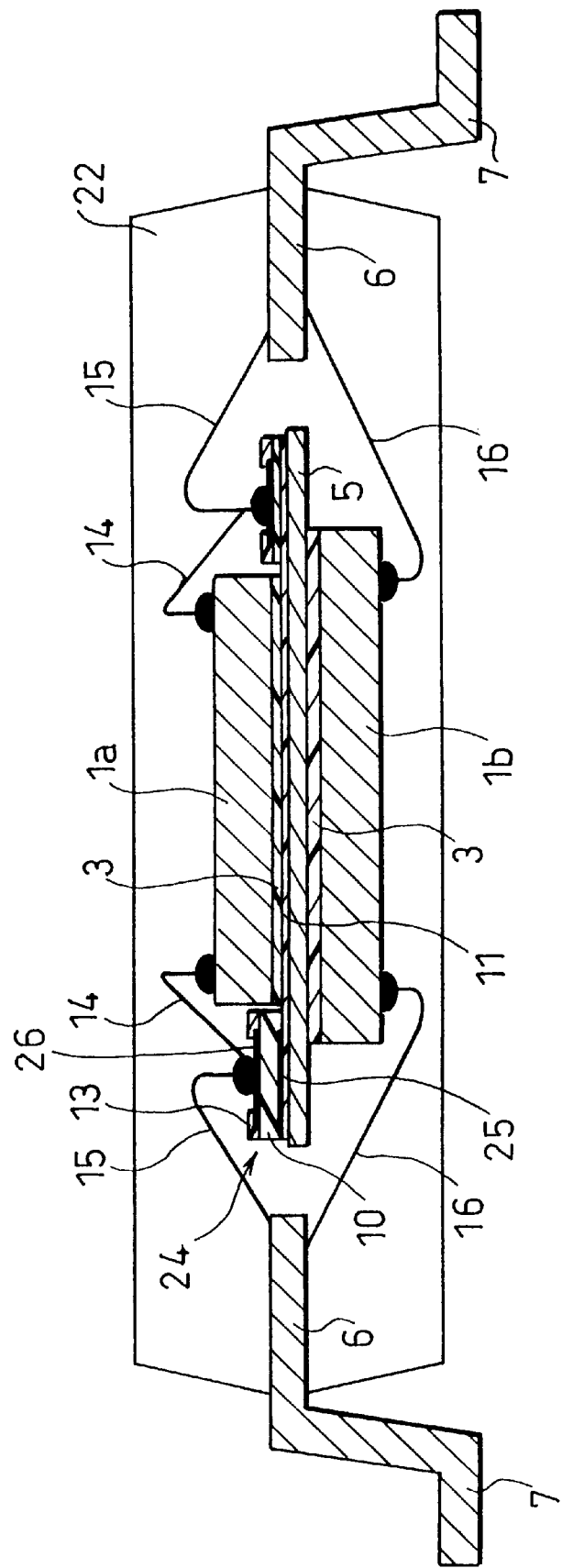
FIG. 26 is a side elevation of a perspective view of the above semiconductor device.

Thus, as shown in FIGS. 25 and 26, the semiconductor device may be assembled by providing the wire substrate 24 through the insulation material 11 provided to the die pad 5 in advance. In this case, the insulation material 11 is not applied over the insulation material 10 after the window is opened through the wire substrate 24 where the semiconductor chip 1*a* will be mounted, but a sheet of the insulation material 11 of substantially the same size as the die pad 5 is laminated to the die pad 5 through the heat contact bonding, so that the wire substrate 24 is laminated to the die pad 5 through the insulation material 11.

Figure 27:
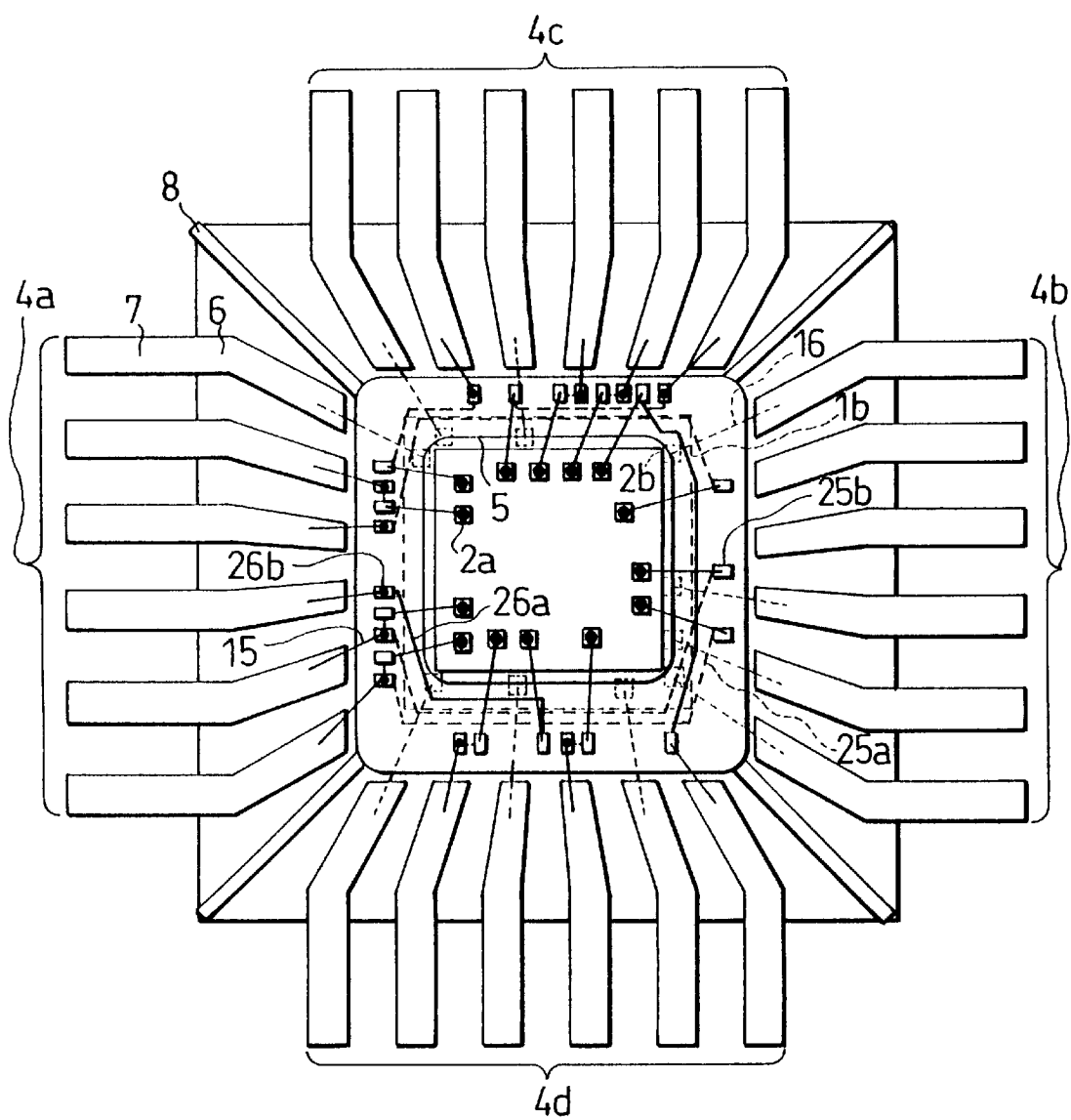
FIG. 27 is a plan view of a semiconductor device, wherein varnish of an insulation material is used to provide electrical insulation between the semiconductor chips, and a wire substrate is larger than a die pad.
Figure 28:
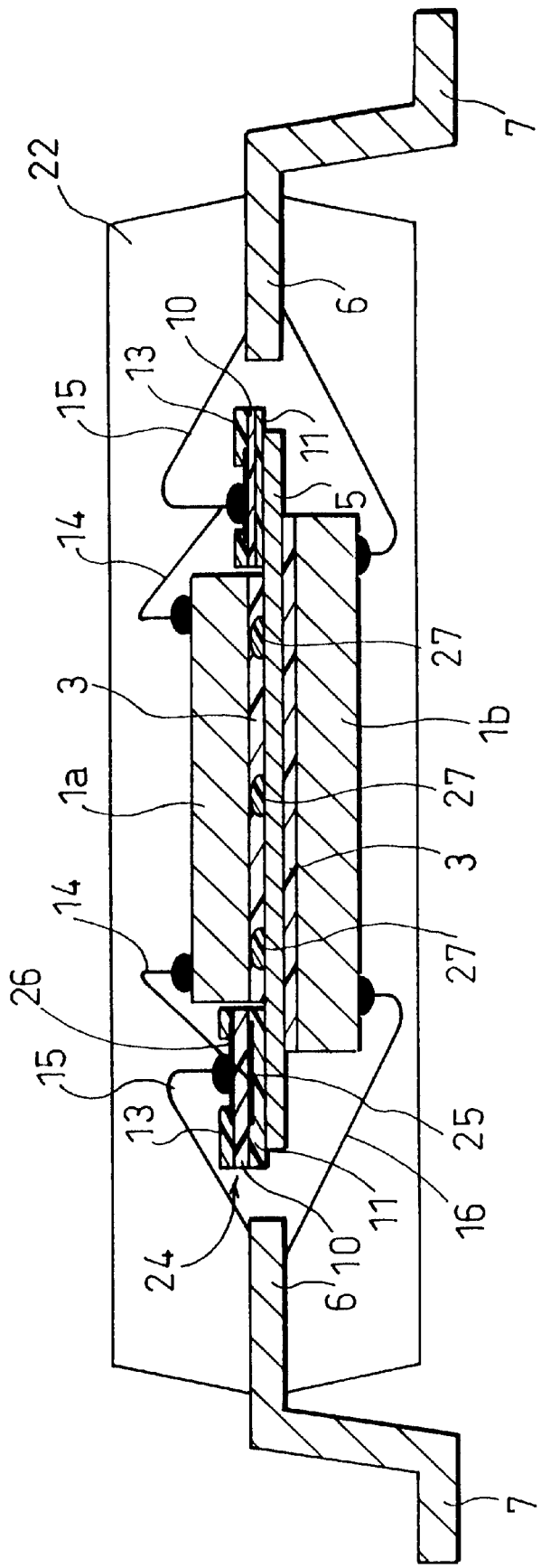
FIG. 28 is a side elevation of a perspective view of the above semiconductor device.

The electrical insulation may be provided between the semiconductor chips 1*a* and 1*b* of different kinds (using different kinds of silicon substrates, or operating at different substrate potentials) without using a sheet of the polyimide insulation material 11. To be more specific, as shown in FIGS. 27 and 28, polyimide insulation resin 27 is drawn in dots or linearly over the die pad 5. The semiconductor device of this type is produced in the following manner.

The steps up to where the insulation material 11 is formed on the wire substrate 24 on the surface where the wire pattern 25 is provided (up to the step of FIG. 22(*e*)) are identical with those explained above. Then, as shown in FIG. 29(*a*), the wire substrate 24 and insulation material 11 are stamped out with a metal mold where the semiconductor chip 1*a* will be mounted and the vicinity thereof, whereby the semiconductor chip mounting relief hole 23 and the sprocket holes 21 are made through.

Incidentally, the electrolytic plating is applied to the double-layer wire substrate 24 cut into a desired shape from the wire tape, and an extension wire used during the plating is extended to the outside of the wire substrate 24. Thus, when such an extension wire is cut, the cut end portion may touch the die pad 5.

Figure 29A:
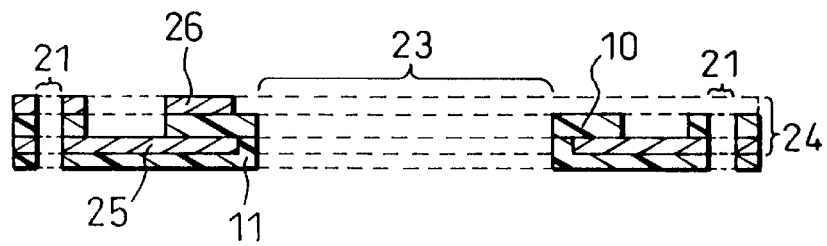
FIGS. 29(a) through 29(c) are cross sections showing producing steps of the above semiconductor device.
Figure 29B:
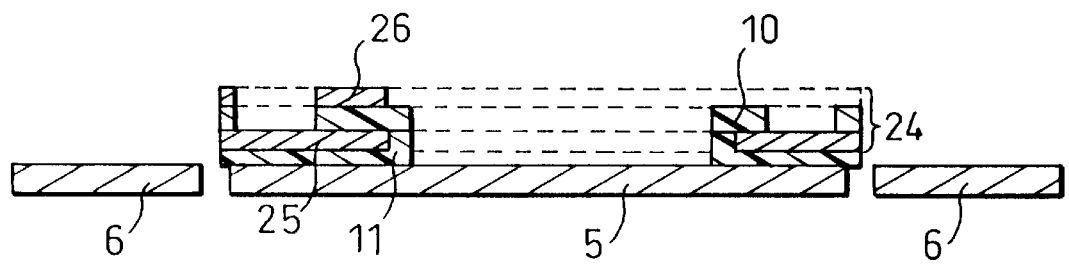
Figure 29C:
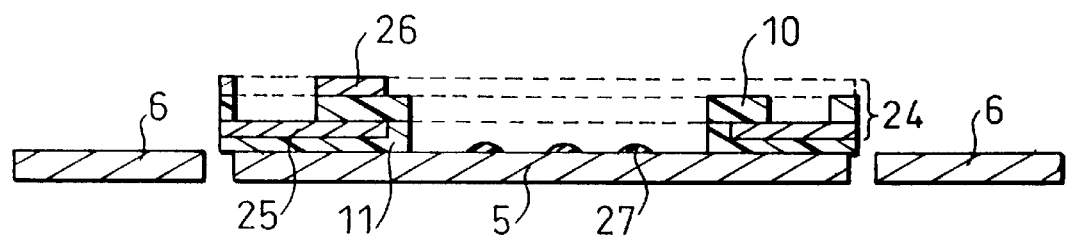

To avoid such an inconvenience, as shown in FIG. 29(*b*), the above wire tape is cut into a shape slightly larger than the die pad 5 and in a size such that prevents the physical contact to the inner lead 6, after which the extension wire tape cut in the above manner is laminated to the die pad 5 through the heat contact bonding.

Then, as shown in FIG. 29(*c*), varnish of polyimide resin 27 is drawn on the die pad 5 and the solvent component is evaporated through the heat treatment to provide electrical insulation between the semiconductor chips 1*a* and 1*b*. Then, when the semiconductor chips 1a and 1*b* are bonded to the die pad 5 through the die bonding, the electrical insulation must be provided between the semiconductor chips 1*a* and 1*b*. Thus, the semiconductor chips 1*a* and 1*b* are bonded to the die pad 5 through the die bonding with the die attachment material 3 made of silver-free paste or the like. The rest of the steps are carried out in the same manner as described above.

According to the above method, not only the insulation effect attained in the case using the sheet of the polyimide insulation material 11 can be attained, but also there can be attained another effect, that is, the semiconductor device can be made thinner in the height direction.

Figure 30:
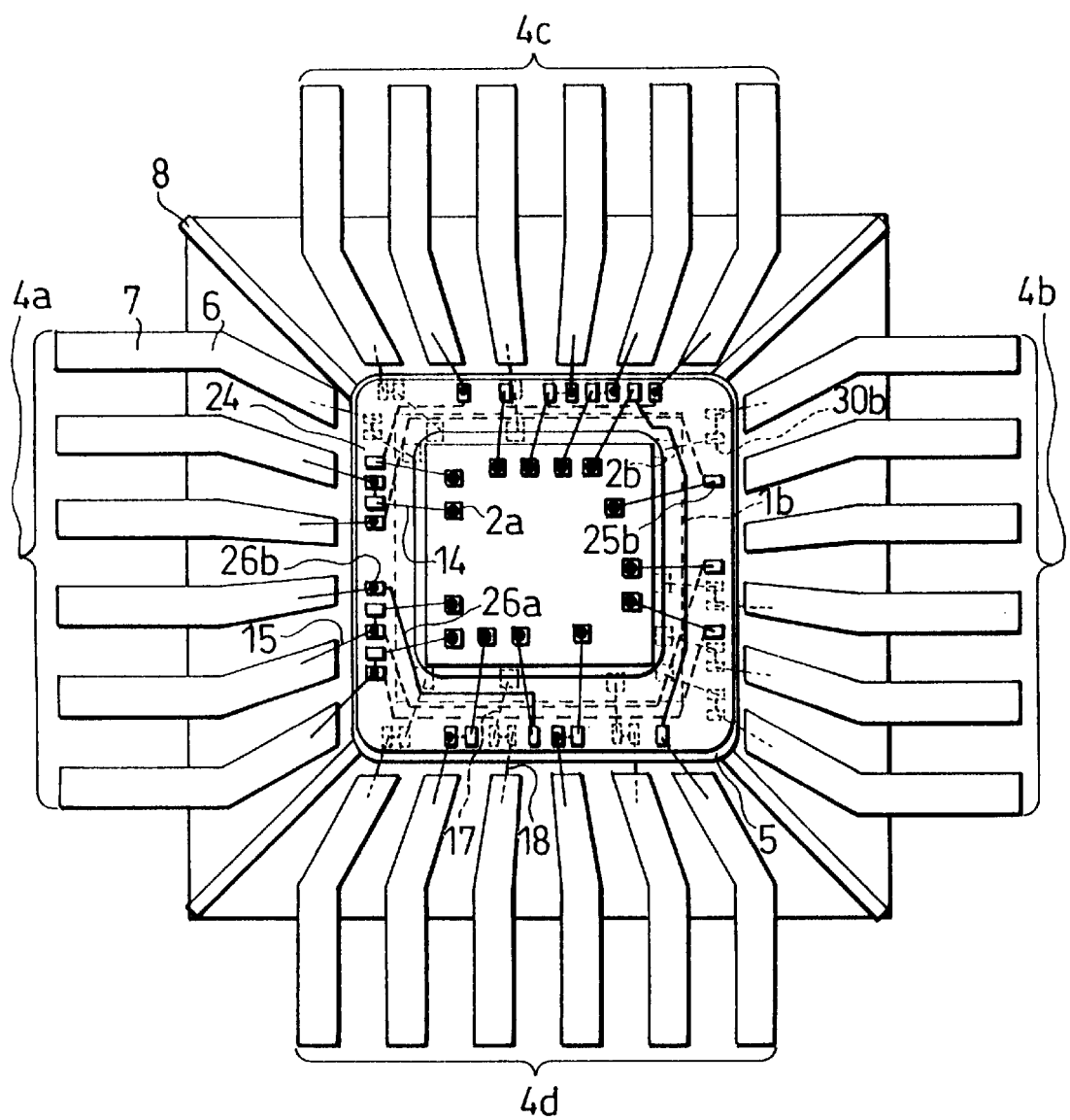
FIG. 30 is a front elevation of a perspective view of a semiconductor device, wherein wire substrates are laminated respectively to both the surfaces of a die pad.
Figure 31:
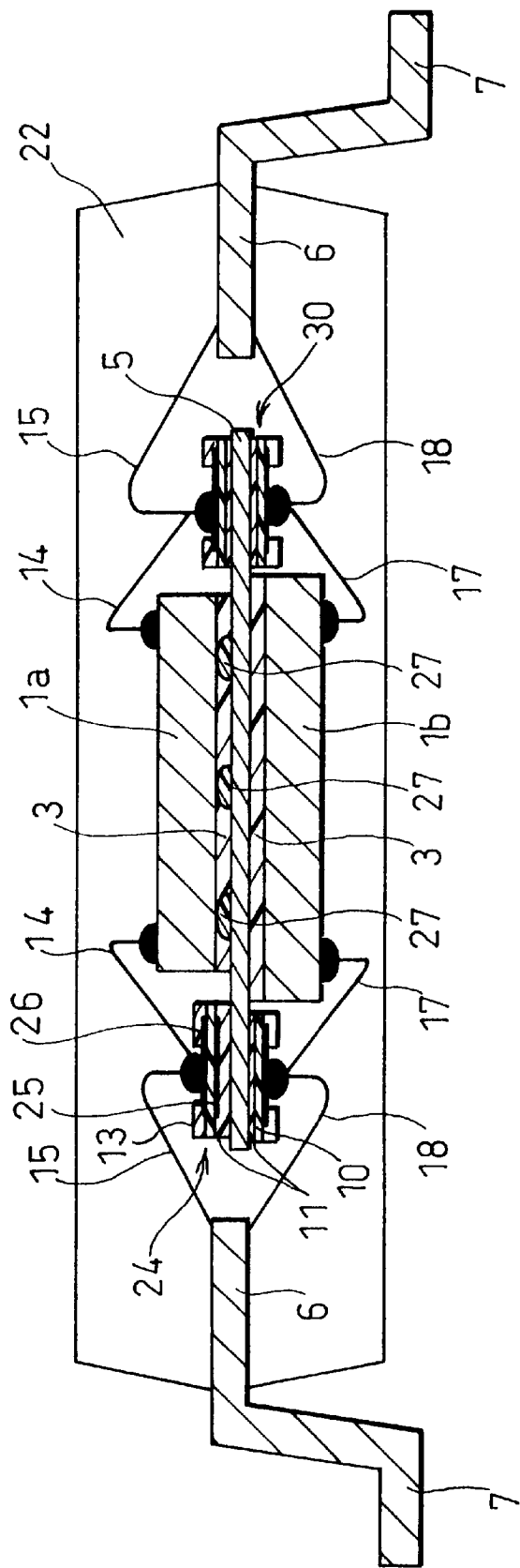
FIG. 31 is a side elevation of a perspective view of the above semiconductor device.

As shown in FIGS. 30 and 31, a single- or double-layer wire substrate 30 having electrodes 30*b* may be provided to the die pad 5 on the semiconductor chip 1*b* mounting surface as a relay point to shorten the length of bonding wires 17 and 18. Consequently, more flexibility is allowed also to the wiring on the back surface (the semiconductor chip 1*b* mounting surface) of the die pad 5.

Figure 32:
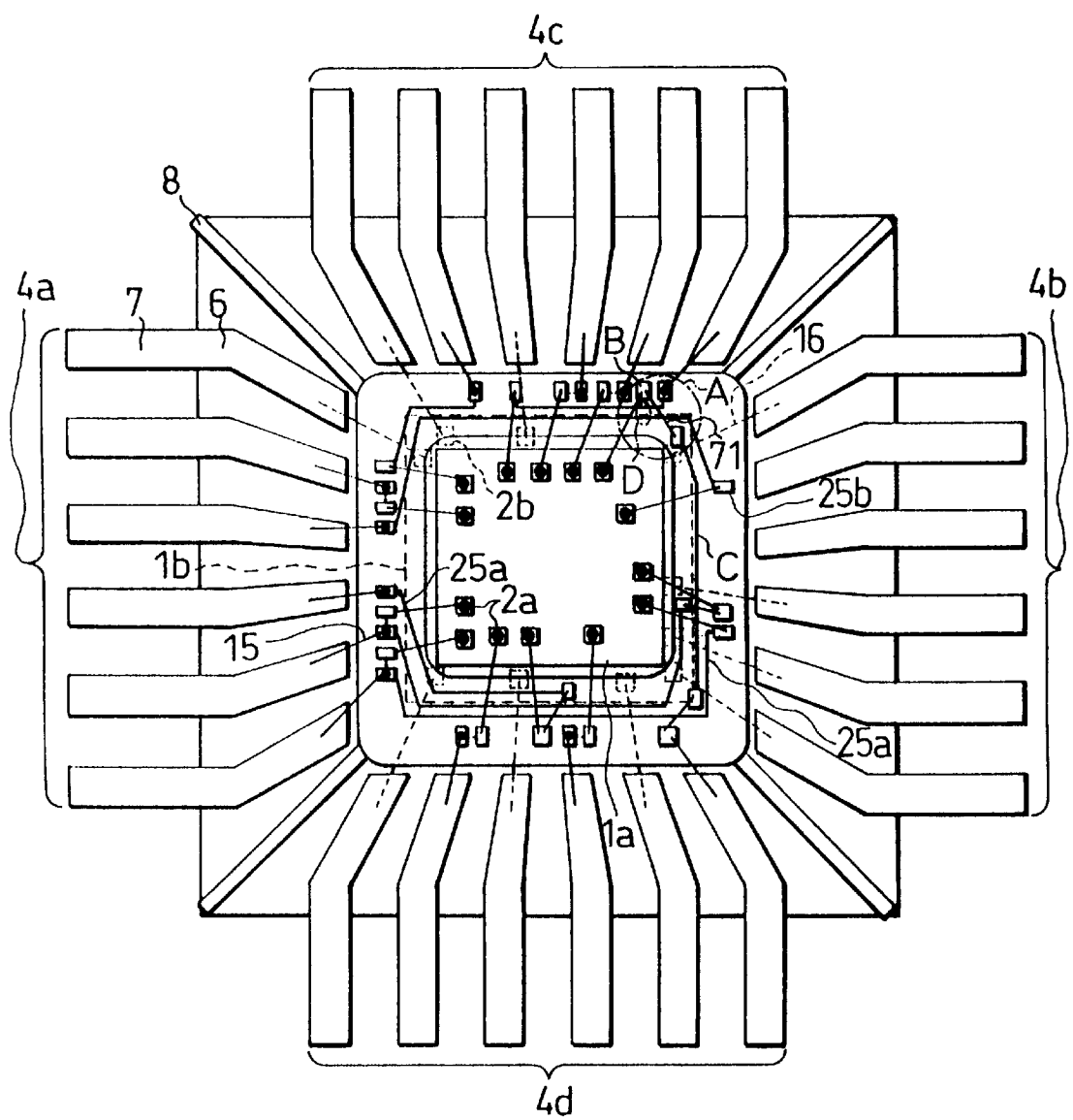
FIG. 32 is a front elevation of a perspective view of a semiconductor device in accordance with still another example embodiment of the present invention, and it shows an arrangement wherein a wire pattern on a semiconductor chip mounting substrate includes electrically separated first and second wire groups provided on a substantially horizontal plane and a metal line for electrically connecting the wires in the first wire group to the wires in the second wire group is provided.
Figure 33:
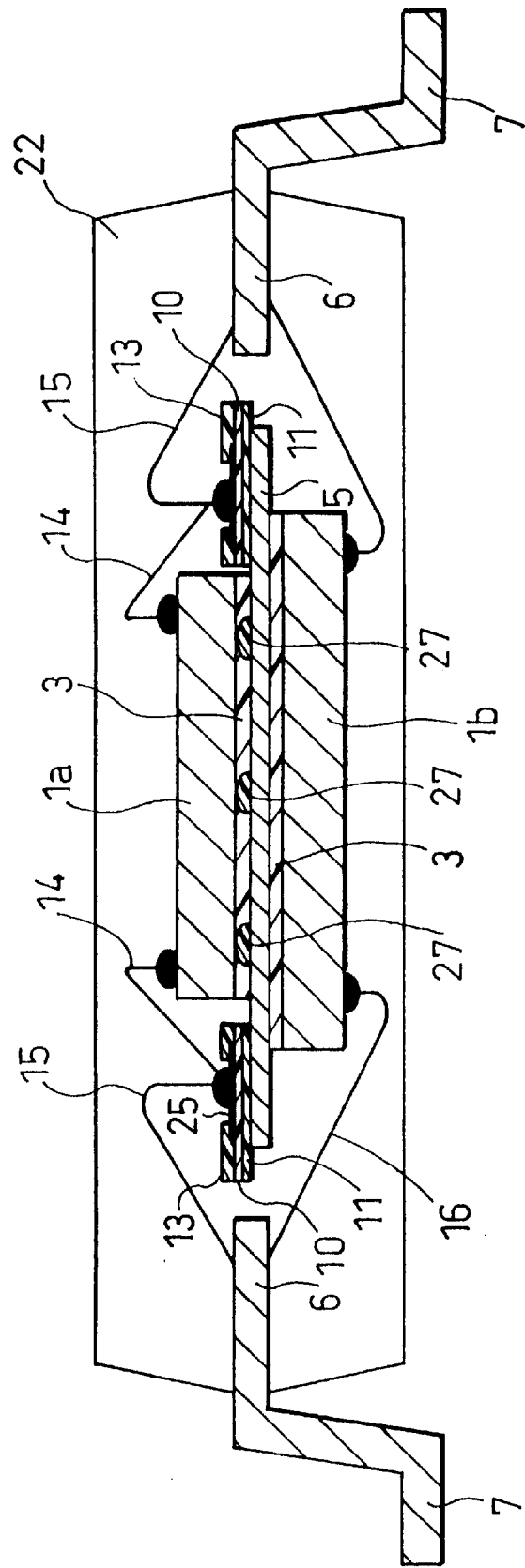
FIG. 33 is a side elevation of a perspective view of the above semiconductor device.

A semiconductor device of the QFP type using the double-layer wire pattern has been explained as an example. However, in some cases, the double-layer wire pattern can be replaced with a single-layer wire pattern by electrically interconnecting the wires in the wire pattern through the metal line. In cases of FIGS. 27 and 28, the double-layer wire pattern is used. However, as shown in FIGS. 32 and 33, the wires (wire pattern) existing at each end of a circle indicated by a capital letter A are referred to as a first wire B and a second wire C, and a wire group existing between the first wire B and second wire C is referred to as a third wire group D. Here, the first wire (wire pattern) B and second wire (wire pattern) C are electrically connected to each other through a metal line 71 (third conductor) to cross over the third wire group D. According to this arrangement, the number of the layers in the wire pattern can be reduced.

Embodiment 5

Figure 34:
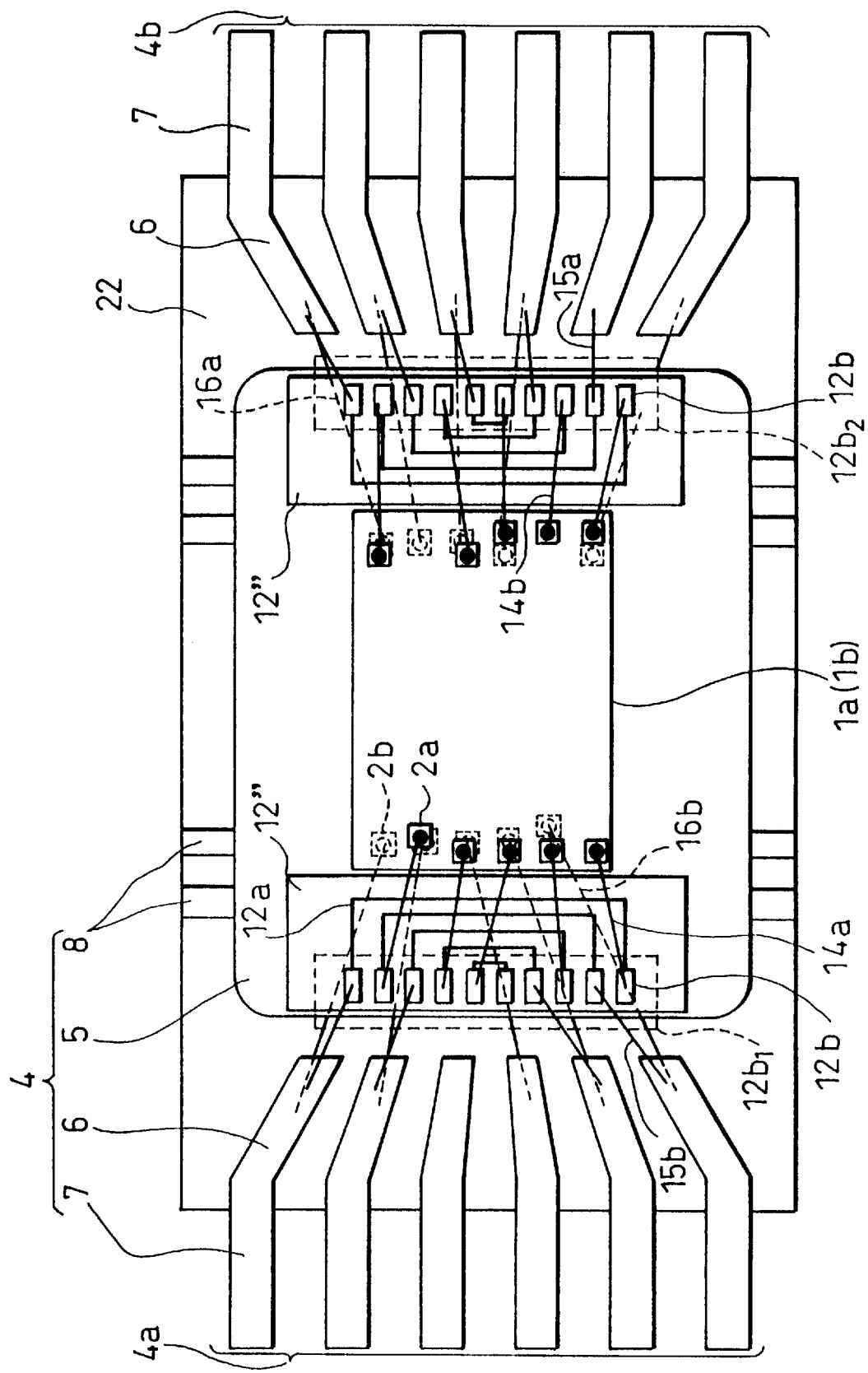
FIG. 34 is a front elevation of a perspective view of a semiconductor device in accordance with still another example embodiment of the present invention, and it shows an arrangement wherein a semiconductor substrate having formed thereon an insulation layer and a wire pattern through the wafer process is aligned along a semiconductor chip on one of the surfaces of a semiconductor chip mounting substrate of a lead frame.
Figure 35:
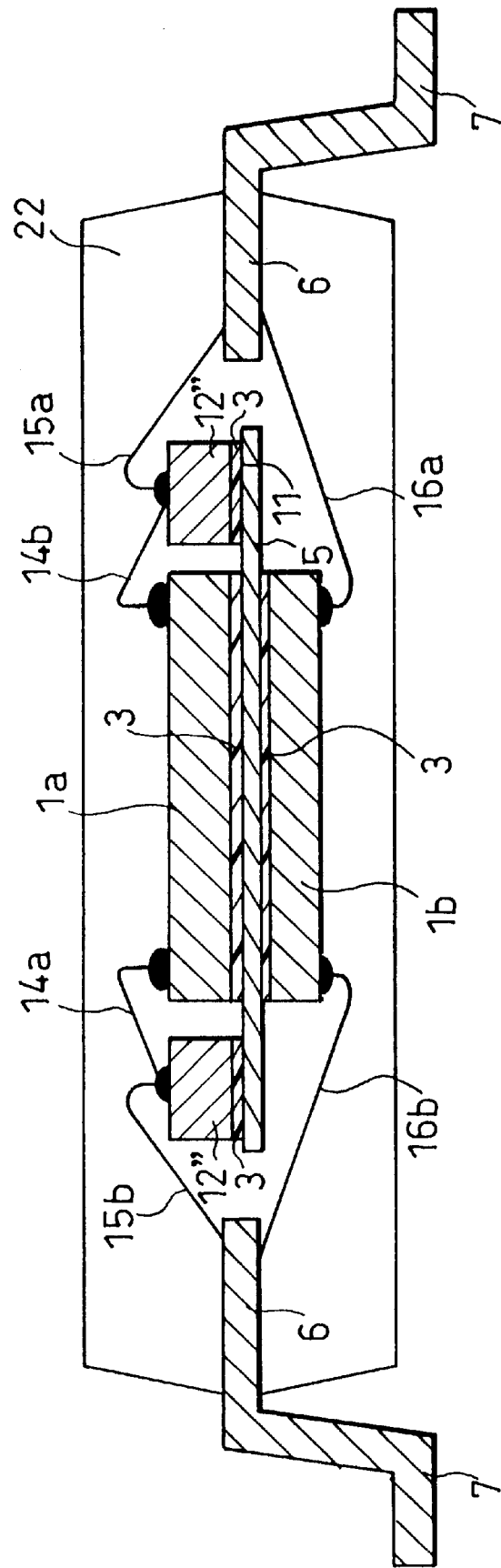
FIG. 35 is a side elevation of a perspective view of the above semiconductor device.

Referring to FIGS. 34 and 35, the following description will describe still another example embodiment of the present invention. Hereinafter, like components are labeled with like reference numerals with respect to Embodiments 1 through 4, and the description of these components is not repeated for the explanation's convenience.

In Embodiments 1–4, an insulation material made of polyimide resin is provided between the wire pattern 12 and die pad 5 to form the wire pattern 12 on the die pad 5. In the present embodiment, as shown in FIGS. 34 and 35, a semiconductor substrate having thereon formed an insulation layer and a wire pattern in the wafer process is mounted onto the die pad 5.

A producing method of the semiconductor device of the present embodiment will be explained. Herein, the lead frame 4 having formed thereon the die pad 5, leads, etc. are prepared. In the die bonding step, a semiconductor chip 1a is mounted onto one of the surfaces of the die pad 5 with paste of die attachment material 3. Likewise, a semiconductor substrate 12" having thereon formed a wire pattern 12 is also mounted on the same surface of the die pad 5 with paste of the die attachment material 3. Here, the wire pattern 12 is made of gold. The wire pattern 12 can be made of aluminum, but the signal transmission speed may possibly be delayed. The wire pattern 12 is arranged in the same manner as shown in FIGS. 17 and 18. The semiconductor substrate 12" may be mounted on the die pad 5 before the semiconductor chip la. The die attachment material 3 is set with heat at 180° C. for one hour. Then, the lead frame 4 is turned over, and a semiconductor chip 1b is mounted onto the other surface of the die pad 5 through the die bonding with the die attachment material 3. Here, the semiconductor chip 1a which has been bonded to the die pad 5 through the die bonding is protected from damages by, for example, being supported by an elastic body. Then, the die attachment material 3 is set with heat at 180° C. for one hour. The steps after the wire bonding step are carried out in the same manner as shown in FIGS. 17 and 18. In the present embodiment, two semiconductor chips of the same kind are mounted respectively onto both the surfaces of the die pad 5, but two semiconductor chips of different kinds can be mounted as well. In case that two semiconductor chips operate at different substrate potentials, it is preferable to insert an insulation material between one of the semiconductor chips and the die pad 5. In the present embodiment, since the insulation material and wire pattern are formed in the wafer process, a wire having two or more layers can be formed.

Embodiment 6

Figure 36:
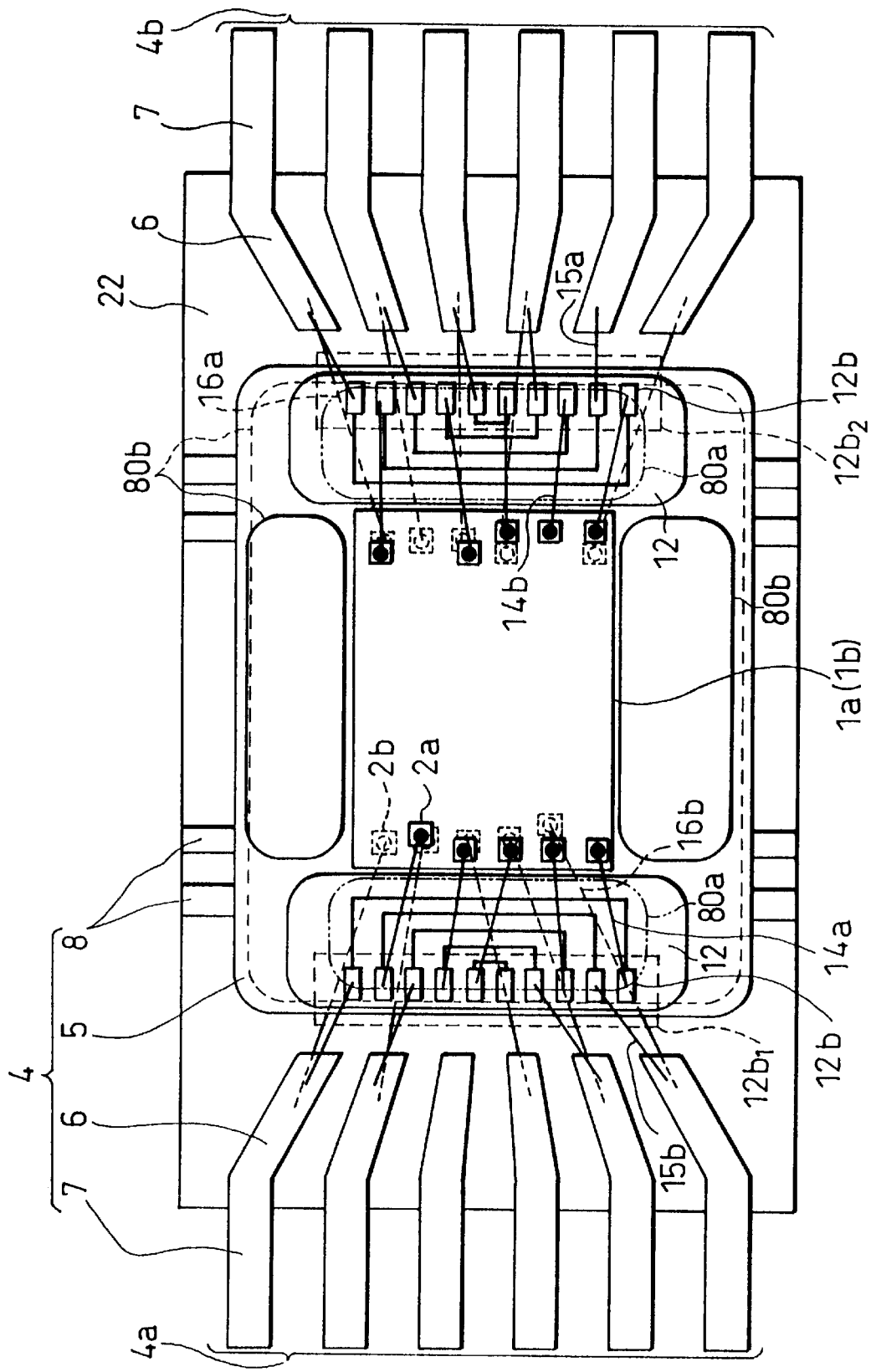
FIG. 36 is a front elevation of a perspective view of a semiconductor device in accordance with still another example embodiment of the present invention, and it shows an arrangement wherein a coating resin film, which is different from a mold resin, is formed to cover a part of a wire pattern formed on a semiconductor chip mounting substrate and a part of a semiconductor chip mounting substrate in such a manner to diminish an area where the semiconductor chip mounting substrate directly touches the mould resin.
Figure 37:
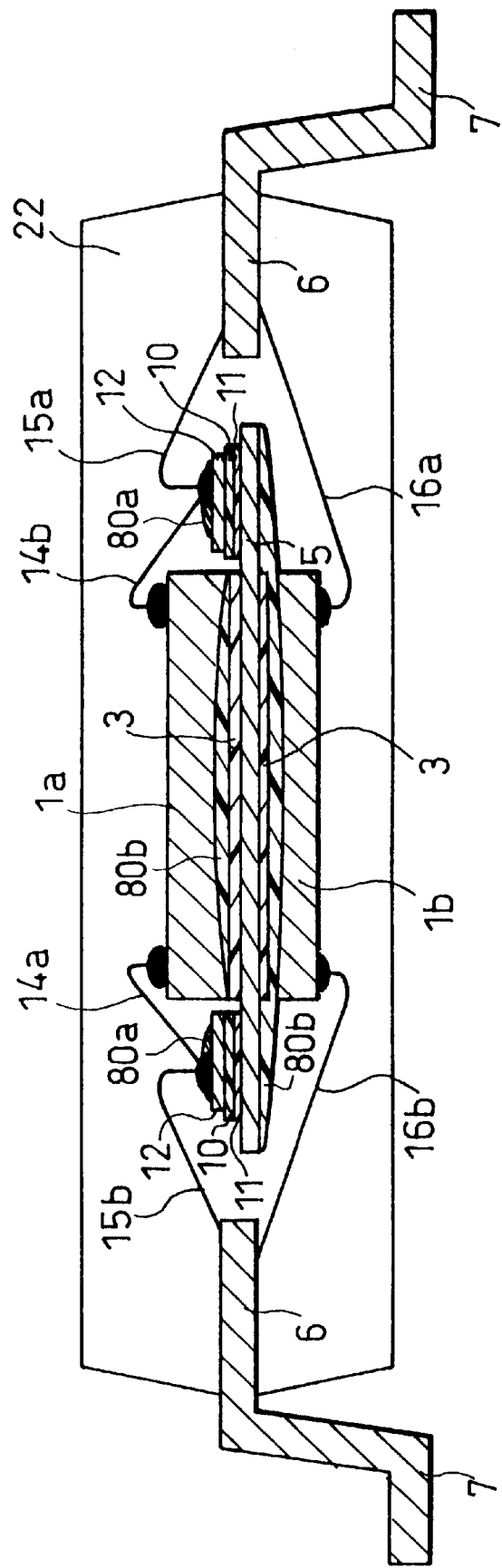
FIG. 37 is a side elevation of a perspective view of the above semiconductor device.

Referring to FIGS. 36 and 37, the following description will describe still another example embodiment of the present invention. Hereinafter, like components are labeled with like reference numerals with respect to Embodiments 1 through 5, and the description of these components is not repeated for the explanation's convenience.

The arrangement of the present embodiment is illustrated in FIGS. 36 and 37, which is a modification of the arrangement illustrated in FIGS. 17 and 18. To be more specific, after the wire bonding with both the surfaces of the die pad 5 serving as the semiconductor chip mounting substrate, coating resins 80a and 80b made of polyimide resin are formed through potting over the wire pattern 12 formed on the die pad 5 and the circumference of the semiconductor chips where the wire pattern is not formed. The coating resin 80a and 80b are heated at 180° C. for one hour and for further one hour at 260° C. after the potting.

Here, the coating resin 80a can be applied over the wire pattern 12 in the form of varnish or a sheet after the wire pattern 12 is formed on the lead frame 4.

Also, the coating resin 80b can be applied to the die pad 5 over the other surface where the wire pattern 12 is not formed in the form of varnish or a sheet. In this case, the coating resin 80b can be applied before the wire pattern 12 is formed on the die pad 5.

In case of Embodiment 1 shown in FIGS. 1 and 2, the insulation material 13 is arranged to cover the wire pattern 12 partially. For example, it is effective to use the insulation material 13 having stronger adhesion than the mold resin 22 with respect to the wire pattern 12 forming material, and having low water absorbency and high glass transition temperature Tg to suppress the separation of the mold resin 22 and wire pattern 12 during the solder packaging.

In Embodiments 1 through 6, the thickness of the die pad 5 is made at least thinner than the thickness of the cradle portions 9 (see FIG. 4) forming the lead frame 4. The die pad 5 can be made thinner by any applicable method, but in the present embodiment, the half-etching is applied to the die pad 5. Accordingly, a thin 2-chip-1-package semiconductor device, in which the semiconductor chips 1a and 1b are mounted respectively onto both the surfaces of the die pad 5, can be readily realized. Moreover, the yield at the resin molding in producing a thin semiconductor device is further improved.

In addition, in Embodiments 1 through 4 and 6, the wire pattern 12 or wire substrate 24 is laminated to the die pad 5 at approximately 350° C. Also, the plating suitable for the lamination to the bonding wires 15, 16, and 18 (for example, silver-plating for gold wires) is applied to the inner leads 6 of the lead frame 4. Further, when the wire bonding is necessary, the plating suitable to the lamination to the bonding wires 15, 16, and 18 is applied to the die pad 5 as occasion demands. In this case, it is necessary not to cover the plated area with the wire pattern 12 or wire substrate 24. On the other hand, the plating necessary for the substrate packaging (solder plating or the like) is applied to the outer leads 7 of the lead frame 4.

Each of the above embodiments describes the package in which a single semiconductor chip is mounted on each of the main and other surfaces of the die pad 5. However, a plurality of semiconductor chips can be mounded at least one of the main and other surfaces of the die pad 5.

Figure 38:
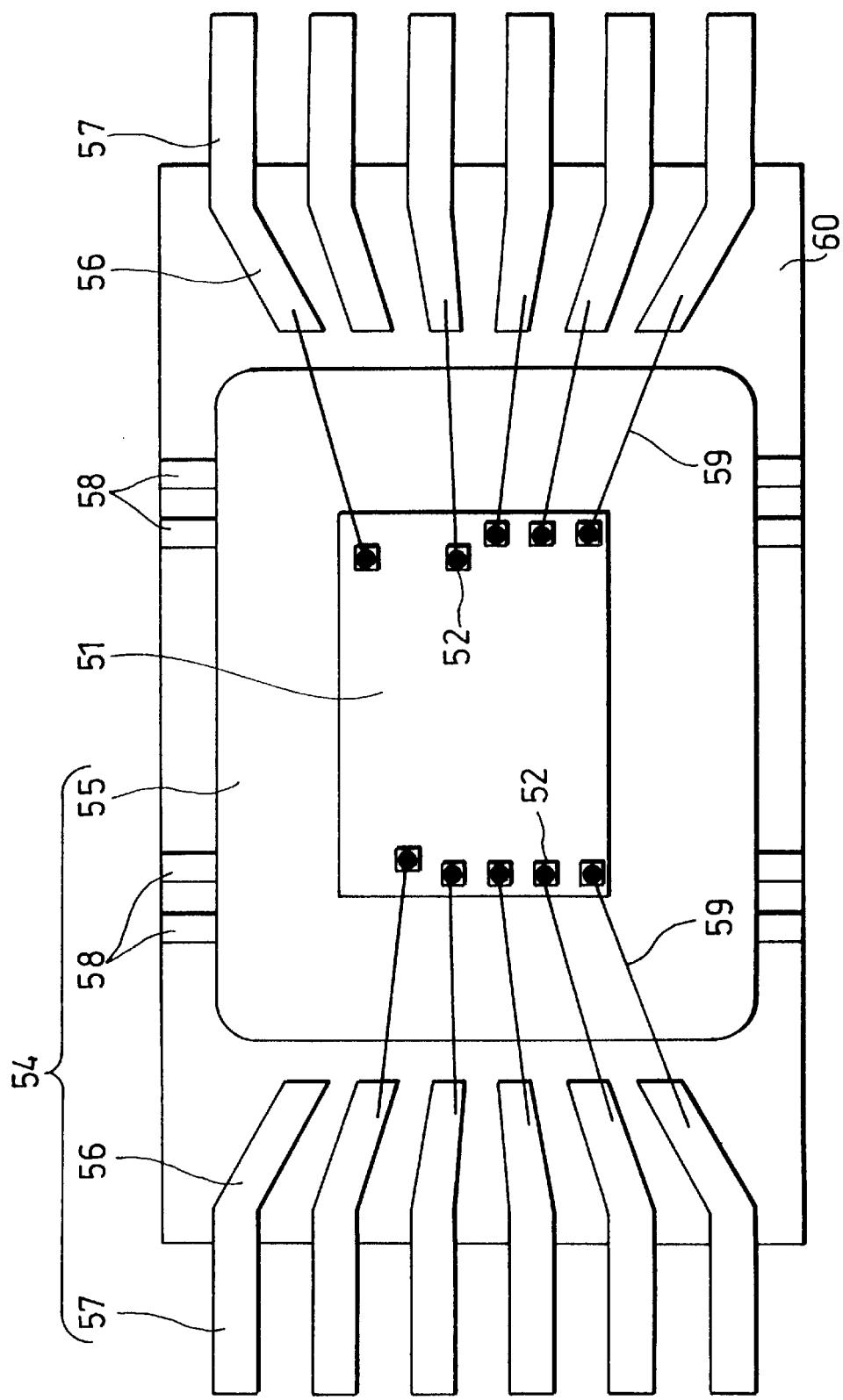
FIG. 38 is a front elevation of a perspective view of a conventional 1-chip-1-package semiconductor device.
Figure 39:
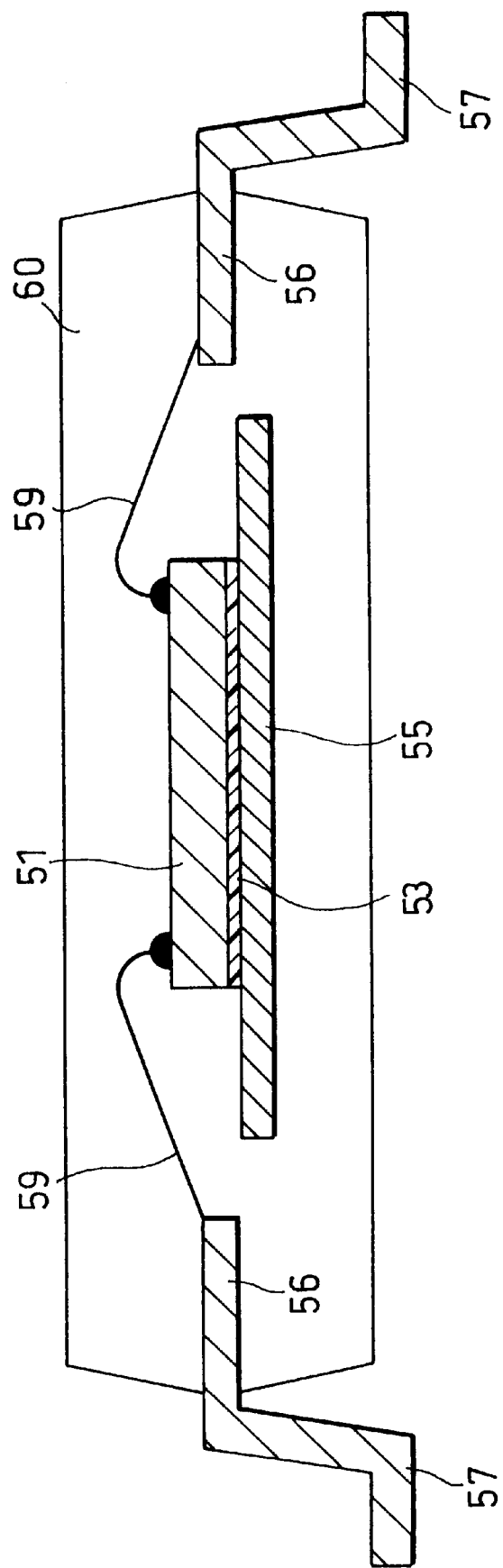
FIG. 39 is a side elevation of a perspective view of the above conventional semiconductor device.
Figure 40:
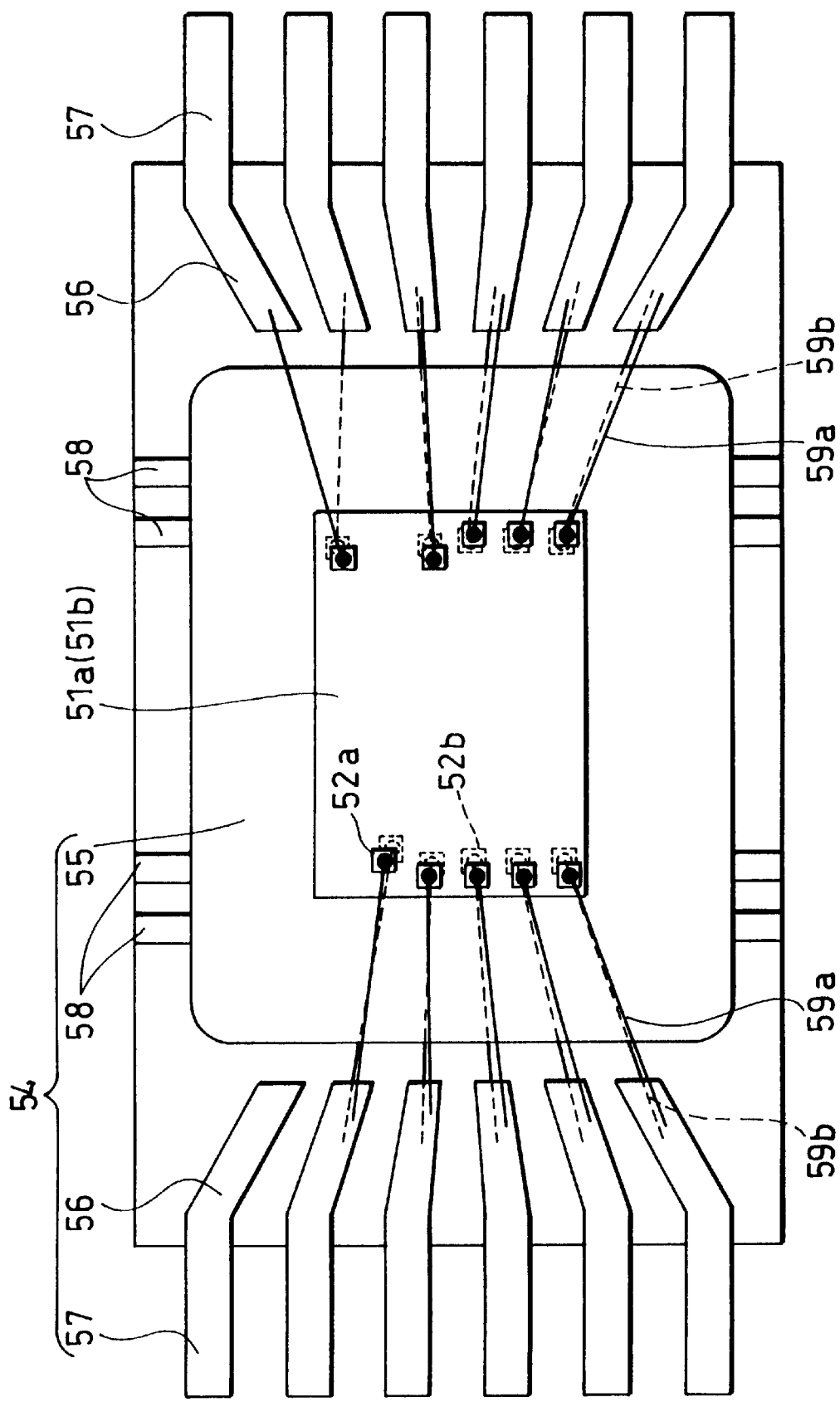
FIG. 40 is a front elevation of a perspective view of a conventional 2-chip-1-package semiconductor device.
Figure 41:
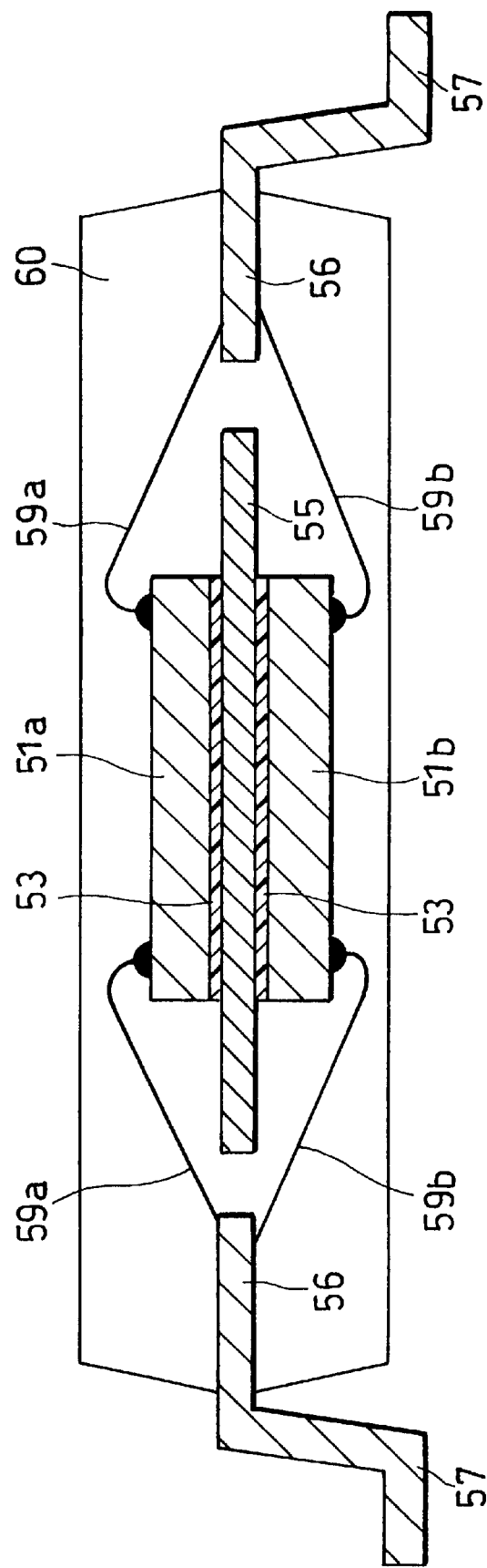
FIG. 41 is a side elevation of a perspective view of the above conventional semiconductor device.
Figure 42:
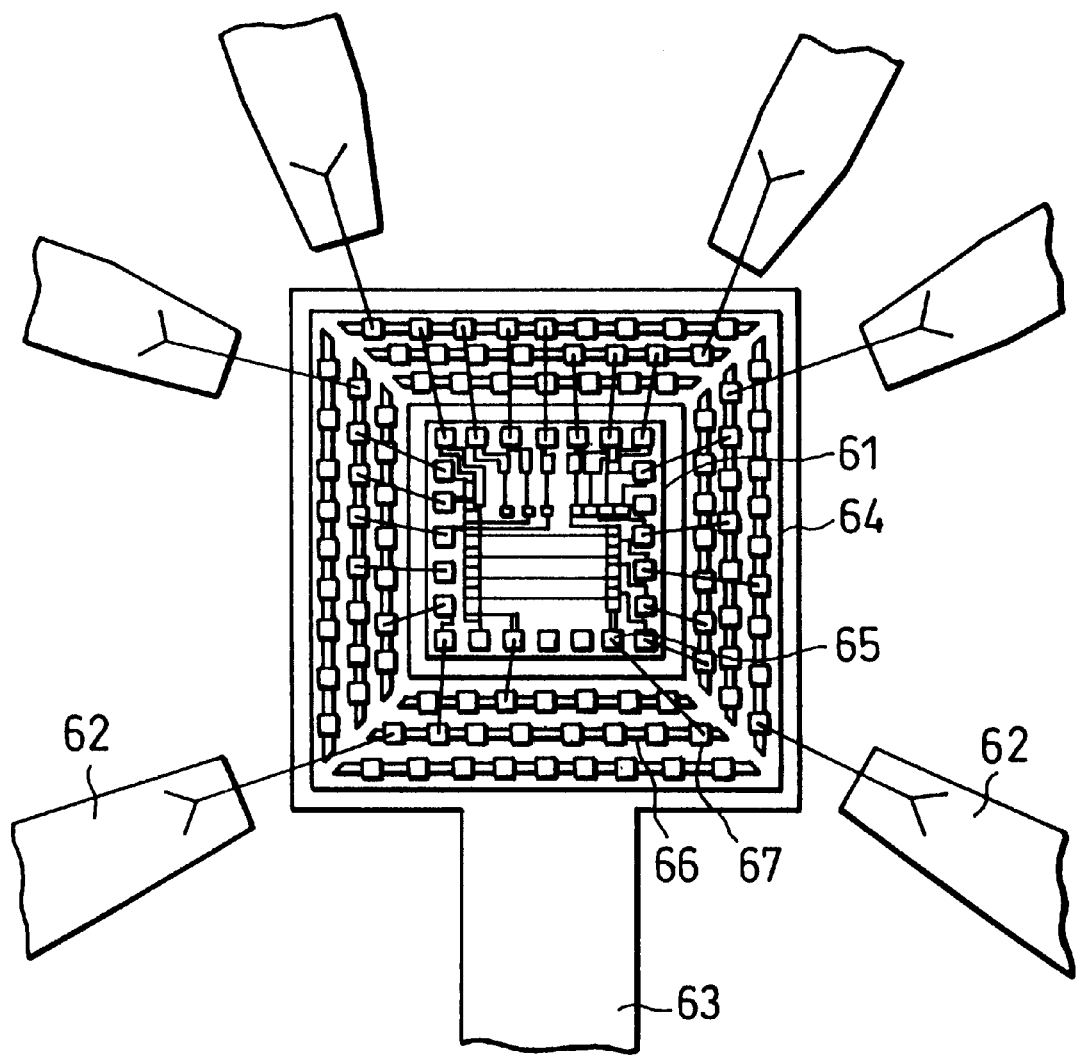
FIG. 42 is a plan view of another conventional 1-chip-1-package semiconductor device.

For example, the die pad 5, wire pattern 12 and the like shown in FIG. 1 or 13 are extended vertically in the drawing, and the number of the leads (inner leads 6 and outer leads 7) on the main surface of the die pad 5 is increased. The semiconductor chip of the connection type adopted in the present invention is additionally provided on the main surface of the die pad 5, so that two semiconductor chips are aligned vertically. Then, each semiconductor chip is connected with wire pattern 12 in the manner explained above. Of the set of a plurality of semiconductor chips mounted on at least either surface of the die pad 5 and the leads connected to the same, a part of the set can be provided in a connection method different from the connection method of the present invention, for example, the conventional connection method shown in FIG. 38.

In the examples shown in FIGS. 1 and 7, a straight line linking the two electrodes 12b on the same wire is parallel to the certain side edge of the semiconductor chip 1a. However, the arrangement of the line is not limited to the above, and the wire 12a can be curved or slanted.

In the example shown in FIG. 13, the wire 12a is patterned in such a manner to electrically connect two electrodes 12b which are positioned symmetrically with respect to the symmetry axis LL'. Also, the wire 12a is parallel to the certain edge (side edge $1a_1$–$1a_2$, herein) of the rectangular semiconductor chip. Moreover, the wire 12a extends in parallel with the direction in which the electrode group $12b_1$ is aligned. However, the arrangement is not limited to the above, and the wire 12a may be arranged to include a portion where the wire pattern 12 extends along the direction in which the electrode group $12b_1$ opposing one of the edges of one of the semiconductor chips, the semiconductor chip 1a herein, is aligned.

As has been explained, a first semiconductor device of the present invention is a semiconductor device in which a plurality of semiconductor chips are mounted onto both the surfaces of a semiconductor chip mounting substrate of a lead frame with their back surfaces opposing each other, characterized in that:

a wire pattern having a certain pattern and an insulation material for providing electrical insulation between the semiconductor chip mounting substrate and wire pattern are provided at least one of the surfaces of the semiconductor chip mounting substrate; and electrode pads on at least one semiconductor chip are electrically connected to a particular lead formed in the lead frame through the wire pattern and a metal line.

According to the above arrangement, a plurality of semiconductor chips are mounted onto both the surfaces of the semiconductor chip mounting substrate with their back surfaces opposing each other while being flipped from side to side or from top to bottom, or a substrate for mounting different kinds of semiconductor chips, thereby forming a multichip-1-package semiconductor device, for example, a 2-chip-1-package semiconductor device.

Here, the electrode pad of at least one semiconductor chip is electrically connected to a particular lead through the wire pattern electrically isolated from the semiconductor chip mounting substrate by the insulation material and the metal line. Hence, the wire pattern functions as a relay point. Accordingly, the unwanted wire layout, in which the metal line extends to cross over the semiconductor chip or the adjacent wires cross each other, can be prevented. Consequently, inconveniences, such as a short-circuit between the metal line and the semiconductor chip or adjacent wire, or the opening, namely the disconnection of the metal line, can be prevented in a secure manner.

Moreover, even when the electrode pads are aligned in an order different from the electric signal order necessary for the leads in the lead frame, the electrode pads which receive and output the same signal can be electrically connected to a particular lead by providing the above wire pattern. Therefore, it is no longer necessary to modify the position of the electrode pads on each semiconductor chip when producing a semiconductor device having thereon mounted a plurality of semiconductor chips. Thus, according to the above arrangement, the costs of the semiconductor device can be saved while the semiconductor device can be developed in a shorter period in a secure manner for the omitted job of modifying the design of the semiconductor chip.

Also, according to the above arrangement, the stacked structure using a combination of any kind of semiconductor chips including the array semiconductor chip becomes available. In other words, besides the array semiconductor chip, any kind of semiconductor chips can be applied to the stacked structure, thereby making it possible to provide a more versatile multichip-1-package semiconductor device, for example.

A second semiconductor device is the first semiconductor device further characterized in that:

the lead frame includes two lead groups each composed of a plurality of the leads, the two lead groups being provided to oppose each other;

of the plurality of semiconductor chips, two opposing semiconductor chips, provided respectively on both the surfaces of the semiconductor chip mounting substrate to oppose each other, are substantially rectangular, and the semiconductor chip mounting substrate is provided between the two lead groups, so that, of four side edges of each of the two opposing semiconductor chips, a pair of opposing side edges oppose to the two lead groups, respectively; and the wire pattern is patterned in such a manner that at least one lead in either of the two lead groups is electrically connected to the electrode pad provided on the element forming surface of at least one of the two opposing semiconductor chips near the side edge thereof other than the side edge opposing the lead group including the above particular lead.

According to the above arrangement, the lead frame is composed of the two lead groups opposing each other, and the semiconductor chip mounting substrate having thereon mounted the semiconductor chips is provided between the two lead groups.

Here, at least one lead included in either of the lead groups is electrically connected to the electrode pad provided on the element forming surface of at least one of the two opposing semiconductor chips near the side edge other than the side edge opposing the lead group including the above particular lead by the wire pattern. Thus, in case that the two opposing semiconductor chips are the chips of the same kind (chips having the same chip size, using the same kind of silicone substrates, and operating at the same substrate potential), the element circuit pattern on each semiconductor chip used to be mirror-reversed to each other; however, according to the above arrangement, a multichip-1-package semiconductor device can be obtained without forming the semiconductor chips having provided thereon a mirror-reversed element circuit pattern.

Thus, in addition to the effect realized by the first arrangement, in case that the two opposing semiconductor chips are of the same kind (having the same chip size, so that the electrode pads are positioned in the same manner), a multichip-1-package semiconductor device can be obtained without forming the semiconductor chips having provided thereon a mirror-reversed element circuit pattern. Moreover, even when the semiconductor chips on which the electrode pads are provided indiscriminately, a multichip-1-package semiconductor device can be obtained without modifying the design of the semiconductor chips.

A third semiconductor device is the first semiconductor device further characterized in that:

the lead frame includes two lead groups each composed of a plurality of the leads, the two lead groups being provided to oppose each other;

of the plurality of semiconductor chips, two opposing semiconductor chips, provided respectively on both the surfaces of the semiconductor chip mounting substrate to oppose each other, are substantially rectangular, and the semiconductor chip mounting substrate is provided between the two lead groups, so that, of four side edges of each of the two opposing semiconductor chips, a pair of opposing side edges oppose the two lead groups, respectively; and the wire pattern is patterned in such a manner that at least one of the lead groups is connected to an electrode pad group, which is composed of electrode pads provided on the element forming surface of at least one of the two opposing semiconductor chips near the side edge and aligned in an order different from the electric signal order necessary for the leads in the above lead group, in the same electric signal order.

According to the above arrangement, the lead frame is composed of two lead groups opposing each other, and the semiconductor chip mounting substrate having thereon mounted the semiconductor chips is provided between the two lead groups.

Here, at least one of the lead groups is connected to the electrode pad group, which is composed of electrode pads provided on the element forming surface of at least one of the two opposing semiconductor chips near the side edge and aligned in an order different from the electric signal order necessary for the leads in the above lead group, in the same electric signal order. Thus, even when the semiconductor chips having thereon indiscriminately aligned electrode pads are used, a multichip-1-package semiconductor device can be obtained without modifying the design of the semiconductor chips.

A fourth semiconductor device is the first semiconductor device further characterized in that:

the lead frame includes four lead groups each composed of a plurality of the leads, said four lead groups being provided to form two pairs of two opposing lead groups;

of the plurality of semiconductor chips, two opposing semiconductor chips, provided on both the surfaces of the semiconductor chip mounting substrate to oppose each other, are substantially rectangular, and the semiconductor chip mounting substrate, is provided to be encircled by the four lead groups, so that the four side edges thereof oppose the four lead groups, respectively; and the wire pattern is patterned in such a manner that at least one lead included in any of the four lead groups is electrically connected to the electrode pad provided on the element forming surface of at least one of the two opposing semiconductor chip near the side edge thereof other than the side edge opposing the lead group including the above particular lead.

According to the above arrangement, the lead frame is composed of the four lead groups, or two pairs of two opposing lead groups, and the semiconductor chip mounting substrate having thereon mounted at least the two opposing semiconductor chips is provided to be encircled by the four lead groups.

Here, at least one lead included in any of the lead groups is electrically connected to the electrode pad provided on the element forming surface of at least on one of the two opposing semiconductor chips near the side edge thereof other than the side edge opposing the lead group including the above particular lead. Thus, even when a semiconductor device of a QFP (Quad Flat Package) type is produced using different kinds of semiconductor chips, a multichip-1-package semiconductor device can be obtained without modifying the design of the semiconductor chips.

A fifth semiconductor device is the first semiconductor device further characterized in that:

the lead frame includes four lead groups each composed of a plurality of the leads, said four lead groups being provided to form two pairs of two opposing lead groups;

of the plurality of semiconductor chips, two opposing semiconductor chips, provided respectively on both the surfaces of the semiconductor chip mounting substrate, are substantially rectangular, and the semiconductor chip mounting substrate is provided to be encircled by the four lead groups with its four side edges opposing the four lead groups, respectively; and the wire pattern is patterned in such a manner that at least one lead group is connected to an electrode pad group composed of electrode pads, provided on the element forming surface of at least one of the two opposing semiconductor chips near its side edge and having an electric signal order different from an electric signal order necessary for the leads in the above lead group, in the same electric signal order.

According to the above arrangement, the lead frame is composed of four lead groups provided to form two pairs of the two opposing lead groups, and the semiconductor chip mounting substrate having thereon mounted the semiconductor chips is provided to be encircled by the four lead groups.

Here, at least one lead group is connected to an electrode pad group composed of electrode pads, provided on the element forming surface of the semiconductor chip near its side edge and having an electric signal order different from an electric signal order necessary for the leads in the above lead group, in the same electric signal order by the wire pattern. Thus, even when the semiconductor chips of different kinds having provided thereon the indiscriminately aligned electrode pads are used, a multichip-1-package semiconductor device of QFP type, for example, can be obtained without modifying the design of each semiconductor chip.

A sixth semiconductor chip is the first semiconductor chip further characterized in that:

the wire pattern is provided at the circumference portion of the semiconductor chip mounting substrate to avoid where the semiconductor chip is mounted onto the surface on which the wire pattern is provided.

According to the above arrangement, the wire pattern is provided to avoid where the semiconductor chip is mounted onto the surface on which the wire pattern is provided. In this case, since the wire pattern is not provided where the semiconductor chip is mounted, a thinner semiconductor device can be provided.

A seventh semiconductor device is the first semiconductor device further characterized in that:

the wire pattern and insulation material are provided at the circumference portion of the semiconductor chip mounting substrate to avoid where the semiconductor chip is mounted onto the surface on which the wire pattern and insulation material are provided.

According to the above arrangement, the wire pattern and insulation material are provided to avoid where the semiconductor chip is mounted onto the surface on which the wire pattern and insulation material are provided. In this case, since the wire pattern and insulation material are not provided where the semiconductor chip is mounted, a semiconductor device thinner than the sixth semiconductor device can be provided.

An eighth semiconductor device is the first semiconductor device further characterized in that:

the lead frame includes a cradle portion for transporting the lead frame; and the semiconductor chip mounting substrate is made thinner than at least the cradle portion.

According to the above arrangement, since the semiconductor chip mounting substrate is made thinner than at least the cradle portion, a thin multichip-1-package semiconductor device can be provided even when the semiconductor chips are mounted onto both the surfaces of the semiconductor chip mounting substrate, respectively.

A ninth semiconductor device is the first semiconductor device further characterized in that:

a semiconductor substrate having thereon formed the insulation material or an insulation layer and wire pattern through wafer process is mounted on at least one of the surfaces of the semiconductor chip mounting substrate along with the semiconductor chip; and the electrode pads on the semiconductor chip are electrically connected to the leads through the wire pattern and metal line.

According to the above arrangement, since the wire pattern is formed in the wafer process, a more delicate wire can be formed. In addition, the semiconductor substrate having thereon formed the insulation material (insulation layer) and wire pattern can be mounted onto the semiconductor chip mounting substrate in the die bonding step, no additional step of forming a new wire pattern (and insulation material) on the semiconductor chip mounting substrate is necessary. Furthermore, for example, a semiconductor substrate, such as a silicon substrate (having thereon formed the wire pattern) has a relatively close thermal expansion coefficient to a thermal expansion coefficient of the die pad (semiconductor chip mounting substrate) made of 42 alloy or the like compared with the wire pattern using resin as the insulation material, the warp that occurs after the wire pattern is formed on the die pad can be suppressed. Thus, it has become possible to obtain a more versatile and less expensive multichip-1-package semiconductor device.

A tenth semiconductor device is the first semiconductor device further characterized in that wires in the wire pattern formed on the semiconductor chip mounting substrate are electrically interconnected through the metal line.

Thus, more flexibility is allowed to the position of the wire patterns and the like.

An eleventh semiconductor device is the tenth semiconductor device further characterized in that:

more than one wire pattern group having at least one above-specified wire pattern is formed on the semiconductor chip mounting substrate;

at least a part of one of the wire pattern group is electrically connected to at least a part of one of the other wire pattern groups through the metal line.

According to the above arrangement, for example, when the wire pattern area is divided to suppress the warp of the die pad (semiconductor chip mounting substrate) of FIGS. 7 and 8, the wire pattern area can not be divided in a direction to intersect with the wire pattern, that is, in a direction to cut the wire pattern. However, as shown in FIGS. 11 and 12, if the wires are electrically interconnected through the metal line (third conductor), the wire pattern can be divided in a direction to cut the wire pattern. Thus, more flexibility is allowed to the position of the wire patterns than in the tenth semiconductor device.

A twelfth semiconductor device is the tenth semiconductor device further characterized in that:

the wire pattern is provided on substantially a plane surface and includes electrically separated first and second wires, and a third wire provided between the first and second wires and having at least one wire; and the first and second wires are electrically connected to each other through the metal line.

According to the above arrangement, for example, as indicated inside of the circle A in FIG. 32, the wiring can be realized without using a multi-layer wire, that is, using a single-layer wire, or a wire having a less number of layers, by interconnecting the wires through the metal line (third conductor) 71. Thus, it has become possible to obtain more versatile multichip-1-package semiconductor device.

A thirteenth semiconductor device is the first semiconductor device further characterized in that:

a molding material for molding the semiconductor chips and semiconductor chip mounting substrate is provided; and a coating film made of a material different from a material of the mold material is provided to cover at least a part of the wire pattern formed on the semiconductor chip mounting substrate.

For example, the coating film can be made of a material having stronger adhesion to the wire pattern forming material, lower water absorbency, and higher glass transition temperature (Tg) than the mold resin serving as the molding material. The mold resin is generally made of epoxy resin or the like, and the coating film can be made of polyimide resin, for example.

According to the above arrangement, the separation of the wire pattern from the molding material at the boundary during the solder packaging can be suppressed even when the semiconductor device is soldered to a mounting substrate under severer conditions. Consequently, it has become possible to obtain a high-quality multichip-1-package semiconductor device.

A fourteenth semiconductor device is the first semiconductor device further characterized in that:

a molding material for molding the semiconductor chips and semiconductor chip mounting substrate is provided; and a coating film made of a material different from a material of the mold material is provided to cover at least a part of the semiconductor chip mounting substrate in such a manner to diminish an area where the semiconductor chip mounting substrate and molding material directly touch each other.

For example, the coating film can be made of a material having stronger adhesion to the semiconductor chip mounting substrate forming material, lower water absorbency, and higher glass transition temperature (Tg) than the mold resin.

According to the above arrangement, the separation of the semiconductor chip mounting substrate from the molding material at the boundary during the solder packaging can be suppressed even when the semiconductor device is soldered to a mounting substrate under severe conditions. Consequently, it has become possible to obtain a high-quality multichip-1-package semiconductor device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a plurality of semiconductor chips each having a plurality of electrode pads on an element forming surface;

a lead frame including a semiconductor chip mounting plate and a plurality of leads for electrically connecting signals to said electrode pads, at least two of said plurality of semiconductor chips being mounted onto both surfaces of said semiconductor chip mounting plate with their back surfaces opposing each other; and a wire pattern having a certain pattern, said wire pattern being provided on at least one of the surfaces of said semiconductor chip mounting plate, wherein at least one pair of corresponding electrode pads of the semiconductor chips mounted onto both the surfaces is electrically connected to a common one of the plurality of leads, by electrically connecting at least one of the plurality of electrode pads of one of said plurality of semiconductor chips to one of the plurality of leads via said wire pattern, the one of said plurality of semiconductor chips being provided on the same surface as said wire pattern.

2. The semiconductor device of claim 1, wherein:

said lead frame includes two lead groups each composed of a plurality of said leads, said two lead groups being provided to oppose each other;

of said plurality of semiconductor chips, at least two opposing semiconductor chips, provided respectively to both the surfaces of said semiconductor chip mounting plate with their back surfaces opposing each other, are substantially rectangular;

said semiconductor chip mounting plate is provided between said two lead groups;

each of said two opposing semiconductor chip is mounted onto said semiconductor chip mounting plate in such a manner that, of four side edges thereof, a pair of opposing side edges oppose said two lead groups, respectively; and at least a part of said electrode pads are provided on the element forming surface of at least one of said two opposing semiconductor chips near the side edge thereof other than the side edge opposing the lead group including at least one particular lead, and said wire pattern is patterned in such a manner that said particular lead is electrically connected to the part of said electrode pads.

3. The semiconductor device of claim 2, wherein:

said two opposing semiconductor chips are of a same shape and have same arrangement and shape of the electrode pads; and one of said two opposing semiconductor chips is provided to a position where the other semiconductor chip is rotated by 180 degrees around an axis parallel to the side edges of said semiconductor chip opposing said lead groups.

4. The semiconductor device of claim 3, wherein said electrode pads on one of said at least two opposing semiconductor chips are connected to said leads through said wire pattern, and corresponding electrode pads on the other semiconductor chip are connected to said leads without using said wire pattern.

5. A semiconductor device comprising:

a plurality of semiconductor chips each having a plurality of electrode pads on an element forming surface;

a lead frame including a semiconductor chip mounting plate and a plurality of leads for electrically connecting signals to said electrode pads, at least two of said plurality of semiconductor chips being mounted onto both surfaces of said semiconductor chip mounting plate with their back surfaces opposing each other; and a wire pattern with a certain pattern provided for at least one of the semiconductor chips on at least one of the surfaces of said semiconductor chip mounting plate, such that wires on a side where electrode pads are formed can be connected to leads provided on another side.

6. The semiconductor device of claim 1, further comprising:

an insulation material for providing electrical insulation between said semiconductor chip mounting plate and said wire pattern;

a first conductor for electrically connecting the electrode pads on at least one of said plurality of semiconductor chips to said wire pattern; and a second conductor for electrically connecting said wire pattern to said leads.

7. The semiconductor device of claim 5, further comprising:

an insulation material for providing electrical insulation between said semiconductor chip mounting plate and said wire pattern;

a first conductor for electrically connecting the electrode pads on at least one of said plurality of semiconductor chips to said wire pattern; and a second conductor for electrically connecting said wire pattern to said leads.

8. The semiconductor device of claim 1, wherein:

said lead frame includes two lead groups each composed of a plurality of said leads, said two lead groups opposing each other;

of said plurality of semiconductor chips, at least two opposing semiconductor chips, provided respectively to both the surfaces of said semiconductor chip mounting plate with their back surfaces opposing each other, are substantially rectangular;

said semiconductor chip mounting plate is provided between said two lead groups;

each of said opposing two opposing semiconductor chips is mounted onto said semiconductor chip mounting plate in such a manner that, of four side edges thereof, a pair of opposing side edges oppose said two lead groups, respectively; and at least a part of said electrode pads form an electrode pad group, in which the part of said electrode pads are provided on the element forming surface of at least one of said two opposing semiconductor chips near the side edge thereof in an order different from an order that electric signals are input to the leads in at least one of said lead groups, and said wire pattern is patterned in such a manner that said one of the lead groups is connected to said electrode pad group in a same electric signal order.

9. The semiconductor device of claim 8, wherein:

said two opposing semiconductor chips are of a same kind; and one of said two opposing semiconductor chips is provided to a position where the other semiconductor chip is rotated by 180 degrees around an axis parallel to the side edges of said semiconductor chip which do not oppose said lead groups.

10. The semiconductor device of claim 9, wherein said electrode pads on one of said two opposing semiconductor chips are connected to said leads through said wire pattern, and corresponding electrode pads on the other semiconductor chip are connected to said leads without using said wire pattern.

11. The semiconductor device of claim 8, wherein said wire pattern includes a portion which extends along a direction in which the electrode group opposing one of four edges of one of said two opposing semiconductor chips is aligned.

12. The semiconductor device of claim 11, wherein said wire pattern extends in parallel with the direction in which said electrode group is aligned.

13. The semiconductor device of claim 8, wherein said wire pattern is patterned symmetrically with respect to an axis parallel to the side edges of said each semiconductor chip which do not oppose said lead groups.

14. The semiconductor device of claim 5, wherein:
said lead frame includes four lead groups each composed of a plurality of said leads, said four lead groups being provided to form two pair of two opposing lead groups;
of said plurality of semiconductor chips, at least two opposing semiconductor chips, provided respectively to both the surfaces of said semiconductor chip mounting plate with their back surface opposing each other, are substantially rectangular;
said semiconductor chip mounting plate is provided to be encircled by said four lead groups;
each of said two opposing semiconductor chips is mounted onto said semiconductor chip mounting plate in such a manner that four side edges thereof oppose said four lead groups, respectively; and
at least a part of said electrode pads are provided on the element forming surface of at least one of said two opposing semiconductor chips near the side edge thereof other than the side edge opposing the lead group including at least one particular lead, and said wire pattern is patterned in such a manner that said particular lead is electrically connected to the part of said electrode pads.

15. The semiconductor device of claim 5, wherein:
said lead frame includes four lead groups each composed of a plurality of said leads, said four lead groups being provided to form two pair of two opposing lead groups;
of said plurality of semiconductor chips, at least two opposing semiconductor chips, provided respectively to both the surfaces of said semiconductor chip mounting plate with their back surface opposing each other, are substantially rectangular;
said semiconductor chip mounting plate is provided to be encircled by said four lead groups;
each of said two opposing semiconductor chips is mounted onto said semiconductor chip mounting plate in such a manner that four side edges thereof oppose said four lead groups, respectively; and
at least a part of said electrode pads form an electrode pad group, in which the part of said electrode pads are provided on the element forming surface of at least one of said two opposing semiconductor chips near the side edge in an order different from an order that electric signals are input to the leads in at least one of said lead groups, and said wire pattern is patterned in such a manner that said one of the lead groups is connected to said electrode pad group in a same electric signal order.

16. The semiconductor device of claim 1, wherein said wire pattern is provided at a circumference portion of said semiconductor chip mounting plate to avoid an area where the semiconductor chip is mounted onto a surface on which said wire pattern is provided.

17. The semiconductor device of claim 1, wherein said wire pattern and said insulation material are provided at a circumference portion of said semiconductor chip mounting plate to avoid an area where the semiconductor chip is mounted onto a surface on which said wire pattern and said insulation material are provided.

18. The semiconductor device of claim 1, wherein:
said lead frame includes a cradle portion for transporting said lead frame; and
said semiconductor chip mounting plate is made thinner than at least said cradle portion.

19. The semiconductor device of claim 1, wherein, of said plurality of semiconductor chips, at least two opposing semiconductor chips, provided respectively on both the surfaces of said semiconductor chip mounting plate with their back surfaces opposing each other, are chips having a same chip size and using a same kind of silicon substrates, and operate at a same substrate potential.

20. The semiconductor device of claim 5, wherein, of said plurality of semiconductor chips, at least two opposing semiconductor chips, provided respectively on both the surfaces of said semiconductor chip mounting plate with their back surfaces opposing each other, have different chip sizes.

21. The semiconductor device of claim 20, wherein said two opposing semiconductor chips use different kinds of silicon substrates.

22. The semiconductor device of claim 20, wherein said two opposing semiconductor chips operate at different substrate potentials.

23. The semiconductor device of claim 6 further comprising a semiconductor substrate having thereon formed said insulation material and said wire pattern in wafer process, said semiconductor substrate being aligned along said semiconductor chip on at least one of the surfaces of said semiconductor chip mounting substrate,
wherein the electrode pads on said semiconductor chip are electrically connected to said leads through said wire pattern and said first and second conductors.

24. The semiconductor device of claim 7 further comprising a third conductor, provided on said wire pattern formed on said semiconductor chip mounting plate, for electrically interconnecting wires in said wire pattern.

25. The semiconductor device of claim 24, wherein:
at least two wire pattern groups having one or more of said wire pattern are provided on said semiconductor chip mounting plate; and
at least a part of one of said wire pattern groups is electrically connected to at least a part of the other wire pattern groups through said third conductor.

26. The semiconductor device of claim 24, wherein:
said wire pattern includes electrically separated first and second wire patterns provided on a substantially plane surface and a third wire pattern having at least one wire pattern, said third wire pattern being provided between said first and second wire patterns; and
said first wire pattern and second wire pattern are electrically connected to each other through said third conductor.

27. The semiconductor device of claim 1 further comprising:
a molding material for molding said semiconductor chips and said semiconductor chip mounting plate; and
a coating film made of a material different from a material of said molding material, said coating film covering at least a part of said wire pattern formed on said semiconductor chip mounting plate.

28. The semiconductor device of claim 27, wherein said coating film has stronger adhesion than said molding material with respect to said wire pattern.

29. The semiconductor device of claim 1 further comprising:
a molding material for molding said semiconductor chips and said semiconductor chip mounting plate; and
a coating film made of a material different from a material of said molding material, said coating film covering at least a part of said semiconductor chip mounting plate in such a manner to diminish an area where said semiconductor chip mounting plate and said molding material directly touch each other.

30. The semiconductor device of claim 29, wherein said coating film has stronger adhesion than said molding material with respect to said semiconductor chip mounting plate.

31. The semiconductor device of claim 6, wherein said wire pattern is patterned in such a manner that a wire linking a connection section of said first conductor and a connection section of said second conductor includes a wire group, said wire group being parallel to the side edges of said opposing semiconductor chips which do not oppose said lead groups.

32. The semiconductor device of claim 6, wherein said wire pattern is patterned in such a manner that a wire linking a connection section of said first conductor and a connection section of said second conductor includes a wire group, said wire group being curved with respect to the side edges of said opposing semiconductor chips which do not oppose said lead groups.

33. The semiconductor device of claim 6, wherein said wire pattern is patterned in such a manner that a wire linking a connection section of said first conductor and a connection section of said second conductor includes a wire group, said wire group being slanted with respect to the side edges of said opposing semiconductor chips which do not oppose said lead groups.

34. The semiconductor device of claim 5, wherein said wire pattern is provided at a circumference portion of said semiconductor chip mounting plate to avoid an area where the semiconductor chip is mounted onto a surface on which said wire pattern is provided.

35. The semiconductor device of claim 5, wherein said wire pattern and said insulation material are provided at a circumference portion of said semiconductor chip mounting plate to avoid an area where the semiconductor chip is mounted onto a surface on which said wire pattern and said insulation material are provided.

36. The semiconductor device of claim 5, wherein:
   said lead frame includes a cradle portion for transporting said lead frame; and
   said semiconductor chip mounting plate is made thinner than at least said cradle portion.

37. The semiconductor device of claim 5, wherein, of said plurality of semiconductor chips, at least two opposing semiconductor chips, provided respectively on both the surfaces of said semiconductor chip mounting plate with their back surfaces opposing each other, are chips having a same chip size and using a same kind of silicon substrates, and operate at a same substrate potential.

38. The semiconductor device of claim 7, further comprising a semiconductor substrate having thereon formed said insulation material and said wire pattern in wafer process, said semiconductor substrate being aligned along said semiconductor chip on at least one of the surfaces of said semiconductor chip mounting substrate,
   wherein the electrode pads on said semiconductor chip are electrically connected to said leads through said wire pattern and said first and second conductors.

39. The semiconductor device of claim 5, further comprising:
   a molding material for molding said semiconductor chips and said semiconductor chip mounting plate; and
   a coating film made of a material different from a material of said molding material, said coating film covering at least a part of said wire pattern formed on said semiconductor chip mounting plate.

40. The semiconductor device of claim 39, wherein said coating film has stronger adhesion than said molding material with respect to said wire pattern.

41. The semiconductor device of claim 5, further comprising:
   a molding material for molding said semiconductor chips and said semiconductor chip mounting plate; and
   a coating film made of a material different from a material of said molding material, said coating film covering at least a part of said semiconductor chip mounting plate in such a manner to diminish an area where said semiconductor chip mounting plate and said molding material directly touch each other.

42. The semiconductor device of claim 41, wherein said coating film has stronger adhesion than said molding material with respect to said semiconductor chip mounting plate.

* * * * *